(12) United States Patent
Yamada et al.

(10) Patent No.: US 7,972,892 B2
(45) Date of Patent: Jul. 5, 2011

(54) LIGHT EMITTING DEVICE AND METHOD OF FABRICATING THE SAME

(75) Inventors: Masato Yamada, Annaka (JP); Masanobu Takahashi, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1205 days.

(21) Appl. No.: 10/590,325

(22) PCT Filed: Feb. 25, 2005

(86) PCT No.: PCT/JP2005/003133
§ 371 (c)(1),
(2), (4) Date: Aug. 23, 2006

(87) PCT Pub. No.: WO2005/083806
PCT Pub. Date: Sep. 9, 2005

(65) Prior Publication Data
US 2007/0187712 A1    Aug. 16, 2007

(30) Foreign Application Priority Data
Feb. 26, 2004   (JP) ................. 2004-052360

(51) Int. Cl.
*H01L 21/00* (2006.01)
(52) U.S. Cl. .......... 438/93; 438/455; 438/458; 438/459; 438/970; 438/977
(58) Field of Classification Search .......... 257/79, 257/85, 96; 438/93, 455, 458, 459, 970, 438/977
See application file for complete search history.

(56) References Cited

U.S. PATENT DOCUMENTS

| 5,157,468 A | 10/1992 | Matsumoto |
| 5,822,347 A | 10/1998 | Yokogawa et al. |

FOREIGN PATENT DOCUMENTS

| JP | 9-064484 | 3/1977 |
| JP | 55-43883 | 3/1980 |
| JP | 64-81277 | 3/1989 |
| JP | 4-132274 | 5/1992 |
| JP | 8-335717 | 12/1996 |

(Continued)

OTHER PUBLICATIONS

Sanken Electric Co., Ltd., *Nikkei Electonics*, Oct. 21, 2002, pp. 124-132.

*Primary Examiner* — Samuel A Gebremariam
(74) *Attorney, Agent, or Firm* — Oliff & Berridge, PLC

(57) ABSTRACT

A composite growth-assisting substrate 10 is formed by epitaxially growing a separation-assisting compound semiconductor layer 10k composed of a non-GaAs III-V compound semiconductor single crystal, and then a sub-substrate 10e composed of a GaAs single crystal in this order, on a first main surface of a substrate bulk 10m composed of a GaAs single crystal. The sub-substrate portion 10e is then separated from the composite growth-assisting substrate 10, so as to be left as a residual substrate portion 1 on a second main surface of the main compound semiconductor layer 40, and a portion of the residual substrate portion 1 is cut off to thereby form a cut-off portion 1j having a bottom surface used as a light extraction surface. By this configuration, the light emitting device is provided as allowing effective use of the GaAs substrate, and increasing the light extraction efficiency.

8 Claims, 33 Drawing Sheets

FOREIGN PATENT DOCUMENTS

| | | |
|---|---|---|
| JP | 9-064484 | 3/1997 |
| JP | 2001-339100 | 12/2001 |
| JP | 2002-305327 | 10/2002 |
| JP | 2004-14993 | 1/2004 |
| JP | 2005-079326 | 3/2005 |

(FRONT VIEW)

(PLAN VIEW)

STEP 5

STEP 6

STEP 7

STEP 8

(FRONT VIEW)

(PLAN VIEW)

(FRONT VIEW)

(PLAN VIEW)

(FRONT VIEW)

(PLAN VIEW)

(FRONT VIEW)

(PLAN VIEW)

1700

(FRONT VIEW)

(PLAN VIEW)

LIGHT EMITTING DEVICE AND METHOD OF FABRICATING THE SAME

BACKGROUND OF THE INVENTION

1. Field of the Invention

This invention relates to a light emitting device and a method of fabricating the same.

2. Description of the Related Art

After years of advancement, materials and element structures applied to light emitting elements such as light emitting diode and semiconductor laser devices have become more and more closer to the theoretical limits in terms of photoelectric conversion efficiency inside the device. Efficiency of extracting light from the device is, therefore, a critical issue for every effort of obtaining the device of further higher luminance. For example, a light emitting device having the light emitting layer portion thereof composed of an AlGaInP alloy can be realized as a high-luminance device, by adopting a double heterostructure in which a thin AlGaInP (or GaInP) active layer is sandwiched between an n-type AlGaInP cladding layer and a p-type AlGaInP cladding layer, both having larger band gaps. This sort of AlGaInP double heterostructure can be formed by epitaxially growing the individual layers composed of AlGaInP alloy on a GaAs single crystal substrate, relying upon capability of lattice matching of AlGaInP to GaAs. When such product is used as a light emitting, it is often to use the GaAs single crystal substrate (simply referred to as "GaAs substrate" on occasions, hereinafter) as a device substrate without modification. The AlGaInP alloy composing the light emitting layer portion, however, has a band gap larger than that of GaAs, and is therefore disadvantageous in that the emitted light is absorbed by the device substrate portion, so that a sufficient level of light extraction efficiency is hard to obtain.

Japanese Laid-Open Patent Publication "Tokkai" No. 2001-339100 discloses a technique of separating the growth-assisting GaAs substrate, and bonding a reinforcing device substrate (electro-conductive one) onto the surface exposed by separation, while placing a reflective Au layer in between. Nikkei Electronics Oct. 21, 2002, p. 124-132 discloses a light emitting device raised in reflection intensity, by configuring a reflective layer using Al having a smaller wavelength dependence of reflectivity than that of Au. The device disclosed in the Nikkei Electronics Oct. 21, 2002, p. 124-132 is configured as having an Al reflective layer disposed between the light emitting layer portion and the device substrate composed of a silicon substrate, and further as having a Au layer interposed between the Al reflective layer and the silicon substrate, so as to facilitate bonding between the silicon substrate and the light emitting layer portion. More specifically, the Au layer is formed so as to cover the Al reflective layer formed on the light emitting layer portion side, on the other hand, the Au layer is formed also on the silicon substrate side, and these Au layers are brought into close contact with each other so as to complete the bonding.

Both of Japanese Laid-Open Patent Publication "Tokkai" No. 2001-339100 and Nikkei Electronics Oct. 21, 2002, p. 124-132 stand on a technical idea that, in view of improving the light emitting efficiency of the light emitting device, use of a light-absorbing GaAs substrate produces thousand evils and no good, and aims principally at completely removing the GaAs substrate. It should, however, be said too wasteful indeed to completely remove the GaAs substrate, which is considerably more expensive as compared with silicon substrates, without paying no attention about use thereof and to separately provide the reinforcing silicon substrate, yet the top priority is placed on light extraction efficiency. The GaAs substrate assisting growth of the light emitting layer portion also plays a role of providing necessary strength against handling in the device fabrication, so that it is obvious that, if the GaAs substrate is removed, only the very thin light emitting layer portion will never ensure necessary strength against handling or the like. According to the above-described literatures, the GaAs substrate is removed from the light emitting layer portion, the silicon substrate is therefore bonded to the light emitting layer portion while placing the Au layer in between, making use of this silicon substrate as a reinforcing substrate in place of the GaAs substrate, but such process needs a process step of bonding another new substrate.

SUMMARY OF THE INVENTION

It is therefore an object of the this invention to provide a light emitting device allowing effective use of the GaAs single crystal substrate assisting thereon growth of the light emitting layer portion, having completely been removed in the conventional process, as a constituent of the functional device, and also capable of raising the extraction efficiency of beam to the external, and to provide a method of fabricating the same.

The light emitting device of this invention is characterized in being configured by epitaxially growing, on a first main surface of a substrate bulk composed of a GaAs single crystal, a separation-assisting compound semiconductor layer composed of a III-V compound semiconductor single crystal having a composition differed from GaAs; epitaxially growing a sub-substrate portion composed of a GaAs single crystal on the separation-assisting compound semiconductor layer, to thereby fabricate a composite growth-assisting substrate; epitaxially growing, on a first main surface of the sub-substrate portion, a main compound semiconductor layer having therein a light emitting layer portion; removing the separation-assisting compound semiconductor layer by chemical etching, to thereby separate, from the composite growth-assisting substrate, the sub-substrate portion so as to be remained as a residual substrate portion on a second main surface of the main compound semiconductor layer; and cutting off a portion of the residual substrate portion to thereby form a cut-off portion having the bottom surface thereof serves as a light extraction surface or a reflective surface with respect to emission beam from the light emitting layer portion.

The method of fabricating a light emitting device is a method of fabricating the above-described light emitting device, and has:

a composite growth-assisting substrate preparation step preparing a composite growth-assisting substrate by epitaxially growing a separation-assisting compound semiconductor layer composed of a III-V compound semiconductor single crystal having a composition differed from GaAs, on a first main surface of a substrate bulk composed of a GaAs single crystal, and by epitaxially growing a sub-substrate portion composed of a GaAs single crystal on the separation-assisting compound semiconductor layer;

a light emitting layer portion growth step epitaxially growing a main compound semiconductor layer having therein a light emitting layer portion, on a first main surface of the sub-substrate portion;

a substrate bulk removal step removing the separation-assisting compound semiconductor layer by chemical etching, to thereby separate, from the composite growth-assisting substrate, the sub-substrate portion so as to be remained as a residual substrate portion on a second main surface of the main compound semiconductor layer; and a cut-off portion forming step forming a cut-off portion by cutting off a portion of the residual substrate portion.

In this invention, of the composite growth-assisting substrate composed of the substrate bulk, the separation-assisting compound semiconductor layer and the sub-substrate portion, the sub-substrate portion composing the main surface (that is, first main surface), used for allowing crystal growth of the light emitting layer portion to proceed thereon, is separated from the composite growth-assisting substrate, so as to be remained as a residual substrate portion on the second main surface side of the main compound semiconductor layer containing the light emitting layer portion. In addition, the light extraction efficiency of the device can be improved, by cutting off a portion of the residual substrate portion to thereby form the cut-off portion, and by using the bottom surface of the cut-off portion as a light extraction surface or a reflective surface with respect to emission beam from the light emitting layer portion. On the other hand, the residual substrate portion composed of a GaAs single crystal can effectively be used as a constituent of the device. Specific examples of modes of use include the following:

used as a support for the light emitting layer portion; and for the case where a light-extraction-surface-side electrode is formed either on the first main surface or the second main surface of the main compound semiconductor layer so as to partially cover thereof, used as a current blocking layer allowing bypass of fractional current towards a region straight under the light-extraction-surface-side electrode.

Because GaAs has a large electronegativity, the residual substrate portion composed of such GaAs single crystal is used as a region destined for formation of a bond-alloying layer for forming ohmic contact, so as to contribute to reduction in forward voltage of the device. It is to be noted herein that the "main compound semiconductor layer" refers to a portion containing the light emitting layer portion, obtained when a stack of compound semiconductors, having therein the light emitting layer portion, is halved in the thickness-wise direction along a plane containing the bottom surface of the cut-off portion.

For the case where the growth-assisting substrate is used as a device constituent, an appropriate thickness of the substrate, taking handling or the like in the crystal growth process into consideration, is far larger than an appropriate thickness when it is used as a device constituent, so that in view of forming the residual substrate portion with an appropriate thickness, it is necessary to considerably reduce the thickness of the growth-assisting substrate, after the light emitting layer portion is grown. In this invention, the growth-assisting substrate is formed as a composite growth-assisting substrate, by epitaxially growing the separation-assisting compound semiconductor layer composed of a III-V compound semiconductor single crystal having a composition different from that of the substrate bulk, and by epitaxially growing the sub-substrate portion composed of a GaAs single crystal on the separation-assisting compound semiconductor layer. The main compound semiconductor layer having therein the light emitting layer portion typically composed of AlGaInP is epitaxially grown on the first main surface of the sub-substrate portion, and the separation-assisting compound semiconductor layer is then removed by chemical etching, making use of difference in etchrate between the compound semiconductor composing the separation-assisting compound semiconductor layer and GaAs, to thereby separate the sub-substrate portion from the compound growth-assisting substrate portion. By this process, the thickness-reducing process of the growth-assisting substrate can be carried out in an extremely simple manner, and, by configuring the sub-substrate portion as an epitaxial layer formed on the separation-assisting compound semiconductor layer, accuracy in the thickness of the residual substrate portion derived from the sub-substrate portion can be improved. In addition, because the second main surface of the sub-substrate portion in contact with the separation-assisting compound semiconductor layer is given as a chemically etched surface not relevant to any mechanical processing, it is also made possible to improve crystal quality of the residual substrate portion derived from the sub-substrate portion.

Specific methods of separating the sub-substrate portion from the composite growth-assisting substrate are two followings.

(1) Using the separation-assisting compound semiconductor layer as an etching stopper layer, the substrate bulk is etched off using a first etching solution having an etching selectivity preferring GaAs, and the etching stopper layer is then etched off using a second etching solution having an etching selectivity preferring the etching stopper layer. The substrate bulk may preliminarily be thinned from the second main surface side by mechanical grinding such as surface grinding, and may be etched thereafter. The etching stopper layer applicable herein is an AlInP layer, for example.

(2) The separation-assisting compound semiconductor layer is formed as a separation layer, and the separation layer is selectively etched to thereby separate the sub-substrate portion from the composite growth-assisting substrate. This method is advantageous in that the substrate bulk is not lost during separation (peeling) of the sub-substrate portion, and the substrate bulk can be reused for the next fabrication of the light emitting device.

As for the step of epitaxially growing the sub-substrate portion on the substrate bulk, a publicly-known MOVPE (metal-organic vapor phase epitaxy) process is applicable for the case where the sub-substrate of relatively as thin as 20 μm or below is desired. On the other hand, the hydride vapor phase epitaxial growth (HVPE) process is efficient for the case where the sub-substrate of as thick as exceeding 20 μm is desired. The HVPE process is a method of proceeding vapor phase growth of a III-V compound semiconductor layer, by converting Ga (gallium) having a low vapor pressure into more volatile GaCl through reaction with hydrogen chloride, thereby allowing Ga to react with a Group-V element gas in a form of being mediated by GaCl. Growth rate of the layer in the above-described MOVPE process is typically as small as approximately 4 μm/hour, and is apparently disadvantageous in terms of efficiency for the case where a thick sub-substrate portion is desired. In contrast to this, the growth rate of the layer in the HVPE process is typically as large as approximately to 9 μm/hour, being twice or more as large as that of the MOVPE process, capable of forming the sub-substrate portion in an extremely efficient manner, and of suppressing the cost for source materials far lower than that in the MOVPE process, because there is no need of using any expensive metal-organic compounds. The MOVPE process may sometimes fail in obtaining a desired level of electro-conductivity, because the resultant compound semiconductor layer tends to contain a large amount of residual H and C, whereas the layer grown by the HVPE process is less likely to cause residual C and H unlike the MOVPE process, wherein more specifically, the residual concentration of C and H can be extremely readily suppressed to as low as $1\times10^{18}/cm^3$ or below. C concentration and H concentration of a transparent thick semiconductor layer formed by the HVPE process are possibly suppressed to as low as $7\times10^{17}/cm^3$ or below, and even it is relatively easy to suppress it blow the detection limit ($1\times10^{17}/cm^3$ or around or below, for example).

The sub-substrate portion is formed by epitaxially growth on the substrate bulk as described in the above, so that the main surface thereof has smaller populations of damage and crystal defect as compared with those on the main surface formed by polishing or the like. It is therefore possible to obtain a sufficiently high-quality light emitting layer portion, even if the main compound semiconductor layer is epitaxially grown on the first main surface of the sub-substrate portion, without placing a buffer layer in between. The process steps can, or course, be simplified because the buffer layer is not formed.

Paragraphs below will respectively explain specific embodiments of the light emitting device of this invention.

First Embodiment

This embodiment is characterized in that the main compound semiconductor layer has a main light extraction surface formed on the first main surface side, and has a light-extraction-side electrode, through which emission drive voltage is applied to the light emitting layer portion, formed so as to cover a part of the first main surface of the main compound semiconductor layer;

An opening is formed, as the cut-off portion opened on the second main surface of the residual substrate portion, by partially cutting off the residual substrate portion disposed on the second main surface side of the main compound semiconductor layer, so as to leave the residual substrate portion around the periphery of the opening; and the opening has, as being provided thereto, a reflective component reflecting the emission beam from the light emitting layer portion.

The "light extraction surface" of the device in this invention refers to the surface of the device from which the beam is extractable to the external, and the "main light extraction surface refers to the light extraction surface formed on the first main surface of the main compound semiconductor layer in a first, second and fourth embodiments and also on the second main surface in a third embodiment. Besides the above-described main light extraction surface, the light extraction surface can be configured with the side faces of the later-described transparent thick semiconductor layer or auxiliary current spreading layer, and the bottom surface of the cut-off portion formed in the main compound semiconductor layer.

In the light emitting device of the first embodiment, the opening is formed on the second main surface of the residual substrate, in a form of cutting off a part of the residual substrate portion, wherein the opening is provided with the reflective component reflecting the emission beam from the light emitting layer portion. If a portion of the growth-assisting sub-substrate portion can function as the residual substrate portion, of adding rigidity to the light emitting layer portion, it is no more necessary to newly bond an electro-conductive substrate such as a silicon substrate on the second main surface side of the light emitting layer portion, for the purpose of reinforcement. The reflective component per se can be disposed to thus-formed opening without being premised on bonding of the substrates, without needing any annealing for bonding, so that the reflective component raises no anticipation of degrading the reflectivity through metallurgical reactions or the like. Adoption of the first embodiment of this invention can realize a light emitting device substantially in no need of bonding a device substrate such as a silicon substrate to the light emitting portion while placing a metal layer composing the reflective component in between, and capable of readily ensuring a rigidity at a level sufficiently durable against handling in the manufacturing.

When the cut-off portion is formed, it is of no problem that a portion of the residual substrate remains at the bottom position of the cut-off portion, if the thickness thereof is small enough (for example, 20 nm or below). In view of raising the reflectivity as possible, it is however preferable that the light-absorbing compound semiconductor derived from the GaAs residual substrate portion does not remain at the bottom of the cut-off portion as possible, that is, the cut-off portion is formed so as to penetrate the residual substrate portion in the thickness-wise direction, and so as to allow the second main surface of the main compound semiconductor layer (having light absorbance smaller than the residual substrate portion) to be exposed in the cut-off portion.

The light emitting device of the first embodiment of this invention is effectively configured so as to raise the light extraction efficiency, as described below. That is, the opening is formed so as to overlap a region straight under the main light extraction surface, and so as to allow therein the reflective component to overlap the region straight under the main light extraction surface. In this configuration, the reflective component can be faced to a position straight under the main light extraction surface, and thereby the beam can be more efficiently be extracted, so that the configuration is contributive to further increase in the emission luminance of the light emitting device as a whole.

On the other hand, the opening may be formed also so as to overlap the region straight under the light-extraction-side electrode, and the reflective layer may also be provided so as to overlap the region straight under the light-extraction-side electrode within the opening. On the reflective component thus provided in the region straight under the light-extraction-side electrode, reflected light directed right upward is intercepted by the light-extraction-side electrode, but reflected light directed obliquely at an angle larger than an angle of viewing the contour line of the electrode can be extracted through a light extraction region surrounding the light-extraction-side electrode to the external, contributing to more efficient extraction of the beam. It is a natural matter of course that provision of the reflective component also in the region straight under the light-extraction-side electrode, in addition to the region straight under the main light extraction surface, can further increase the extraction efficiency of beam.

In order to increase the emission intensity, it is important to uniformly supply current over the region of the light emitting layer portion faced to the main light extraction surface, and in particular, it is effective to provide a current spreading layer between the light emitting layer portion and the light-extraction-side electrode, in view of supplying sufficient current also to the region apart from the light-extraction-side electrode. The current spreading layer can be formed not only as a compound semiconductor layer raised in the dopant concentration than that of the light emitting layer portion, but also as an electro-conductive oxide layer such as ITO (indium tin oxide).

The main light extraction surface is preferably formed so as to surround the light-extraction-side electrode along the periphery of the first main surface of the current spreading layer. This configuration can uniformly supply current over the region around the light-extraction-side electrode, contributing to improvement in the light extraction efficiency. In this case, the residual substrate portion composing a current path to the light emitting layer portion can be formed in a frame-like geometry along the periphery of the second main surface of the main compound semiconductor layer containing therein the light emitting layer portion, and the opening can be formed inside the frame-like residual substrate portion. Provision of the frame-like residual substrate portion can concentrate current to the main light extraction surface surrounding the light-extraction-side electrode, and can allow the light emitting layer portion to emit light predominantly in the region advantageous in terms of light extraction, so that the light extraction efficiency can further be improved.

In the above configuration, the contour line of the light-extraction-side electrode projected onto the second main surface of the main compound semiconductor layer can be located inside the frame-like residual substrate portion. In the opening, the region falls between the inner periphery of the frame-like residual substrate portion and the projected contour line of the light-extraction-side electrode can be covered with the reflective component. According to this configuration, the beam reflected on the reflective component can effectively be extracted through the region having a predetermined width formed between the light extraction region surrounding the light-extraction-side electrode and the frame-like residual substrate portion, contributing to further improvement in the light extraction efficiency.

In the region straight under the light-extraction-side electrode, contact resistance between the main compound semiconductor layer and the reflective component can be adjusted larger than contact resistance between the main compound semiconductor layer and the residual substrate portion. In the region straight under the light-extraction-side electrode, much of the emission beam is intercepted by the light-extraction-side electrode despite every effort of allowing the light emitting layer portion to illuminate, and cannot be extracted to the external with a great efficiency. It is therefore not a wise strategy to increase energy of current to be supplied in the region straight under the light-extraction-side electrode. By disposing, in the opening, the reflective component in the region straight under the light-extraction-side electrode, and by adjusting the contact resistance between the reflective component and the main compound semiconductor layer larger than the contact resistance between the residual substrate portion and the main compound semiconductor layer as described in the above, the energy amount of current distributed to the region straight under the light-extraction-side electrode can be reduced, and correspondingly the current can be supplied predominantly to the region of light emitting layer portion on the residual substrate portion side located straight under the main light extraction surface, so that the light extraction efficiency can be increased.

The reflective component can be configured as a metal reflective component. In this case, the metal reflective component can be disposed in the region straight under the light-extraction-side electrode, on the main compound semiconductor layer portion composing the bottom surface of the opening, so as to directly contact therewith, rather than placing the bond-assisting alloyed layer in between. Exclusion of the bond-assisting alloyed layer from the region straight under the light-extraction-side electrode is successful in effectively increasing the contact resistance between the main compound semiconductor layer and the reflective component, and in suppressing light emission in the region straight under the light-extraction-side electrode highly causative of interception of the emission beam, and thereby in contributing further improvement in the light extraction efficiency. It is to be noted that, for the case where the opening is formed so as to overlap the region straight under the main light extraction surface, the bond-assisting alloyed layer may be excluded from the entire range of the metal reflective component, but may be formed in a distributed manner in the region straight under the main light extraction surface. In this case, the metal reflective component is configured as being brought into contact with the main compound semiconductor layer portion, composing the bottom surface of the opening, while placing the bond-assisting alloyed layer in between in the region straight under the main light extraction surface, so that the light emitting layer portion can illuminate under current supply via the metal reflective component in the region straight under the light-extraction-side electrode. Therefore, the light extraction efficiency can further be improved.

In the above described configuration, the reflective component can be composed of a metal paste layer filled in the opening. According to this method, the reflective component can readily be formed in the opening, by coating a metal paste such as an Ag paste. By filling the internal space of the opening with the metal paste having a large heat conductivity, heat radiation from the light emitting layer portion can be promoted, temperature rise in the light emitting layer portion under current supply can be suppressed, and thereby the service life of the device can be elongated. In this case, the second main surface of the residual substrate portion, together with the second main surface of the metal paste layer filling the opening, can be covered with a heat-radiating metal component. Provision of the heat-radiating metal component also on the residual substrate portion can further promote heat radiation from the light emitting layer portion. By using the metal paste layer also as a binder, the heat-radiating metal component can readily be bonded to the light emitting layer portion (main compound semiconductor layer), using the metal paste layer also functioning as the reflective component. The heat-radiating metal component is preferably composed of a metal having possibly the largest heat conductivity, and more specifically a metal containing either of Al and Cu as a major constituent (50% by mass or more, including 100% by mass). More specifically, use of an Al metal plate or a Cu metal plate can configure a high-performance, heat-radiating metal component at low cost. A Cu—W alloy has a large heat capacity, and can exhibit an especially excellent effect of heat radiation property.

It is also allowable to form a conductive path paste layer covering the second main surface of the residual substrate portion, as being integrated with the outer peripheral portion of the metal paste layer, and to form the bond-assisting alloyed layer reducing the contact resistance with respect to the conductive path paste layer on the second main surface of the residual substrate portion. According to this configuration, the metal paste layer can be formed simply by coating over the second main surface side of the main compound semiconductor layer having the opening formed therein, together with the region having the residual substrate portion formed therein, making it more simple to form the metal paste layer also functioning as the reflective component (the conductive path paste layer is formed using the same metal paste with that filling the opening). In addition, the bond-assisting alloyed layer is formed on the second main surface of the residual substrate portion, and the conductive path paste layer composed of the metal paste layer is formed so as to cover the bond-assisting alloyed layer, so that current can readily be supplied between the residual substrate portion and the heat-radiating metal component via the bond-assisting alloyed layer and the conductive path paste layer, also contributing to reduction in series resistance of the device.

On the other hand, the reflective component can be composed of a reflective metal layer formed on the main compound semiconductor layer portion composing the bottom surface of the opening. This configuration is successful in obtaining the reflective component having a higher reflectivity by virtue of improved smoothness of the reflective metal layer, although in need of additional film-forming step of vacuum evaporation, sputtering and the like.

It is also allowable to provide a DBR (Distributed Bragg reflector) layer reflecting light making use of Bragg reflection, between the main compound semiconductor layer and the residual substrate portion, by stacking a plurality of semiconductor films differing in the refractive index. The DBR layer can epitaxially be grown on the residual substrate portion, and can effectively produce reflected beam even in a region, out of the light emitting layer portion located straight under the main light extraction surface, located straight above the residual substrate portion having light absorbing property within the light emitting layer portion located straight under the main light extraction surface, and consequently can further improve the light extraction efficiency.

Second Embodiment

This embodiment is characterized in that the main compound semiconductor layer has a main light extraction surface formed on the first main surface side, and has a light-extraction-side electrode, through which emission drive voltage is applied to the light emitting layer portion, formed so as to cover a part of the first main surface of the main compound semiconductor layer; the cut-off portion is formed in the residual substrate portion disposed on the second main surface side of the main compound semiconductor layer, at least in a region straight under the light extraction surface, and at least a portion of the region straight under the light-extraction-side electrode is contained in the residual substrate portion.

In the light emitting device according to the second embodiment of this invention, the cut-off portion was formed at least in a region, within the residual substrate portion, straight under the light extraction surface, and cutting off was made so that at least a portion of the region straight under the light-extraction-side electrode was contained in the residual substrate portion. By cutting off the GaAs residual substrate portion, which acts as a light absorber, in the region straight under the main light extraction surface, within the second main surface of the main compound semiconductor layer, even the emission beam directed towards that region becomes extractable to the external, and thereby the light extraction efficiency can be improved. On the other hand, a portion of the residual substrate portion is remained in the region straight under the light-extraction-side electrode. The residual substrate portion shows light-absorbing action, but the residual substrate portion thus remained in this region is substantially less harmful, because even the reflected light should generate in the region straight under the light-emitting-side electrode, the light is finally intercepted by the light-extraction-side electrode. Therefore, it is now possible for the light emitting layer portion to have a function of imparting rigidity, by leaving the residual substrate portion unremoved in the region straight under the light-extraction-side electrode, without considerably intensifying influence of light absorption by the residual substrate portion. As a consequence, it becomes no more necessary to bond a new electroconductive substrate such as a silicon substrate for the purpose of reinforcement, on the second main surface side of the main compound semiconductor layer.

Between the residual substrate portion and the light emitting layer portion, an auxiliary current spreading layer composed of a compound semiconductor may be provided. This configuration can successfully raise the current spreading effect towards the bottom surface portion of the cut-off portion, and can increase current distributed to the region of the light emitting layer portion corresponded to the cut-off portion, so that the emission beam extractable from the bottom surface of the cut-off portion (or reflected on the bottom surface of the cut-off portion) can further be increased. For the case where the light emitting layer portion is composed as having a double heterostructure, using later-described AlGaInP or the like, in which a first-conductivity-type cladding layer, an active layer and a second-conductivity-type cladding layer are stacked in this order as viewed from the side closer to the residual substrate portion, the auxiliary current spreading layer can further be intensified in the current spreading effect, by raising the effective carrier concentration thereof higher than in the first-conductivity-type cladding layer. It is also allowable to thicken the first-conductivity-type cladding layer than the second-conductivity-type cladding layer, in place of providing the auxiliary current spreading layer. In this configuration, the region on the second main surface side of the first-conductivity-type cladding layer (the surficial portion on the side closer to the bottom of the cut-off portion) is considered as playing a role of the current spreading layer. By raising the effective carrier concentration in such region than in the residual regions, the current spreading effect can be more intensive one.

In this case, the emission beam extractable through the cut-off portion can further be increased, by forming the cut-off portion in the residual substrate portion, so as to surround the region straight under the light-extraction-side electrode, along the periphery thereof.

More specifically, the emission beam from the light emitting layer portion can be extracted through the cut-off portion to the external.

In other words, the bottom surface portion of the cut-off portion formed in the residual substrate portion forms an auxiliary light extraction surface on the second main surface side of the light emitting layer portion, so that extraction of the emission beam directly therethrough can improve the light extraction efficiency of the device as a whole.

In this case, the device can be configured so that the second main surface of the residual substrate portion is bonded onto a metal stage also used as the reflective component, and so that the beam extracted through the cut-off portion is allowed to reflect on the reflective surface of the metal stage. This configuration, allowing the emission beam extracted from the bottom surface of the cut-off portion to reflect on the reflective surface of the metal stage, can considerably increase the beam directed towards the first main surface side of the light emitting layer portion, and can improve the directionality towards that side of the light emitting device.

On the other hand, the light emitting device of the second embodiment can be provided, to the cut-off portion, with the metal reflective component reflecting thereon the emission beam from the light emitting layer portion. By providing the metal reflective component to the cut-off portion, the emission beam, which is otherwise absorbed by the residual substrate portion in that region, can be extracted in a form of reflected beam with the aid of the metal reflective component, and thereby the light extraction efficiency can be improved. The metal reflective component per se may be disposed on the bottom surface of the above-described cut-off portion, without being premised on bonding of the substrates, and of course without needing any annealing for bonding, so that the metal reflective component raises no anticipation of degrading the reflectivity through metallurgical reactions or the like. As a consequence, a light emitting device, while being configured as having the light emitting layer portion covered with the metal reflective surface, is realized as being intrinsically in no need of step of bonding the device substrate such as silicon substrate to the light emitting layer portion, while placing a metal layer composing the metal reflective component in between.

It is to be noted that the cut-off portion may be formed as intruding into the region straight under the light-extraction-side electrode, and in the cut-off portion, the metal reflective layer may be formed as intruding into the region straight under the light-extraction-side electrode. On the metal reflective component intruding into the region straight under the light-extraction-side electrode, the reflected light directed right upward is intercepted by the light-extraction-side electrode, but the reflected light directed obliquely at an angle larger than an angle of viewing the contour line of the electrode can be extracted through a light extraction region surrounding the light-extraction-side electrode to the external, contributing to more efficient extraction of the beam. On the other hand, it is of no problem if the residual substrate portion is formed as intruding into the region straight under the main light extraction surface, so far as the disadvantage ascribable to light absorption by the residual substrate portion is not actualized to an extreme degree.

For the purpose of raising the emission intensity, it is important to uniformly supply current over the region of the light emitting layer portion faced to the main light extraction surface, and in particular in view of supplying sufficient current also to regions distant from the light-extraction-side electrode, it is effective to provide a current spreading layer similarly to as described in the first embodiment, between the light emitting layer portion and the light-extraction-side electrode. For the case where such current spreading layer is provided, the main light extraction surface can be formed so as to surround the light-extraction-side electrode along the periphery of the first main surface of the current spreading layer. This configuration can uniformly supply current to the peripheral region of the light-extraction-side electrode, and thereby contributes to improvement in the light extraction efficiency. Formation of a relatively thick current spreading layer (typically of 20 µm to 200 µm thick, both ends inclusive) is also successful in raising the extractable energy of beam out from the circumferential side faces of the current spreading layer, contributing to further improvement in the light extraction efficiency.

It is also allowable to form, on the bottom surface of the cut-off portion, the bond-assisting alloyed layer reducing the contact resistance with respect to the metal reflective component. This configuration successfully allows the metal reflective layer to function as a back electrode for driving the light emitting layer portion. The bond-assisting alloyed layer can be formed by forming a metal thin film for forming the layer on the bottom surface of the cut-off portion, and then by annealing it for alloying. The bond-assisting alloyed layer may be formed over the entire bottom surface of the cut-off portion, but it is also effective to form the bond-assisting alloyed layer on the bottom surface of the cut-off portion in a distributed manner, if the above-described alloying considerably lowers the reflectivity of the bond-assisting alloyed layer. By disposing the metal reflective component in the background regions of the individual bond-assisting alloyed layers so as to contact with the bottom surface of the cut-off portion, a desirable level of reflectivity can be ensured in the background regions, and the reflectivity as a whole can be improved as compared with the case having a solid bond-assisting alloyed layer formed over the entire bottom surface of the cut-off portion.

The second main surface of the residual substrate portion may be covered with an integrated metal component including the metal reflective component. This configuration contributes to simplification of the processes because the second main surface side of the light emitting device (that is, a back side of the device) can be covered together with the bottom surface of the cut-off portion by the metal component. In this case, it is preferable to adjust the electric resistance, in the thickness-wise direction of the device, of the region having the residual substrate portion formed therein, higher than the electric resistance, in the thickness-wise direction of the device, of the region having the cut-off portion formed therein. In the region straight under the light-extraction-side electrode, much of the emission beam is intercepted by the light-extraction-side electrode despite every effort of allowing the light emitting layer portion to illuminate, and cannot be extracted to the external with a high efficiency. It is therefore not a wise strategy to increase energy of current to be supplied in the region straight under the light-extraction-side electrode. Now the configuration described in the above can reduce the amount of energy of current distributed to the region straight under the light-extraction-side electrode. As a consequence, the current can be supplied predominantly to the region of light emitting layer portion on the cut-off portion side located straight under the main light extraction surface, so that the light extraction efficiency can be increased.

As has been described in the above, there are a variety of methods of adjusting the electric resistance distribution of the device. More specifically, the second main surface of the residual substrate portion can be configured as having, formed thereon, no bond-assisting alloyed layer reducing the contact resistance with respect to the metal component (configuration 1). The residual substrate portion can be configured also as having a conductivity type opposite to that of either one of a p-type layer portion and an n-type layer portion, composing the p-n junction in the light emitting layer portion, placed closer to the residual substrate portion (configuration 2). The residual substrate portion can be configured still also as having a conductivity type same as that of either one of a p-type layer portion and an n-type layer portion, composing the p-n junction in the light emitting layer portion, placed closer to the residual substrate portion, and instead, an inversion layer portion composed of a compound semiconductor having a conductivity type opposite to that of the residual substrate portion is interposed between the light emitting layer portion and the residual substrate portion, so as to cover the residual substrate portion (configuration 3). These configurations contribute to further improvement in the light extraction efficiency, based on suppression of light emission in the region straight under the light-extraction-side electrode where the emission beam is readily intercepted.

The second main surface of the residual substrate portion can be bonded to a support while placing a metal paste layer such as an Ag paste in between. The support is typically a metal stage, or a later-described heat radiating metal component provided separately from the metal stage. In this case, the above-described cut-off portion formed in the device can be used as a space for pooling the metal paste which tends to creep up onto the peripheral side faces of the main compound semiconductor layer in the process of bonding. This configuration can effectively suppress nonconformities such as short-circuiting of the p-n junction of the light emitting layer portion contained in the main compound semiconductor layer, ascribable to thus-crept-up metal paste. In this case, the thickness of the residual substrate portion ensured to as thick as 40 µm or more can further enhance the effect. When the device is coated on the bottom surface thereof with the metal paste and bonded onto the support such as the metal stage, the level of height of the top surface of the device later having the light-extraction-surface-side electrode formed thereon may vary, depending on the thickness of the metal paste layer interposed between the bottom surface of the device and the surface of the support, and the variation may cause nonconformities in view of obtaining a uniform bonded state, when wire bonding onto the light-extraction-surface-side electrode is carried out in an automated manner. In contrast, the above-described configuration, allowing the second main surface of the residual substrate portion to closely contact with the surface of the support, and allowing the bonding to proceed using the metal paste layer filled in the cut-off portion, can uniformly equalize the thickness of the metal paste based on the thickness control of the residual substrate portion, and thereby can moderate the variation in the level of height of the light-extraction-surface-side electrode after bonding (this effect is similarly exhibited also in the first embodiment).

In the above-described configuration, the metal reflective component can be configured by a metal film formed on the bottom surface of the cut-off portion. This configuration needs a film forming step such as vacuum evaporation or sputtering, but is successful in obtaining the metal reflective component of a higher reflectivity, by virtue of an excellent smoothness of the metal film. Formation of the metal film can be simplified, if the film is formed so as to cover the second main surface of the residual substrate portion, together with the bottom surface of the cut-off portion at a time. In this case, the circumferential side faces of the residual substrate portion may be formed as inclined surfaces, so as to make the area of the second main surface of the residual substrate portion smaller than the area of the first main surface, and the metal film is configured as covering the second main surface and the circumferential side faces of the residual substrate portion, and the bottom surface of the cut-off portion in an integrated manner. By making the circumferential side faces of the residual substrate portion as the inclined surfaces as described in the above, the metal film can be formed to a sufficient thickness also on the circumferential side faces, even when the metal film is formed by a film forming method characterized by a strong directionality such as vacuum evaporation, sputtering and the like. The configuration is particularly effective for the case where the metal film, covering the residual substrate portion and the bottom surface of the cut-off portion, is used as an integrated current supply path in the in-plane direction.

On the other hand, the metal reflective component can be configured as a metal paste layer filled in the cut-off portion. According to this method, the metal reflective component can readily be formed in the cut-off portion by coating a metal paste. In addition, filling of the inner space of the cut-off portion by the metal paste having a high heat conductivity can promote heat radiation at the light emitting layer portion, and can thereby suppress temperature rise in the light emitting layer portion under current supply, so that the service life of the device improves. In this case, the second main surface of the residual substrate portion can be covered with the heat-radiating metal component similar to that described in the first embodiment, together with the second main surface of the metal paste layer filling the cut-off portion. Provision of the heat-radiating metal component is successful in further promoting heat radiation at the light emitting layer portion.

Third Embodiment

This embodiment is characterized in forming the cut-off portion by cutting off a portion of the residual substrate portion so as to use the bottom surface of the cut-off portion as the main light extraction surface, and forming the light-extraction-side electrode, through which emission drive voltage is applied to a light emitting layer portion, so as to cover the second main surface of the residual substrate portion.

Japanese Laid-Open Patent Publication "Tokkai" No. 2001-339100 and Nikkei Electronics Oct. 21, 2002, p. 124-132 stand on a basic concept that the main surface (first main surface) opposite to that facing to the substrate of the light emitting layer portion is used as the light extraction surface, and the second main surface side from which the substrate has been removed is used as the reflective surface after being disposed with the metal layer. A larger reflective surface as possible should be more desirable in this case in view of improving the light extraction efficiency, so that an idea of daringly leaving a part of the substrate unremoved could not be born, if it was considered that the substrate remained even partially would correspondingly reduce the reflective surface, and what is worse, the substrate was light-absorbing.

The present inventors then changed their minds, and investigated into a configuration using the second main surface of the main compound semiconductor layer having therein the light emitting layer portion, facing to the residual substrate portion, as the main light extraction surface. The emission beam from the light emitting layer portion can be extracted by removing the growth-assisting GaAs sub-substrate portion which acts as a light absorber. If the sub-substrate is cut off only partially so as to leave a part thereof, as the residual substrate portion, on the first main surface of the main compound semiconductor layer, rather than removing the entire portion of the sub-substrate portion, the bottom surface of thus-formed cut-off portion can be used as the main light extraction surface, and the emission beam even directed to that portion can be extracted to the external, so that the light extraction efficiency can be improved. On the other hand, it is necessary to form the light-extraction-side electrode for emission driving, on the second main surface of the main compound semiconductor layer. In the straight-under region of the light-extraction-side electrode, any emission beam directed towards such region cannot be extracted in a form of a direct beam anyhow, because of interception by the electrode. The present inventors then found out that the light-absorbing action of the residual substrate portion can be blinded by the light interception action of the light-extraction-side, and can reduce the actual harm thereof, if the second main surface of the residual substrate portion is effectively used as a region allowing therein formation of the light-extraction-side electrode, and reached the third embodiment of the invention. As a consequence, influence of light absorption by the residual substrate portion composed of GaAs is not so actualized, or rather it becomes also possible to effectively use the substrate as a functional device constituent, making positive use of physical properties specific to GaAs.

The light-extraction-side electrode can be bonded with a current-supply wire. For the case where the thickness of the compound semiconductor layer disposed between the light emitting layer portion and the light-extraction-side electrode is small (in particular 2 µm or less), any effort of bonding a current supply wire to the light-extraction-side electrode is likely to exert influences of bonding-induced damage to the light emitting layer portion, and is likely to cause failure. For exemplary cases where the wire bonding is carried out by ultrasonic bonding, or with an additional assist of heating by thermosonic bonding, impact stress ascribable to ultrasonic wave or heating (or additional pressurizing) concentrates on the compound semiconductor layer straight under a bonding pad, and crystal defects such as dislocation may be introduced as the damage. The damaged region unfortunately reaching the light emitting layer portion results in the nonconformities specifically as described below:

(1) lowering in the emission luminance as a direct influence, supposedly ascribable to increase in nonradiative transition process caused by the crystal defect; and (2) degradation in the service life of the device caused by reaching of the damaged region to the light emissive portion. Prolonged current supply to the light emission layer having dislocation formed therein tends to multiply the dislocation due to current concentrated to the dislocation, and results in degradation with age in the emission luminance.

Most part of the damaged region, even if occurred during the bonding, can be confined within the residual substrate portion if the residual substrate portion resides straight under the light-extraction-side electrode, so that the damaged region becomes less likely to affect the light emitting layer portion, current spreading layer and the like, and can reduce the failure. In view of distinctively achieving the effect, the thickness of the residual substrate portion is preferably ensured to as thick as 3 µm or more.

Next, in the straight-under region of the light-extraction-side electrode, most part of the emission beam is intercepted by the light-extraction-side electrode despite every effort of allowing the light emitting layer portion to illuminate, and cannot be extracted to the external with a high efficiency. It is therefore understood that current to be supplied is preferably reduced as possible in the straight-under region of the light-extraction-side electrode. Specific configurations applicable herein are as follows. That is, the light-extraction-side electrode is formed as having a main electrode covering the residual substrate portion, and a sub-electrode electrically in contact with the main electrode, and covering the bottom surface of the cut-off portion in a partial region located around the residual substrate portion. The bond-assisting alloyed layer for reducing contact resistance is formed on the bottom surface region of the cut-off portion in contact with the sub-electrode. This configuration makes the light-extraction-side electrode electrically contact with the compound semiconductor layer, through the bond-assisting alloyed layer outside the residual substrate portion. On the premise of such configuration, in configuration 1 of the third embodiment, the residual substrate portion is configured as the current blocking layer having a conductivity type opposite to that of either one of a p-type layer portion and an n-type layer portion, composing the p-n junction in the light emitting layer portion, placed closer to the residual substrate portion. Similarly in configuration 2, the residual substrate portion is configured as having a conductivity type same as that of either one of a p-type layer portion and an n-type layer portion, composing the p-n junction in the light emitting layer portion, placed closer to the residual substrate portion, and instead, an inversion layer portion composed of a compound semiconductor having a conductivity type opposite to that of the residual substrate portion is interposed between the light emitting layer portion and the residual substrate portion, so as to cover the residual substrate portion. In either configuration, an inverted p-n junction portion under the reverse bias state is interposed between the residual substrate portion and the light emitting layer portion, when the device is applied with the emission drive voltage (that is, forward voltage with respect to the p-n junction portion composing the light emitting layer portion), so that current distribution to the straight-under region of the light-extraction-side electrode, where the emission beam is like to be intercepted, can be suppressed, contributing to further improvement in the light extraction efficiency.

Another possible configuration is such that the light-extraction-side electrode is formed as having a main electrode covering the residual substrate portion, and a sub-electrode electrically in contact with the main electrode, and covering the bottom surface of the cut-off portion in a partial region located around the residual substrate portion, the bond-assisting alloyed layer for reducing contact resistance being not formed on the residual substrate portion in contact with the main electrode but formed on the bottom surface region of the cut-off portion in contact with the sub-electrode. By providing the above-described, sub-electrode to the light-extraction-side electrode, and by ensuring electric contact between the light-extraction-side electrode and the main compound semiconductor layer only with respect to the bond-assisting alloyed layer formed on the bottom surface of the cut-off portion outside the residual substrate portion, current density in the residual substrate portion under emission operation can effectively be reduced (in this case, the above-described inverted p-n junction portion is not necessarily formed between the residual substrate portion and the main compound semiconductor layer). The main electrode covering the residual substrate portion can relatively be enlarged in size, so that the current supply wire can readily be connected. The main electrode is connected with the sub-electrode in a portion covering the circumferential side faces of the residual substrate portion, so as to play a role of a current supply portion from the current supply wire to the bond-assisting alloyed layer. The damage-absorbing effect of the residual substrate portion, expected in the process of bonding of the current supply wire is as described in the above.

On the contrary, the second main surface of the residual substrate portion may have, formed thereon, the bond-assisting alloyed layer reducing the contact resistance with respect to the light-extraction-side electrode. GaAs has a small band gap energy and is excellent in the anti-oxidative property, so that it has a great advantage over other III-V compound semiconductors (such as AlGaInP composing the light emitting layer portion; GaP, AlGaAs, GaAsP or GaInP composing the current spreading layer) in readiness of forming ohmic contact with the metal electrode. Therefore by using the residual substrate portion composed of such GaAs as a region allowing therein formation of the bond-assisting alloyed layer, the contact resistance with respect to the light-extraction-side electrode of the device can effectively be reduced, and consequently the forward voltage of the device can be lowered.

Next, in the light emitting device of the third embodiment, a transparent thick semiconductor layer of 10 µm thick or more, composed of a III-V compound semiconductor having a band gap energy larger than photon energy corresponded to the peak wavelength of emission beam from the light emitting layer portion, may be formed on the first main surface side of the light emitting layer portion. Provision of such transparent thick semiconductor layer is successful in more uniformly supplying the emission drive current to the thin light emitting layer portion in the in-plane direction, and in increasing the extractable beam from side faces of the transparent thick semiconductor layer, and thereby in improving the light extraction efficiency on the whole device basis. The transparent thick semiconductor layer also raises the reinforcing effect for the device as a whole, and thereby facilitates handling in fabrication of the device. In a configuration wherein the light emitting device is bonded on the transparent thick semiconductor layer side onto the metal stage using the metal paste layer, the metal paste layer may cause collapse deformation in the process of bonding, and may creep up onto the circumferential side faces of the main compound semiconductor layer. If the metal paste thus crept up should reach the side faces of the p-n junction portion of the light emitting layer portion, nonconformities such as short-circuiting of the p-n junction portion may occur. However, by providing the transparent thick semiconductor layer on the bonding side, as being ensured to as thick as 40 µm thick or more (and typically 200 µm thick or less, although not restricted to this upper limit value) as described in the above, the metal paste even if crept up shows only a small probability of reaching the p-n junction portion, so that the nonconformities such as short-circuiting described in the above is effectively avoidable.

The main compound semiconductor layer can be configured as being disposed between the residual substrate portion and the light emitting layer portion, and as having an auxiliary current spreading layer composed of a compound semiconductor layer thinner than the transparent thick semiconductor layer. This configuration can successfully raise the current spreading effect towards the bottom surface portion of the cut-off portion, and can increase the current distributed to the region corresponded to the cut-off portion of the light emitting layer portion (that is, the main light extraction surface), so that the emission beam extractable from the bottom surface of the cut-off portion can further be increased. For the case where the current supply wire is bonded to the light-extraction-side electrode, the auxiliary current spreading layer can function, together with the above-described residual substrate portion, as a cushion layer preventing influences of the bonding-induced damage from exerting on the light emitting layer portion.

The thickness of the auxiliary current spreading layer provided on the second main surface side of the light emitting layer portion is small in the above-described configuration, so that the current spreading effect becomes smaller than that of the transparent thick semiconductor layer. In order to compensate the effect, it is effective to configure the light-extraction-side electrode so as to have a main electrode covering the second main surface and the circumferential side faces of the residual substrate portion, and a linear sub-electrode covering a partial region of the second main surface of the auxiliary current spreading layer composing the bottom surface of the cut-off portion, and extending out from the outer periphery of the main electrode. Provision of such sub-electrode can successfully moderates biasing in the current distribution in the main light extraction surface under application of the drive voltage, and can more uniformly apply the voltage over the entire range of the main light extraction surface, so that the current spreading effect can be enhanced. If the residual substrate portion located straight under the main electrode is allowed to function as the current blocking layer, current directed towards the region straight under the main electrode can be blocked, and the amount of distribution of current directed towards the background region of the main electrode composing the main light extraction surface can be increased, so that the light extraction efficiency can be enhanced. In this case, electric conduction between the main electrode and the sub-electrode can be made more complete, by forming the circumferential side faces of the residual substrate portion as inclined surfaces, so as to make the area of the second main surface of the residual substrate portion smaller than the area of the first main surface, and by configuring the main electrode and the sub-electrode, together composing the light-extraction-side electrode, as an integrated metal film.

For the case where the light emitting layer portion has a double heterostructure having a first-conductivity-type cladding layer, an active layer and a second-conductivity-type cladding layer stacked in this order as viewed from the side closer to the residual substrate portion, and the above-described transparent thick semiconductor layer is provided on the light emitting layer portion, the electrode-forming cut-off portion may be formed by cutting off the main compound semiconductor layer, over a range from the second main surface to at least the first main surface of the active layer, in a partial region of the second main surface, and a different-polarity electrode (an electrode on the side having a polarity different from that of the light-extraction-side electrode) may be formed on the bottom surface of the electrode-forming cut-off portion (also referred to as "one-side electrode draw-out structure", hereinafter). This configuration might be disadvantageous in that a part of the main compound semiconductor layer on the second main surface side thereof is consumed as a space allowing therein formation of the different-polarity electrode, but raises an advantage of allowing formation of the electrode for emission operation on the same main surface side.

For example, blue light emitting device composed of a Group III element nitride uses a sapphire substrate for epitaxial growth of the Group III element nitride, and is often obtained in a device form leaving the sapphire substrate unremoved under the light emitting layer portion, because the sapphire substrate is an insulator, and is not readily removed by etching or the like. In this case, it is indispensable to provide an electro-conductive electrode draw-out layer between the light emitting layer portion and the sapphire substrate, to cut off a part of the light emitting layer portion so as to expose the electrode draw-out layer, and to form thereon the different-polarity electrode. For the case where it is desired to configure an integrated light emission module by combining the light emitting device of the third embodiment with a light emitting device which inevitably has the one-side electrode draw-out structure in view of circumferences of the fabrication process, by daringly adopting the one-side electrode draw-out structure to the light emitting device of the third embodiment, the electrodes on the grounding side of these different light emitting devices, which are either of the light-extraction-side electrodes and the different-polarity electrodes, can commonly be connected, raising an advantage of simplifying the assembly process such as wire bonding. For the case where three or more of this sort of light emitting device are combined to obtain a module, such as RGB full-color light emitting device module, potential of the electrodes on the grounding side of all of these devices are identical, so that a possible configuration is such as sequentially connecting these electrodes, and so that only the electrode located at the end is connected to a cathode terminal on the stage on which the device chip is adhered, contributing to reduction in area of the cathode terminal on the stage side, and consequently to downsizing of the module.

In the light emitting device of the third embodiment, the substrate having the light emitting layer portion coupled therewith is not an insulating substrate but a conductive transparent thick semiconductor layer, so that the substrate can conveniently be used as an electrode draw-out layer. Because the transparent thick semiconductor layer has a large thickness (10 µm or more), it is easier for the layer to reduce the sheet resistance as compared with the thin epitaxial layer such as the electrode draw-out layer of a Group III nitride-base light emitting device using a sapphire substrate, and is less likely to cause increase in the forward voltage of the device. For an exemplary case where the metal stage is used for bonding the device chip, the light emitting layer portion formed on the sapphire substrate is electrically isolated from the stage by the sapphire substrate, so that nonconformities could occur such as increasing in floating capacitance of the device, the effective emission drive voltage may be lowered due to charge accumulation in the light emitting layer portion, and the service life may degrade due to spark or the like. In contrast, by configuring the portion corresponded to the sub-strate using the electro-conductive transparent thick semiconductor layer as described in the above, the transparent thick semiconductor layer can function as a discharging path of static electricity, so that the charge accumulation in the light emitting layer portion can be moderated to a considerable degree, and thereby the above-described nonconformity can be resolved. This case is also advantageous in that, even when a part of a plurality of interconnected light emitting devices are configured as the devices-on-insulating-substrate as described in the above, static electricity accumulated in the devices-on-insulating-substrate can be discharged, if a part of the residual devices are configured as the light emitting devices of the third embodiment, through the transparent thick semiconductor layers of such devices of the third embodiment.

Fourth Embodiment

The light emitting device of the fourth embodiment of this invention is characterized as being configured by epitaxially growing the main compound semiconductor layer, having therein the light emitting layer portion, on the first main surface of the sub-substrate portion; forming the cut-off portion in a part of the residual substrate portion; forming a first electrode portion, through which emission drive voltage is applied to the light emitting layer portion, so as to cover the second main surface of the residual substrate portion;

the light emitting layer portion has a double heterostructure in which a first-conductivity-type cladding layer, an active layer and a second-conductivity-type cladding layer are stacked in this order as viewed from the side more closer to the residual substrate portion; a transparent semiconductor layer composed of a III-V compound semiconductor having a band gap energy larger than photon energy corresponded to the peak wavelength of emission beam from the light emitting layer portion is formed on the first main surface side of the light emitting layer portion; and, an electrode-forming cut-off portion is formed by cutting off the main compound semiconductor layer in a partial region of the second main surface thereof, over a range from the second main surface side to at least a first main surface of the active layer; the electrode-forming cut-off portion has, disposed on the bottom surface thereof, a second electrode portion differed in polarity from the first electrode portion; and the first main surface of the transparent semiconductor layer serves as the main light extraction surface.

This configuration corresponds to an upside-down inversion of the light emitting device of the third embodiment adopting the one-side electrode draw-out structure, having no electrode formed on the first main surface side of the transparent semiconductor layer, and configured as extracting the emission beam mainly from the first main surface side. In the one-side electrode draw-out structure, the electrode-forming space is limitative due to necessity of forming two electrodes on the same surface side. In the fourth embodiment of this invention, the first electrode out of them is formed on the second main surface of the residual substrate portion. GaAs has a small band gap energy and is excellent in the anti-oxidative property, so that it has a great advantage over other III-V compound semiconductors (such as AlGaInP composing the light emitting layer portion; GaP, AlGaAs, GaAsP or GaInP composing the current spreading layer) in readiness of forming ohmic contact with the metal electrode. Therefore by using the residual substrate portion composed of such GaAs as a region allowing therein formation of the first electrode portion, the contact resistance with respect to the first electrode portion can effectively be reduced, and consequently the forward voltage of the device can be lowered. Because the first main surface of the transparent semiconductor layer having no electrode formed thereon serves as the main light extraction surface, the area of the main light extraction surface is enlarged, and thereby the light extraction efficiency improves to a large degree. Because the all electrodes are formed on the second main surface side of the main compound semiconductor layer, a configuration having device chips surface-mounted on the substrate is readily obtained, contributing to simplification of assembly processes of the device chip.

BEST MODES FOR CARRYING OUT THE INVENTION

First Embodiment

A mode of carrying out the first embodiment of this invention will be described below referring to the attached drawings.

Figure 1:
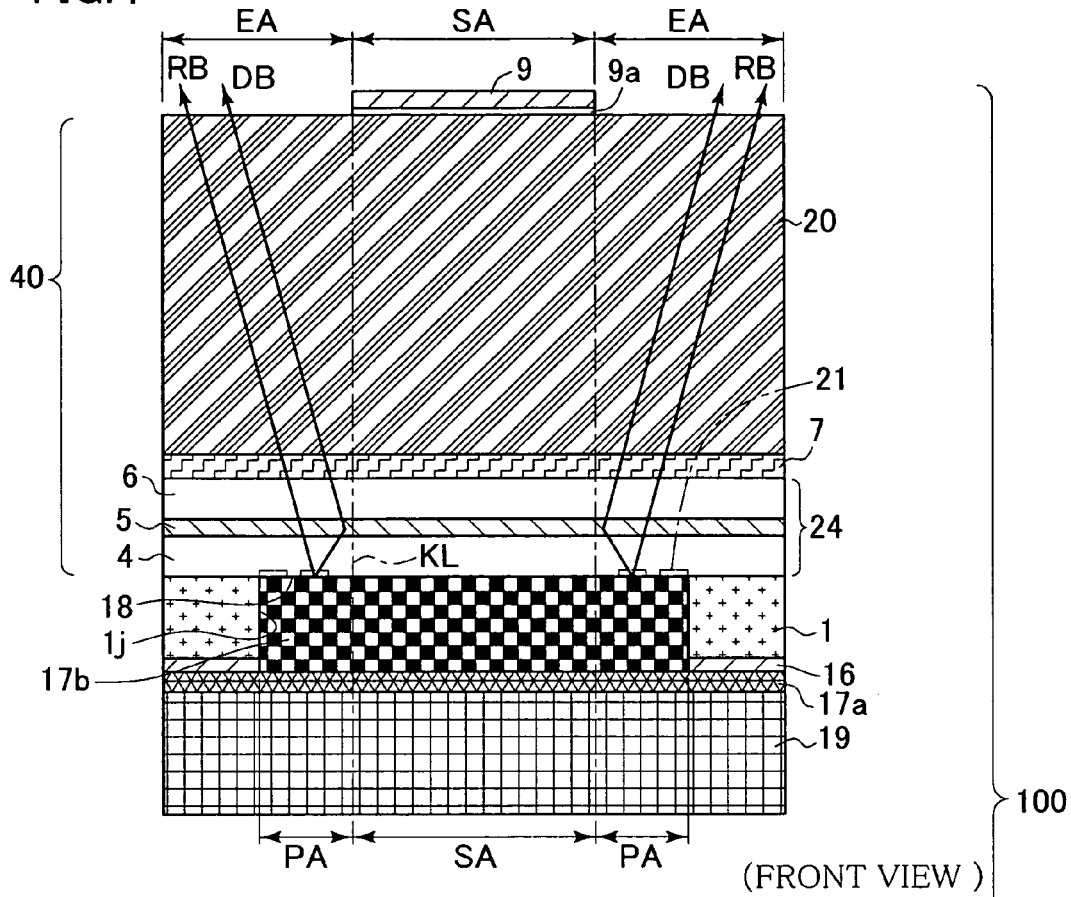
FIG. 1 is a schematic sectional view showing a first mode of the light emitting device according to the first embodiment of this invention.
Figure 1:
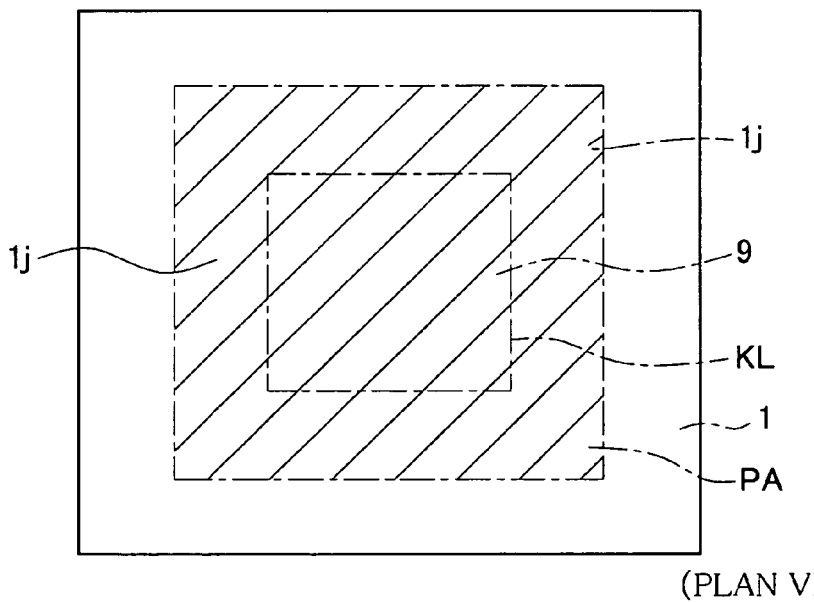

FIG. 1 is a schematic drawing of a light emitting device 100 as one example of the first embodiment. The light emitting device 100 has a main compound semiconductor layer 40 having therein a light emitting layer portion 24, formed on a first main surface of a residual substrate portion 1. A main light extraction surface EA is formed on the first main surface side of the main compound semiconductor layer 40, and a light-extraction-side electrode 9, through which emission drive voltage is applied to a light emitting layer portion 24, is formed so as to cover a part of the first main surface of the main compound semiconductor layer 40. An opening 1j, as the cut-off portion opened on the second main surface of the residual substrate portion 1, is formed by partially cutting off the residual substrate portion 1, wherein a part of the residual substrate portion 1 left around the periphery of the opening 1j imparts rigidity to the light emitting layer portion 24. A reflective component 17b reflecting the emission beam from the light emitting layer portion 24 is provided in the opening 1j, allowing reflected beam RB to be overlaid with a direct beam DB from the light emitting layer portion 24, and extracted through the main light extraction surface EA.

The light emitting layer portion 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between a second-conductivity-type cladding layer, which is a p-type cladding layer 6 in this embodiment composed of a p-type $(Al_zGa_{1-z})_yIn_{1-y}P$ alloy (where, $x<z \leq 1$), and a first-conductivity-type cladding layer different from the second-conductivity-type cladding layer, which is an n-type cladding layer 4 in this embodiment composed of an n-type $(Al_zGa_{1-z})_yIn_{1-y}P$ alloy (where, $x<z \leq 1$), allowing adjustment of the emission wavelength from green to red region (emission wavelength (peak emission wavelength) of 550 nm to 670 nm, both ends inclusive) depending on composition of the active layer 5. The light emitting device 100 has the p-type AlGaInP cladding layer 6 disposed on the light-extraction-side electrode 9 side, and the n-type AlGaInP cladding layer 4 disposed on the residual substrate portion 1 side. The light-extraction-side electrode 9 therefore has a positive polarity in current supply. It is to be noted that "non-doped" in the context herein means "not intentionally added with a dopant", and never excludes possibility of any dopant components inevitably included in the normal fabrication process (up to $1 \times 10^{13}$ to $1 \times 10^{16}/cm^3$ or around, for example). The residual substrate portion 1 is composed of a GaAs single crystal.

In the main compound semiconductor layer 40, a current spreading layer 20 composed of GaP (GaAsP or AlGaAs also allowable) is formed on the first main surface of the light emitting layer portion 24, and the above-described, light-extraction-side electrode 9 (Au electrode, for example) is formed approximately at the center on the first main surface of the current spreading layer 20. The current spreading layer 20 is raised in the effective carrier concentration (that is, p-type dopant concentration) to a degree as enough as establishing an ohmic contact with the light-extraction-side electrode 9 while placing a bond-assisting alloyed layer 9a in between (typically equal to or more than the concentration of the p-type cladding layer 6 and not larger than $2 \times 10^{18}/cm^3$). The region of the first main surface of the current spreading layer 20, and around the light-extraction-side electrode 9, composes the main light extraction surface EA. The current spreading layer 20 also plays a role of increasing the flux extractable from the side faces of the layer, and enhancing the luminance of the device as a whole (integrating sphere luminance), if it is formed to be as thick as 10 μm to 200 μm, both ends inclusive (preferably 40 μm to 100 μm, both ends inclusive). The current spreading layer 20 is also suppressed in absorption of emission beam, because it is configured by using a III-V compound semiconductor having a band gap energy larger than a photon energy which corresponds to a peak wavelength of the emission beam from the light emitting layer portion 24. Between the light-extraction-side electrode 9 and the current spreading layer 20, a bond-assisting alloyed layer 9a reducing the contact resistance between the both is formed typically using a AuBe alloy. On the other hand, on the residual substrate side 1, the opening 1j is formed so as to penetrate the residual substrate portion 1 in the thickness-wise direction thereof, so that the second main surface of the main compound semiconductor layer 40, which is herein the second main surface of the light emitting layer portion 24 (n-type cladding layer 4) is exposed in the opening 1j.

The opening 1j is formed so as to overlap a straight-under region SA of the light-extraction-side electrode 9. In this embodiment, the straight-under region SA of the light-extraction-side electrode 9 is included within the opening 1j, so that the entire portion of the straight-under region SA overlap the region of the opening 1j. In the straight-under region SA, the contact resistance between the main compound semiconductor layer 40 and the reflective component 17b is set higher than the contact resistance between the main compound semiconductor layer 40 and the residual substrate portion 1.

In this embodiment, the reflective component 17b is configured as a metal reflective component (also referred to as metal reflective component 17b, hereinafter). In the straight-under region SA of the light-extraction-side electrode 9, the metal reflective component 17b is disposed so as to directly contact with the compound semiconductor portion (the n-type cladding layer 4 of the light emitting layer portion 24, herein) composing the bottom surface of the opening 1j, without placing a bond-assisting alloyed layer 21 in between. Exclusion of the bond-assisting alloyed layer 21 from the straight-under region SA of the light-extraction-side electrode 9 successfully raises the contact resistance between the main compound semiconductor layer 40 and the reflective component 17b. In FIG. 1, the reflective component 17b is a metal paste layer (also referred to as metal paste layer 17b, hereinafter) filled in the opening 1j. The second main surface of the residual substrate portion 1 is covered with a heat-radiating metal component 19 (Cu plate or Al plate, for example) together with the second main surface of the metal paste layer 17b filling the opening 1j. The metal paste layer 17b is used both as a binder layer binding the heat-radiating metal component 19 to the light emitting layer portion 24 (main compound semiconductor layer 40), and as a reflective component, and is formed by coating, and then drying, a metal paste having a metal powder such as Ag powder dispersed in a vehicle composed of a binder resin and a solvent.

On the peripheral portion of the metal paste layer 17b, a conductive path paste layer (composed of a metal paste) 17a is formed so as to cover the second main surface of the residual substrate portion 1, as being integrated therewith. On the second main surface of the residual substrate portion 1, a bond-assisting alloyed layer 16 reducing the contact resistance with the conductive path paste layer 17a is formed. The bond-assisting alloyed layer 16 is mainly composed of Au or Ag (50% by mass or more), and is obtained by forming a metal layer compounded with an appropriate amount of an alloying component aimed at establishing ohmic contact, depending on species and conduction type of the semiconductor to be contacted with, on the semiconductor surface, and then by annealing (so-called sintering) them. In this embodiment, the bond-assisting alloyed layer 16 using an AuGeNi alloy (for example, Ge: 15% by mass, Ni: 10% by mass, and the balance of Au) is formed on the residual substrate portion 1 composed of n-type GaAs.

Figure 5:
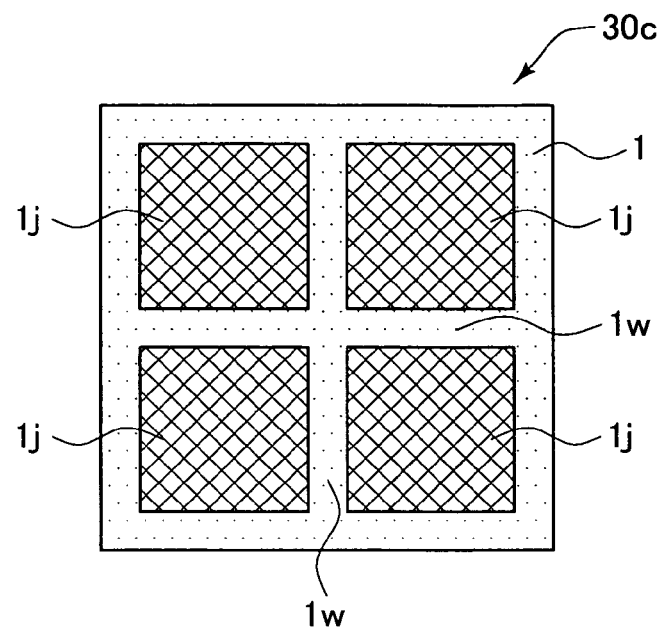
FIG. 5 is a schematic drawing showing a first mode of formation of the auxiliary residual substrate portion.
Figure 6:
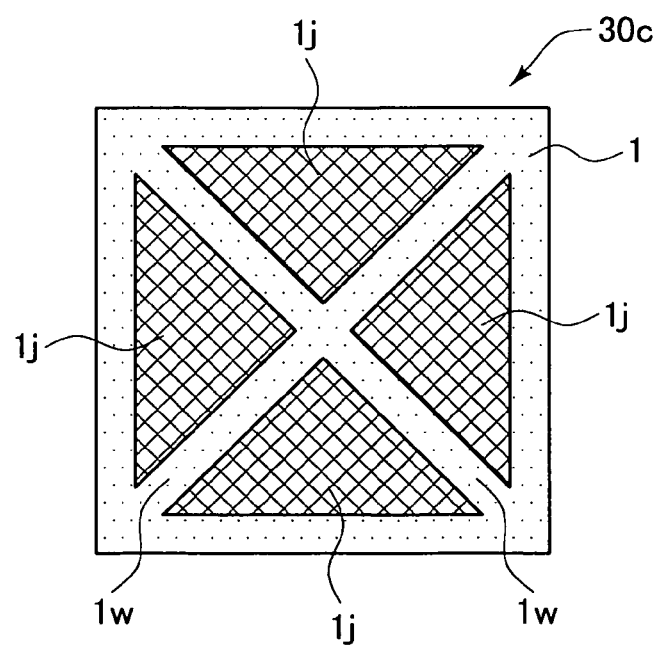
FIG. 6 is a schematic drawing showing a second mode of formation of the auxiliary residual substrate portion.

In this embodiment, the opening 1j has an overlap PA (simply referred to as "straight-under region PA", hereinafter) with the straight-under region of the main light extraction surface EA, and the metal reflective component (metal paste layer) 17b is formed in the opening 1j so as to overlap the straight-under region PA of the main light extraction surface EA. As described in the above, the current spreading layer 20 is provided between the light emitting layer portion 24 and the light-extraction-side electrode 9, and the main light extraction surface EA is formed so as to surround the light-extraction-side electrode 9 along the periphery of the first main surface of the current spreading layer 20. The residual substrate portion 1 composing the conduction path to the light emitting layer portion 24 is formed with a frame-like geometry around the periphery of the second main surface of the main compound semiconductor layer 40 having therein the light emitting layer portion 24, and the opening 1j is formed in the frame-like residual substrate portion 1. Position of formation and size of region of the light-extraction-side electrode 9 and the opening 1j are determined so that the projected contour line KL of the light-extraction-side electrode 9 onto the second main surface of the main compound semiconductor layer 40 falls within the frame-like residual substrate portion 1. In the opening 1j, the region PA located between the inner periphery of the frame-like residual substrate portion 1 and the projected contour line KL of the light-extraction-side electrode 9 is covered with the metal reflective component (metal paste layer) 17b. As shown in FIG. 5 and FIG. 6, an auxiliary residual substrate portion 1w may be formed inside the opening 1j, aiming at further reinforcing the frame-like residual substrate portion 1. In this embodiment, the auxiliary residual substrate portion 1w is formed straight-forward so as to partition the opening 1j into a plurality of regions. FIG. 5 shows an exemplary case where the auxiliary residual substrate portion 1w was formed with a cross-like pattern connecting opposing edges of the residual substrate portion 1, and FIG. 6 shows an exemplary case with an X-pattern connecting the opposing angles of the residual substrate portion 1.

In the opening 1j, the bond-assisting alloyed layer may completely be excluded, or the bond-assisting alloyed layer 21 is formed in a distributed manner in the straight-under region PA of the main light extraction surface EA (composed of the same material with the bond-assisting alloyed layer 16). In this case, in the straight-under region PA of the main light extraction surface EA, the metal reflective component 17b is brought into contact with the main compound semiconductor portion 40 composing the bottom surface of the opening 1j while placing the bond-assisting alloyed layer 21 in between, so that the light emitting layer portion 24 can be illuminated by current supply through the metal reflective component 17b, in the straight-under region PA of the main light extraction surface EA. On the other hand, bond-assisting alloyed layer 16 formed on the second main surface of the residual substrate portion 1 is less contributive to light reflection, so that it is formed so as to cover the entire surface of the second main surface of the residual substrate portion 1, placing a priority to reduction in the contact resistance with the conduction-path-forming paste layer 17a. On the other hand, for the case where the bond-assisting alloyed layer 21, having a relatively low reflectivity, is formed in the straight-under region PA of the main light extraction surface EA in the opening 1j, it is preferable to adjust the ratio of area of forming the bond-assisting alloyed layer 21 to the total area of the region PA to 1% to 25%, both ends inclusive, considering a balance between an effect of increasing the reflected beam in that region and an effect of reducing the contact resistance with respect to the bond-assisting alloyed layer 21.

Paragraphs below will describe a method of fabricating the light emitting device 100 shown FIG. 1.

Figure 2:
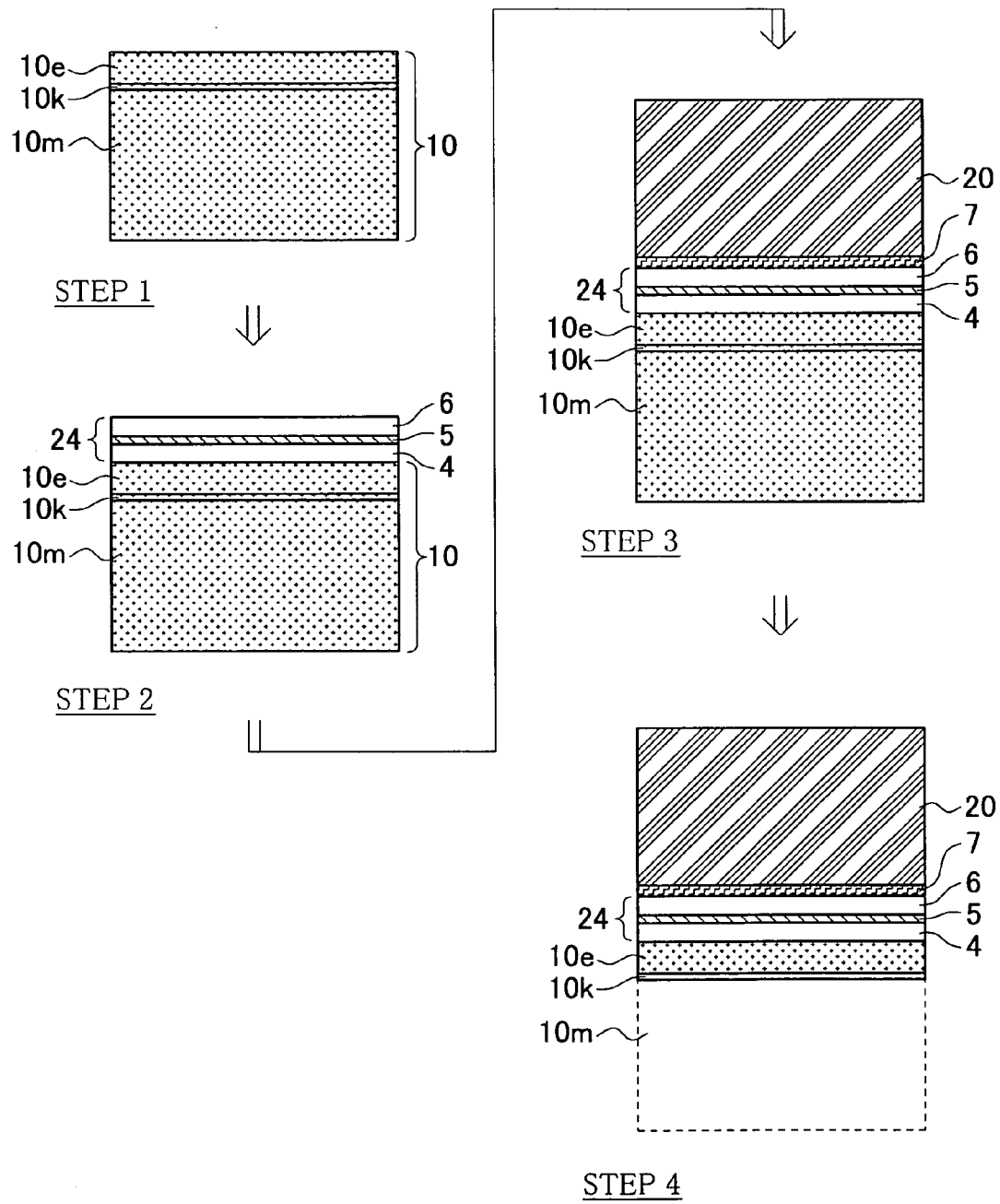
FIG. 2 is an explanatory drawing showing process steps of the method of fabricating the light emitting device shown in FIG. 1.

First, as shown in step 1 of FIG. 2, an unillustrated buffer layer composed of GaAs is epitaxially grown on the first main surface of a substrate bulk 10m composed of an n-type GaAs single crystal, an etching stopper layer 10k (typically composed of AlInP) as the separation-assisting compound semiconductor layer is then epitaxially grown, and further on the etching stopper layer 10k, a sub-substrate portion 10e composed of an n-type GaAs single crystal is epitaxially grown, to thereby obtain a composite growth-assisting substrate 10 allowing the light emitting layer portion 24 to grow thereon. The sub-substrate portion 10e is grown by the MOVPE process or the HVPE process. Next, as shown in step 2, the n-type AlGaInP cladding layer 4, the AlGaInP active layer (non-doped) 5, and the p-type AlGaInP cladding layer 6 are epitaxially grown in this order as the light emitting layer portion 24 by the publicly-known MOVPE process, so as to contact with the first main surface of the sub-substrate portion 10e of the composite growth-assisting substrate 10, without forming a buffer layer in between. The process then advances to step 3, wherein the current spreading layer 20 (thickness: 10 μm to 200 μm, both ends inclusive (typically 100 μm)) is epitaxially grown, typically by the hydride vapor phase epitaxial growth process or the MOVPE process. In particular, the current spreading layer 20 composed of GaP or GaAsP is advantageous in that a better quality one can readily be grown at a high growth rate by the HVPE process.

The process then advances to step 4, wherein the sub-substrate portion 10e is separated from the composite growth-assisting substrate 10, so as to convert it to the residual substrate portion 1 on the second main surface of the main compound semiconductor layer 40. In this embodiment, the process step is carried out using a first etching solution (ammonia/hydrogen peroxide mixed solution, for example), having an etching selectivity preferring GaAs, is used for removing the substrate bulk 10m. The process then advances to step 5 in FIG. 3, wherein the AlInP etching stopper layer 10k is removed using a second etching solution (hydrochloric acid, for example: addition of hydrofluoric acid is also allowable for removing Al oxide layer), having an etching selectivity preferring AlInP. It is also allowable to adopt a step of forming the separation layer 10k, typically composed of AlAs, as the separation-assisting compound semiconductor layer, in place of the etching stopper layer 10k, and selectively etching the separation layer 10k by dipping into an etching solution typically composed of an aqueous 10% hydrofluoric acid solution, so as to separate the sub-substrate portion 10e from the composite growth-assisting substrate 10 to thereby obtain the residual substrate portion 1.

The process then advances to step 6, wherein a contact-assisting metal layer 16' composed of an AuGeNi alloy is formed with a frame-like pattern along the periphery of the residual substrate portion 1. The light-extraction-side electrode 9 is formed on the first main surface of the current spreading layer 20. The contact-assisting metal layer 16' also functions as an etching mask for forming the opening 1j, and is formed by vacuum evaporation or sputtering, with the aid of a known photolithographic technique. It is, however, also allowable to cover the surface of the contact-assisting metal layer 16' with an etching-resistive layer composed of a photosensitive resin. Next, as shown in step 7, the opening 1j is formed by etching a portion of the residual substrate portion 1 composed of GaAs exposed inside the contact-assisting metal layer 16'. The residual substrate portion 1 is now made with a frame-like pattern by forming the opening 1j, and the light emitting layer portion 24 consequently has an exposed surface 18 formed in the opening 1j. Annealing for alloying is then carried in the temperature range from 350° C. to 500° C., both ends inclusive, so as to alloy the contact-assisting metal layer 16' with the residual substrate portion 1 to thereby obtain the bond-assisting alloyed layer 16, to thereby obtain a light emitting device chip 30c.

Inside the opening 1j (on the exposed surface 18 generated in step 7), the bond-assisting alloyed layer 21 is not formed in the straight-under region SA of the light-extraction-side electrode 9 (see also FIG. 1). In the region PA which falls between the region straight above the frame-like residual substrate portion 1 and the straight-under region SA of the light-extraction-side electrode 9, the bond-assisting alloyed layer 21 may be formed typically with a scattered-dot pattern, as shown in FIG. 1.

Figure 3:
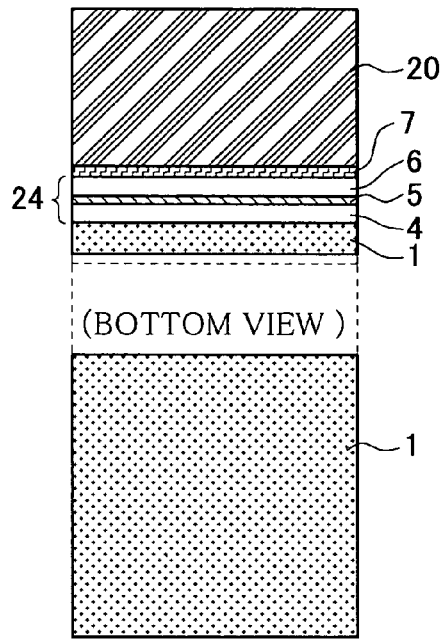
FIG. 3 is an explanatory drawing showing process steps as continued from FIG. 2.
Figure 3:
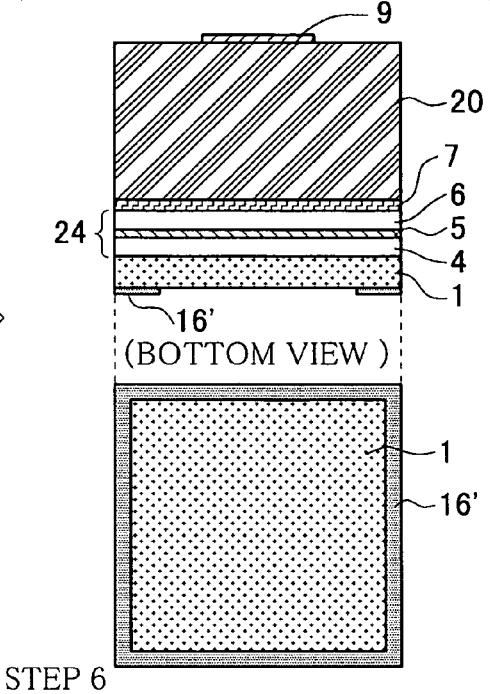
Figure 3:
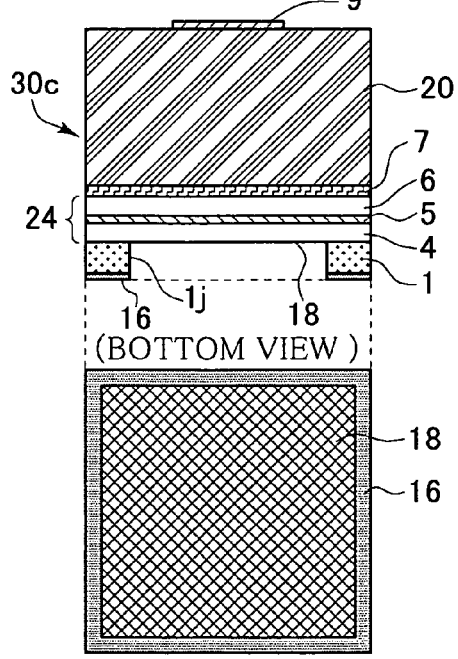
Figure 3:
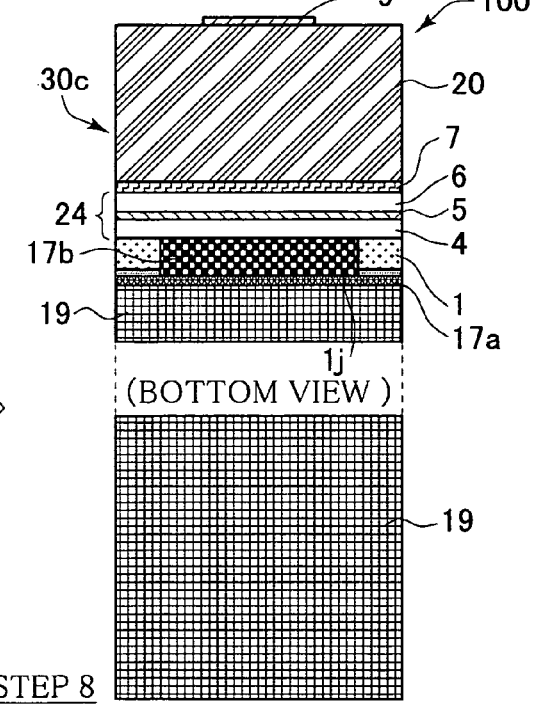
Figure 4:
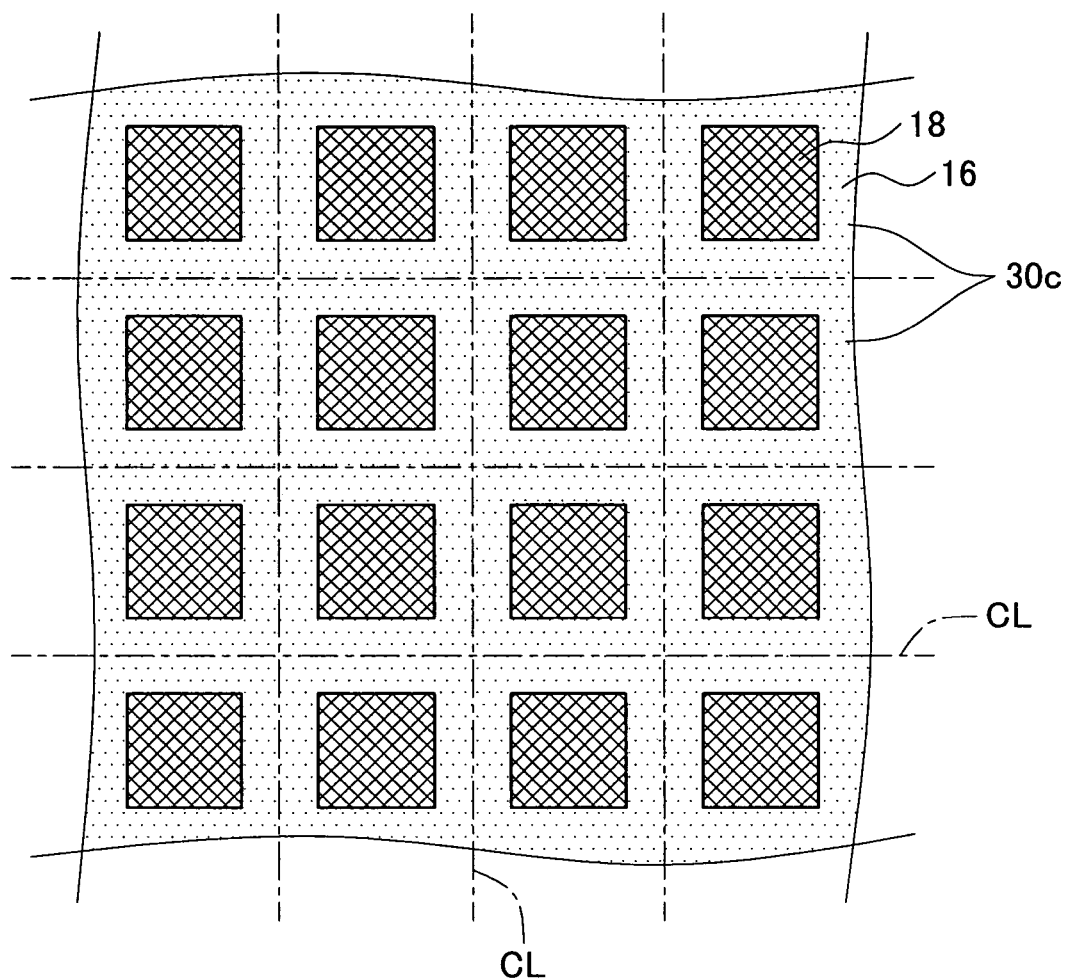
FIG. 4 is a schematic drawing showing an exemplary setting of cutting lines of the light emitting device chips.

On the composite growth-assisting substrate 10 shown in FIG. 2, a plurality of light emitting device chips 30c each having such opening 1j are collectively formed as being arranged based on a matrix pattern as shown in FIG. 4. The residual substrate portion 1 herein is an integration of the substrates of every adjacent light emitting device chips 30c, so that dicing along the center line CL set at every center position in the across-the-width direction of intervals results in separation of the individual light emitting device chips 30c. The separated light emitting device chip 30c has, on the second main surface side thereof, the metal paste coated so as to fill the opening 1j and to cover the second main surface of the residual substrate portion 1 as shown in FIG. 1, and thereby the metal paste layer 17b and conduction-path-forming paste layer 17a are formed at a time. Then as shown in step 8 of FIG. 3, the heat-radiating metal component 19 is bonded while placing these metal paste layer 17b and the conduction-path-forming paste layer 17a thereunder, to thereby obtain the light emitting device 100 shown in FIG. 1.

The composite growth-assisting substrate 10 of the light emitting device 100 has an essential portion thereof composed of GaAs which is a light-absorbing compound semiconductor, and is not totally removed after the light emitting layer portion is grown, but is designed to leave only the sub-substrate portion 10e as the residual substrate portion 1, wherein the opening 1j is formed so as to cut off the portion thereof, and the opening 1j is filled with the metal paste layer 17b composing the reflective component. The residual substrate portion 1 remained around the periphery of the opening 1j functions as imparting rigidity to the light emitting layer portion 24. It is therefore no more necessary to bond any other electro-conductive substrate such as a silicon substrate for the purpose of reinforcement, on the second main surface side of the light emitting layer portion 24, unlike the techniques described in Japanese Laid-Open Patent Publication "Tokkai" No. 2001-339100 and Nikkei Electronics Oct. 21, 2002, p. 124-132.

In this embodiment, the main light extraction surface EA is formed so as to surround the light extraction side electrode 9, and the residual substrate portion 1 is formed with a frame-like pattern corresponded to the main light extraction surface EA, so that it is made possible to concentrate current into the region straight under the main light extraction surface EA surrounding the light-extraction-side electrode 9, and to allow the light emitting layer portion 24 to illuminate predominantly in the region advantageous for the light extraction. The region PA of a predetermined width formed between the light-extraction-side electrode 9 and the residual substrate portion 1 is faced to the metal paste layer 17b, and presence of the region EA can, therefore, effectively prevent the reflected beam RB from being intercepted by the light-extraction-side electrode 9. In addition, the bond-assisting alloyed layer is excluded from the straight-under region SA of the light-extraction-side electrode 9, and thereby the contact resistance between the main compound semiconductor layer 40 and the reflective component 17b is raised, so that the light emission is suppressed in the straight-under region SA of the light-extraction-side electrode 9 where the emission beam is readily intercepted, contributing further improvement in the light extraction efficiency. The second main surface of the residual substrate portion 1 is covered with the heat-radiating metal component 19 while placing the metal paste layer 17b thereunder, so that temperature rise of the light emitting layer portion 24 under current supply can be suppressed.

Figure 9:
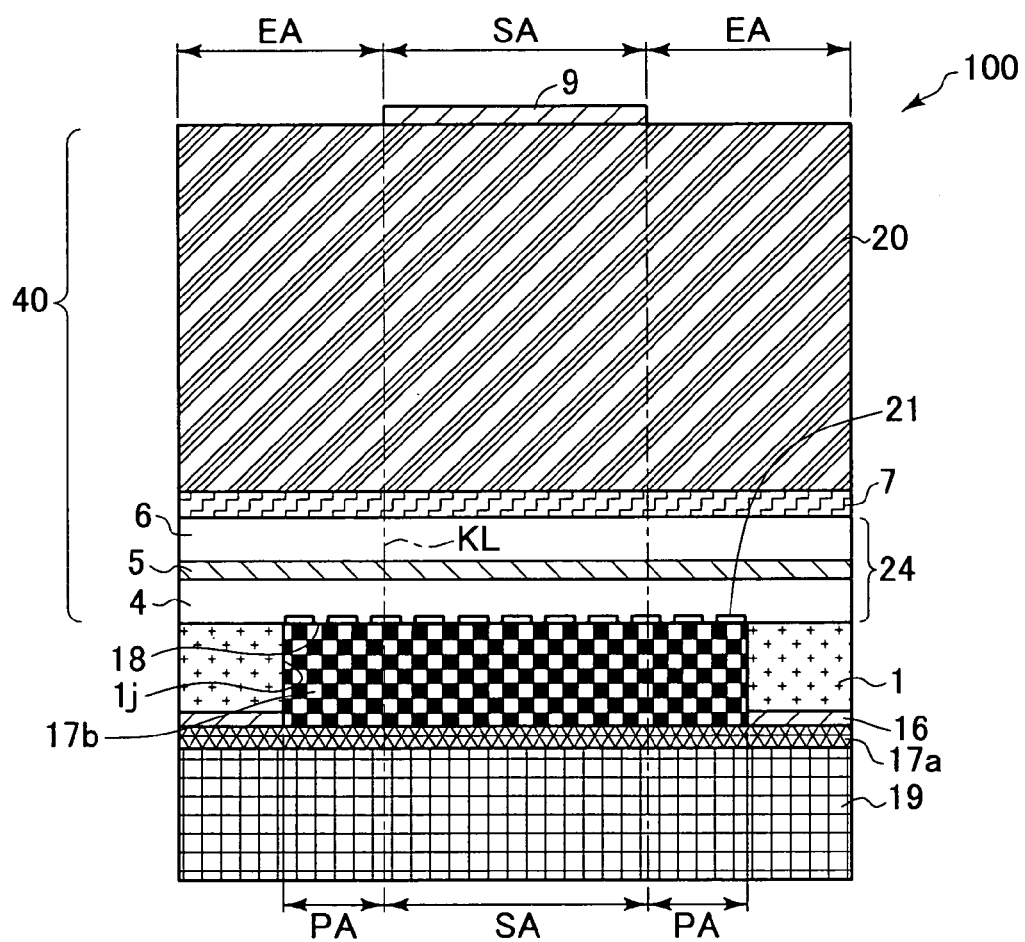
FIG. 9 is a schematic sectional view showing a fourth mode of the light emitting device according to the first embodiment of this invention.
Figure 10:
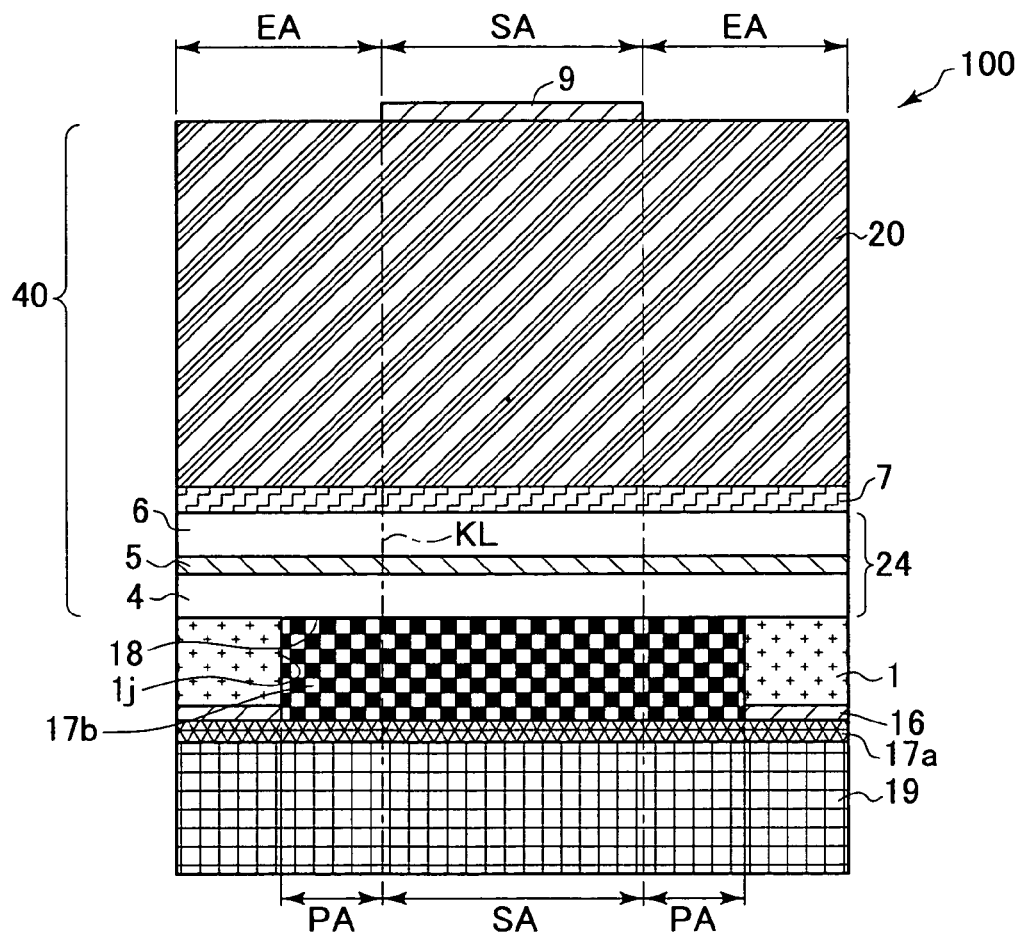
FIG. 10 is a schematic sectional view showing a fifth mode of the light emitting device according to the first embodiment of this invention.

Paragraphs below will explain a modified example of the light emitting device of the first embodiment (any elements common to those in the light emitting device shown in FIG. 1 will be given with the same reference numerals, while omitting detailed explanation). FIG. 9 shows an exemplary case where the bond-assisting alloyed layer 21 is disposed also in the straight-under region SA of the light-extraction-side electrode 9. The emission beam straight under the light-extraction-side electrode 9 is partially intercepted by the light-extraction-side electrode 9, whereas the case where the beam reflected on the reflective component (metal paste layer 17b), which resides in the straight-under region SA, can be extracted in largely-inclined directions (for example, the case having the current spreading layer 20 formed to be thick at some extent) may sometimes be successful in raising the light extraction efficiency on the whole device basis. On the other hand, another possible configuration is such as having absolutely no bond-assisting alloyed layer in the region within the opening 1j, as shown in FIG. 10. In this case, the region of the residual substrate portion 1 mainly composes the current path, wherein generation of roundabout current coming into the residual substrate portion 1 of the light emitting layer portion 24, that is, into the region of the opening 1j (in particular, into the straight-under region PA of the main light extraction surface EA) is expectable, if the current spreading layer 20 is thick to a certain degree. Because the surface of bond-assisting alloyed layer is slightly lower in the reflectivity, exclusion of the bond-assisting alloyed layer from the straight-under region PA of the main light extraction surface EA as shown in FIG. 10 may further raise the reflection efficiency in that region, and may improve the light extraction efficiency on the whole device basis.

Figure 7:
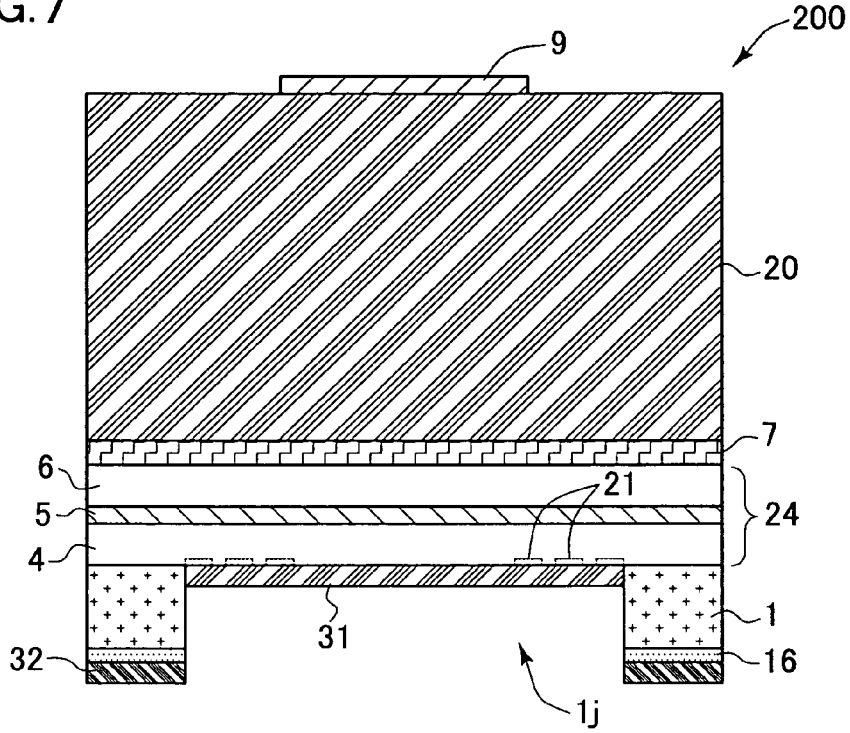
FIG. 7 is a schematic sectional view showing a second mode of the light emitting device according to the first embodiment of this invention.
Figure 8:
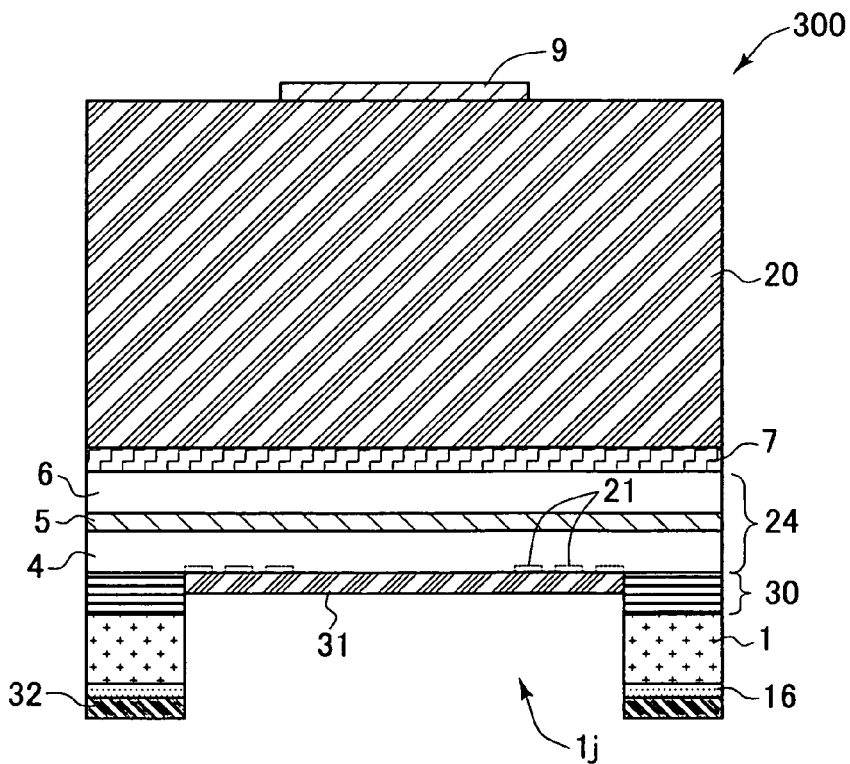
FIG. 8 is a schematic sectional view showing a third mode of the light emitting device according to the first embodiment of this invention.

Next in a light emitting device 200 shown in FIG. 7, the reflective component is configured by a reflective metal layer 31 (mainly composed of any of Au, Ag and Al, for example) formed on the compound semiconductor portion composing the bottom surface of the opening 1j, that is, on the light emitting layer portion 24 (n-type cladding layer 4) herein. The second main surface side of the residual substrate portion 1 is covered with a back electrode 32 while placing the bond-assisting alloyed layer 16, wherein the back electrode 32 and the reflective metal layer 31 can be composed of the same material (Au, for example), raising an advantage that the back electrode 32 and the reflective metal layer 31 can be formed at a time. On the other hand, a light emitting device 300 shown in FIG. 8 has a DBR layer 30 reflecting light making use of Bragg reflection, as being provided between the light emitting layer portion 24 and the residual substrate portion 1, by stacking a plurality of semiconductor films differing in the refractive index (configured similarly to as shown in FIG. 7, except that the DBR layer 30 is provided). The DBR layer 30 can epitaxially be grown on the residual substrate portion 1. The DBR layer 30 in FIG. 8 is selectively formed only in the region of the residual substrate portion 1, but may be formed as extending over the bottom surface portion of the opening 1j.

Second Embodiment

Mode A

Figure 11:
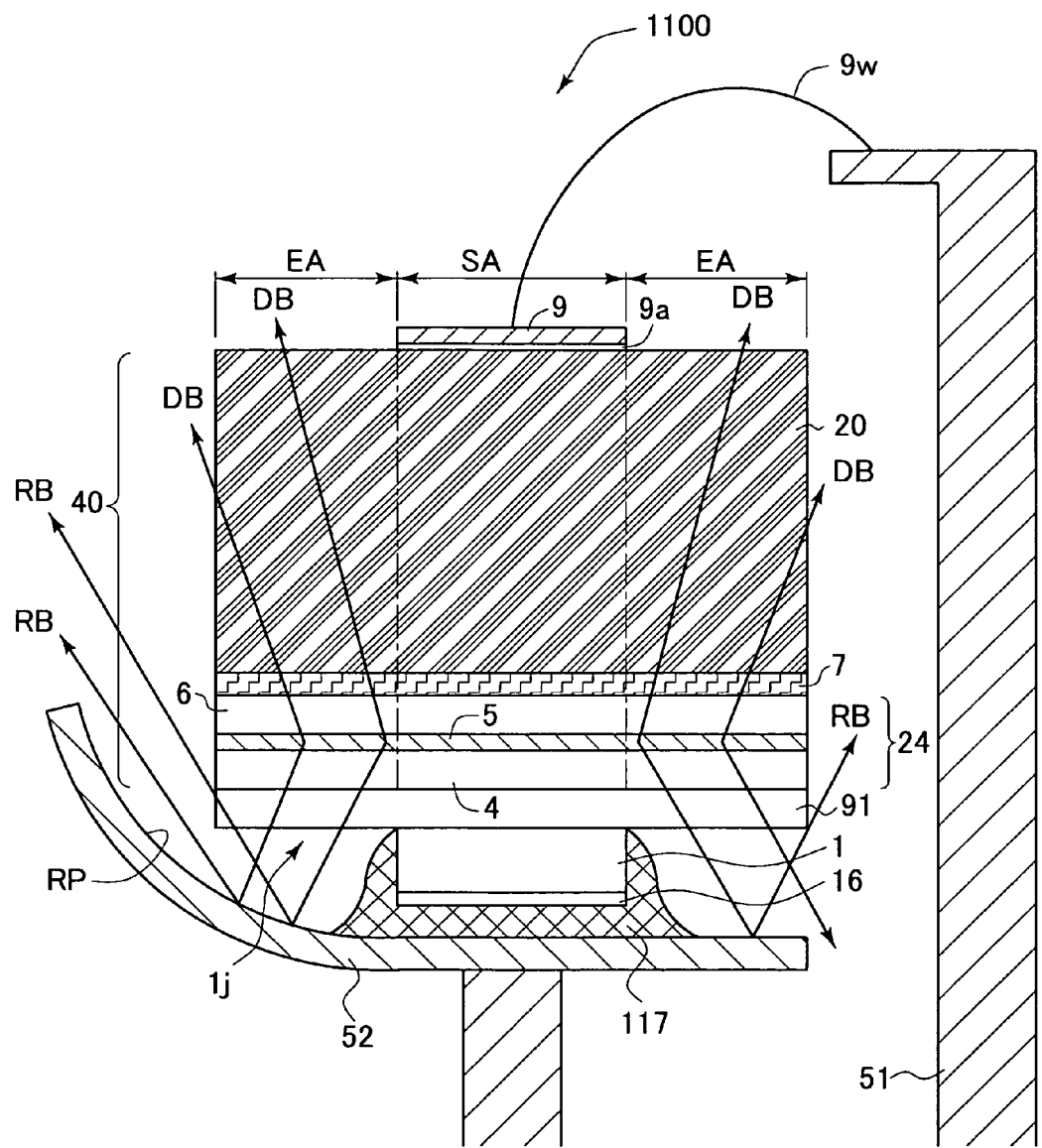
FIG. 11 is a schematic sectional view showing a light emitting device according to mode "A" of the second embodiment.

FIG. 11 schematically shows a light emitting device 1100 as an example of the second embodiment of this invention. There are many aspects common to those in the light emitting device 100 shown in FIG. 1, so that paragraphs below will explain only differences reside therein. That is, the aspects other than those described below are configured similarly to as in the light emitting device 100 shown in FIG. 1, so that the explanation of the first embodiment will be applied herein, rather than repeating the detailed explanations. Common elements are given with common reference numerals. The light emitting device 1100 has the main compound semiconductor layer 40, having therein the light emitting layer portion 24, epitaxially grown on the first main surface of the sub-substrate 10e (see FIG. 12). The main light extraction surface EA is formed on the first main surface side of the main compound semiconductor layer 40, and the light-extraction-side electrode 9, through which the emission drive voltage is applied to the light emission layer portion 24, is formed on a part of the first main surface of the main compound semiconductor layer 40 (more specifically, the residual region of the main light extraction surface).

In the main compound semiconductor layer 40, the current spreading layer 20 similar to that described in the first embodiment is formed on the first main surface of the light emitting layer portion 24, and the above-described, light-extraction-side electrode 9 (Au electrode, for example) is formed at around the center of the first main surface of the current spreading layer 20. On the other hand, on the residual substrate portion 1 side, the cut-off portion 1j is formed in the region straight under the main light extraction surface EA so as to penetrate the residual substrate portion 1 in the thickness-wise direction thereof, and the second main surface of the main compound semiconductor layer 40, which is herein the second main surface of the auxiliary current spreading layer 91 is exposed in the cut-off portion. The residual substrate portion 1 is formed in the region straight under the light-extraction-side electrode 9, and in this embodiment, configured as having the same conductivity type (that is, n-type) with that of the portion of the main compound semiconductor layer 40 in contact with the residual substrate portion 1 (n-type cladding layer 4 in this embodiment).

Mode "A" is configured so that the emission beam from the light emitting layer portion 24 is extractable also from the cut-off portion 1j. More specifically, the second main surface of the residual substrate portion 1 is adhered to a metal stage 52 also functions as a reflective component, so as to allow the emission beam extracted from the cut-off portion 1j to be reflected on the reflective surface RP of the metal stage 52. On the second main surface of the residual substrate portion 1, the bond-assisting alloyed layer 16 composing the back electrode portion is formed over the entire range thereof. In this embodiment the bond-assisting alloyed layer 16 is formed typically using an AuGeNi alloy (for example, Ge: 15% by mass, Ni: 10% by mass, and the balance of Au).

On the bond-assisting alloyed layer 16 side, the residual substrate portion 1 is adhered to the reflective surface RP of the metal stage 52 while placing a metal paste layer 117 in between. By this configuration, the light emitting layer portion 24 is electrically connected to the metal stage 52 through the metal paste layer 117, using the residual substrate portion 1 as a conductive path. On the other hand, the light-extraction-side electrode 9 is electrically connected to a conductive metal stem 51 through a bonding wire 9w typically composed of an Au wire. The light emitting layer portion 24 is applied with the emission drive voltage through unillustrated drive terminal portions integrated with the metal stage 52 and the conductive metal stem 51. The metal paste layer 117 is composed of an Ag paste or the like, similarly to as in the first embodiment.

The auxiliary current spreading layer 91 composed of a compound semiconductor such as AlGaInP, AlGaAs, AlInP, GaInP or the like is formed between the residual substrate portion 1 and the light emitting layer portion 24. The auxiliary current spreading layer 91 has a thickness of typically 0.5 μm to 30 μm (preferably 1 μm to 15 μm), both ends inclusive, and is raised in the effective carrier concentration (n-type dopant concentration as a consequence) as compared with that in either cladding layer of the light emitting layer portion 24 more closer thereto (n-type cladding layer 4, in this mode), so as to be raised in the in-plane current spreading effect. It is to be noted, that the n-type cladding layer 4 (first-conductivity-type cladding layer) can be made thicker than the p-type cladding layer 6 (second-conductivity-type cladding layer), so as to allow the surficial portion of the n-type cladding layer 4 on the second main surface side to function as the auxiliary current spreading layer.

According to the configuration described in the above, the emission beam directed towards the first main surface side of the light emitting layer portion 24 can be increased to a large degree by the reflected beam RB, by allowing the emission beam extracted from the bottom surface of the cut-off portion 1j to reflect on the reflective surface RP of the metal stage 52. The auxiliary current spreading layer 91 provided between the residual substrate portion 1 and the light emitting layer portion 24 enhances the current spreading effect towards the bottom surface portion of the cut-off portion 1j, and increases the current distributed to the region of the light emitting layer portion 24 corresponded to the cut-off portion 1j. As a consequence, the emission beam extractable from the bottom surface of the cut-off portion 1j can be increased.

Paragraphs below will describe a method of fabricating the light emitting device 1100 shown in FIG. 11.

Figure 12:
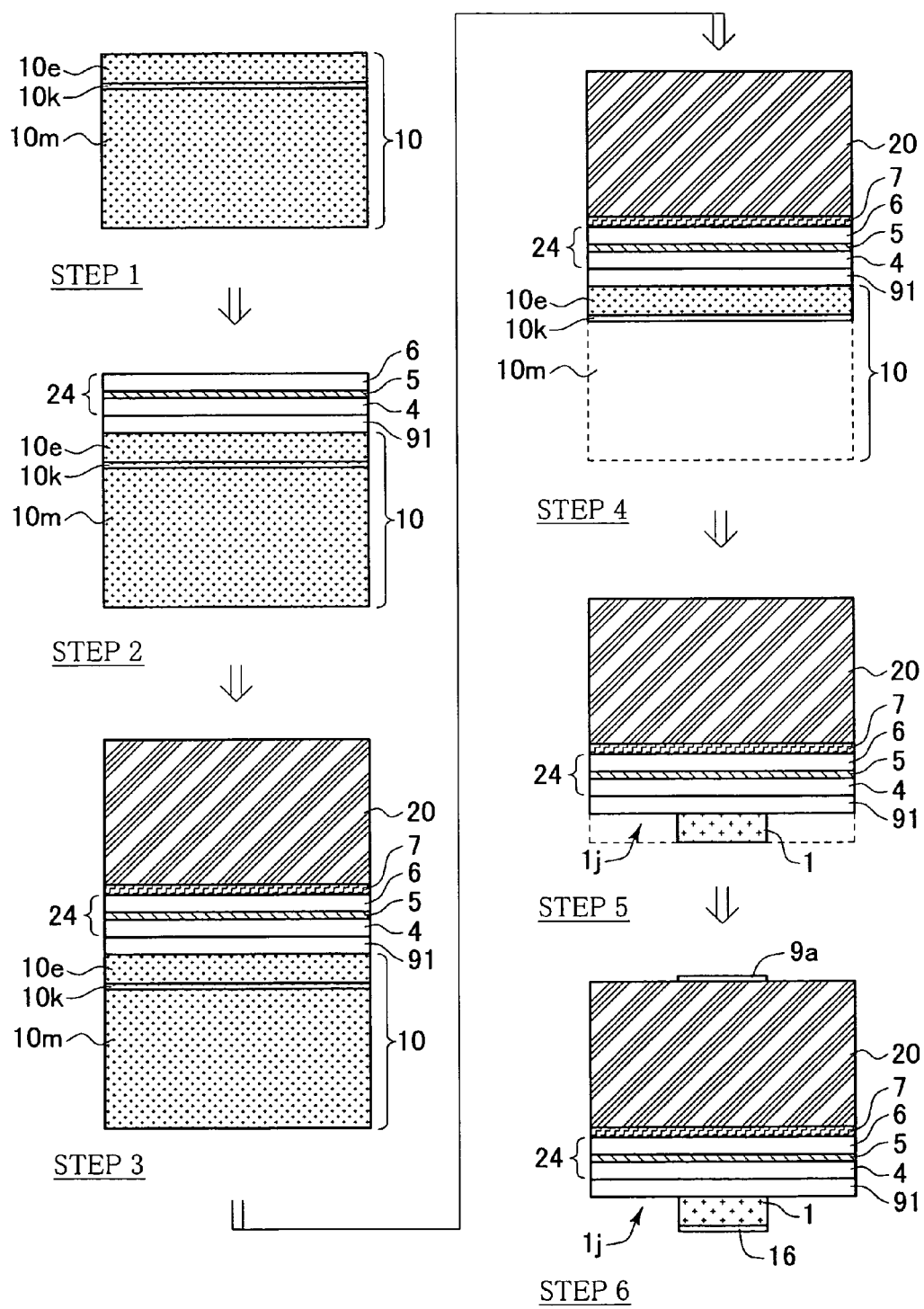
FIG. 12 is an explanatory drawing showing process steps of the method of fabricating the light emitting device shown in FIG. 11.

Step 1 to step 4 in FIG. 12 are similar to step 1 to step 5 shown in FIG. 2 and FIG. 3, except that the auxiliary current spreading layer 91 is grown on the first main surface of the sub-substrate portion 10e, and succeedingly the light emitting layer portion 24 is grown. The current spreading layer 20 may be formed also by bonding a substrate composed of GaP (or GaAsP or AlGaAs also allowable) onto the light emitting layer portion 24. In this case, the bonding may be more complete by preliminarily forming a coupling layer 7 composed of AlInP, GaInP or AlGaAs successive to the light emitting layer portion 24, and then the substrate composed of GaP, GaAsP or AlGaAs is bonded to the coupling layer 7. The coupling layer 7 is, however, not necessary for the case where the current spreading layer 20 is epitaxially grown by the HVPE process (the same will apply also to the first embodiment (FIG. 2, FIG. 3)).

Next, in step 5, the circumferential portion of the second main surface of the residual substrate portion 1 is etched off with the aid of a publicly-known photolithographic technique, to thereby form the cut-off portion 1j. An electrode portion typically composed of Au may be formed on the second main surface of thus-etched residual substrate portion 1, wherein the electrode portion may preliminarily be formed on the second main surface of the residual substrate portion 1, and may be used also as an etching mask for forming the cut-off portion 1j. Next, as shown in step 6, a metal material layer used for forming the bond-assisting alloyed layer is formed by vacuum evaporation or the like on the second main surface of the residual substrate portion 1, and the product is then annealed for alloying in the temperature range from 350° C. to 500° C., both ends inclusive, to thereby form the bond-assisting alloyed layer 16. The bond-assisting alloyed layer 9a is similarly formed on the first main surface of the current spreading layer 20 (annealing for alloying may be shared with that for the bond-assisting alloyed layer 16). The bond-assisting alloyed layer 9a is covered with the light-extraction-side electrode 9 by vacuum evaporation of Au, for example, as shown in FIG. 11. The light emitting device chips are then individualized, and as shown in FIG. 11, the second main surface side of the residual substrate portion 1 of thus-individualized light emitting device chip is adhered onto the metal stage 52 using the metal paste layer 117, and the light-extraction-side electrode 9 is connected to the conductive metal stem 51 through a bonding wire 9w, to thereby complete the light emitting device 1100.

The composite growth-assisting substrate 10 used for fabricating the light emitting device 1100 is composed of a light-absorbing compound semiconductor GaAs, in the essential portion thereof, wherein the substrate is not totally removed after the light emitting layer portion 24 is grown thereon, but instead, it is reduced in the thickness thereof to produce the residual substrate portion 1, and is further cut off in a part thereof to thereby form the cut-off portion 1j which functions as the light extraction portion. The portion not responsible for formation of the cut-off portion 1j functions as imparting rigidity to the light emitting layer portion 24. It is therefore no more necessary to newly bond an electro-conductive substrate such as a silicon substrate on the second main surface side of the light emitting layer portion 24, unlike the techniques described in Japanese Laid-Open Patent Publication "Tokkai" No. 2001-339100 and Nikkei Electronics Oct. 21, 2002, p. 124-132.

Figure 13:
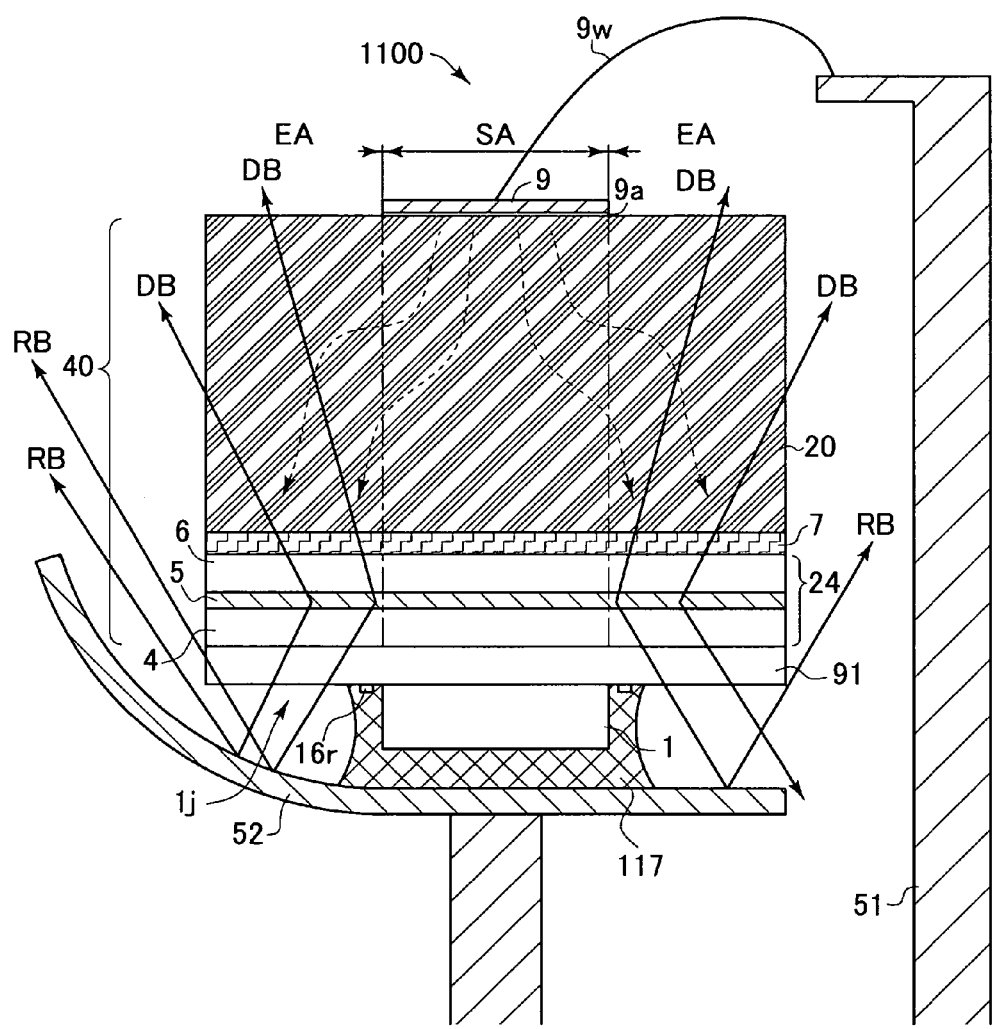
FIG. 13 is a schematic sectional view showing a first modified example of the light emitting device shown in FIG. 11.

The bond-assisting alloyed layer 16 in the embodiment shown in FIG. 11 was formed over the entire portion of the second main surface of the residual substrate portion 1, but another possible configuration is such that, as shown in FIG. 13, a bond-assisting alloyed layer 16r is formed around the residual substrate portion 1, on the second main surface of the auxiliary current spreading layer 91 (that is, the bottom surface of the cut-off portion 1j), and is collectively covered, together with the residual substrate portion 1, by the metal paste layer 117. In this configuration, the contact resistance between the residual substrate portion 1 and the metal paste layer 117 increases, so that current density at the center region of the residual substrate portion 1 located straight under the light-extraction-side electrode 9 can be lowered. As a consequence, the drive voltage to be supplied to the light emitting layer portion 24 bypasses the residual substrate portion 1 but flows predominantly towards the main light extraction surface EA side, to thereby allow the light emitting layer portion 24 to predominantly illuminate in the region advantageous in terms of light extraction. It is also allowable to cover the residual substrate portion 1 and the bond-assisting alloyed layer 16r with a metal layer such as an Au layer, and to make bonding onto the metal stage 52 using the metal paste layer 117 while placing the metal layer in between.

Mode B

Figure 14:
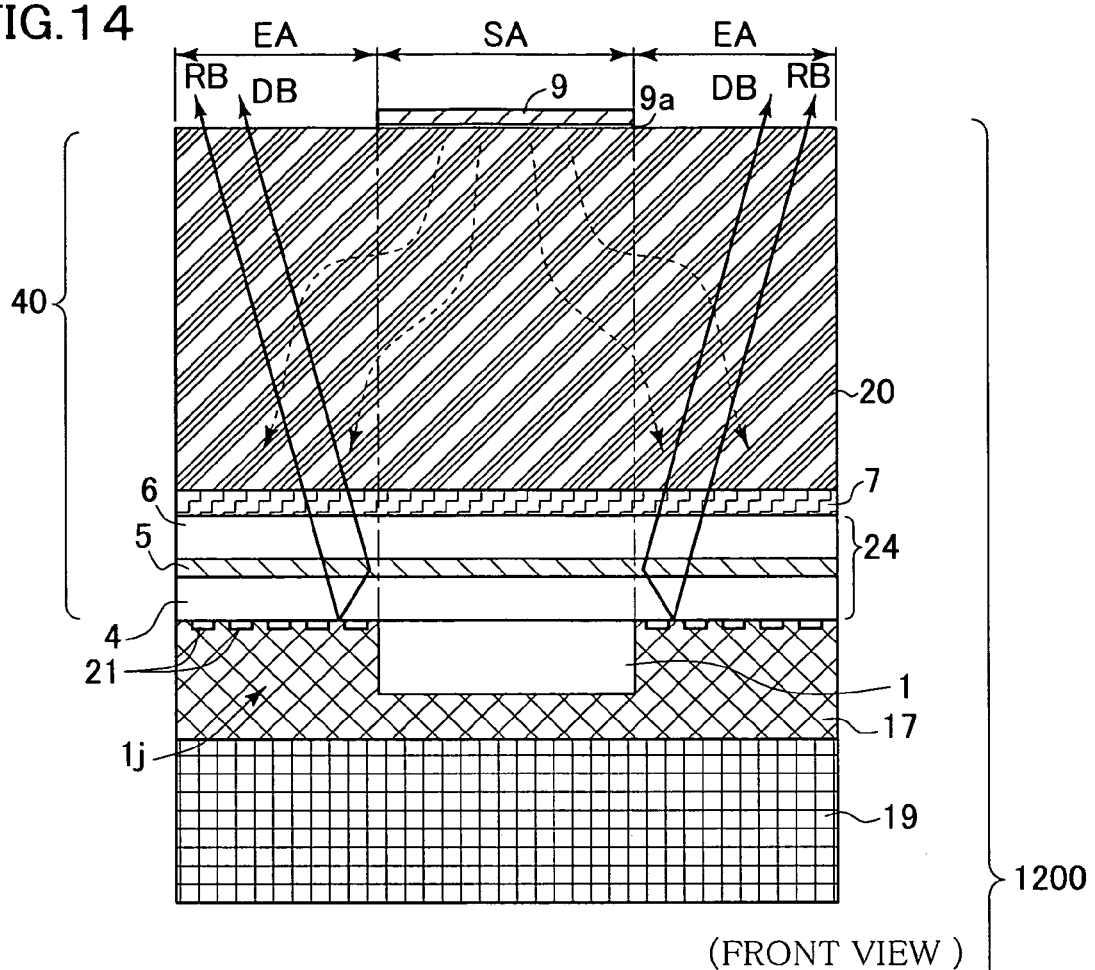
FIG. 14 is a schematic sectional view showing a light emitting device according to mode "B" of the second embodiment.
Figure 14:
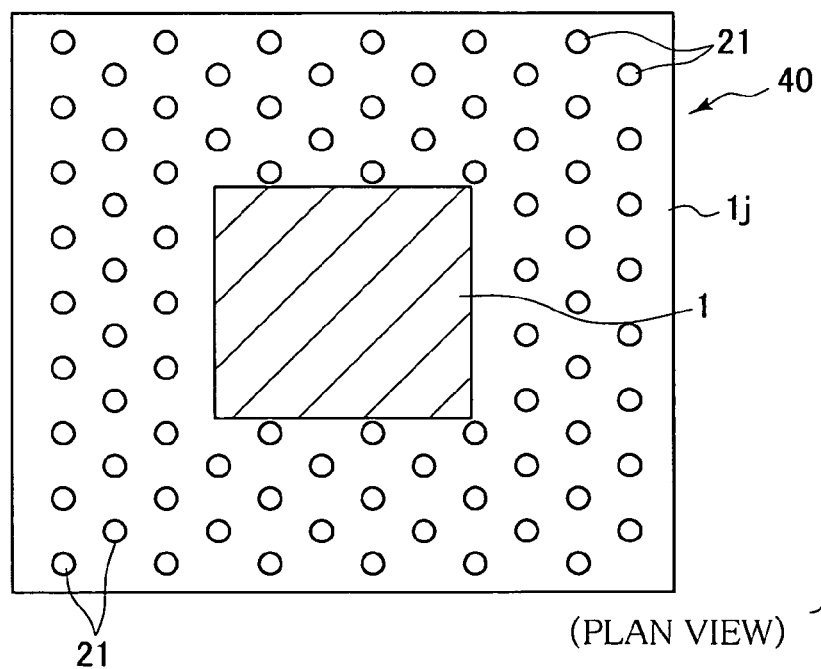

FIG. 14 shows a light emitting device 1200 as another example of the second embodiment of this invention. There are many aspects common to those in the light emitting device 1100 (Mode "A") shown in FIG. 11, so that paragraphs below will explain only differences reside therein. That is, the aspects other than those described below are configured similarly to as in the light emitting device 1100 shown in FIG. 11, so that the explanation of Mode "A" will be applied herein, rather than repeating the detailed explanations. Any common elements herein are given with the common reference numerals.

The most important difference between the light emitting device 1200 and the light emitting device 1100 shown in FIG. 11 resides in having a metal reflective component 17, provided in the cut-off portion 1j, reflecting the emission beam from the light emitting layer portion 24 so as to extract the reflected beam RB from the main light extraction surface EA, as being overlaid with the direct beam DB from the light emitting layer portion 24. In this mode, the second main surface of the residual substrate portion 1 is collectively covered with the metal reflective component 17, together with the bottom surface of the cut-off portion 1j. The electric resistance in the thickness-wise direction of the device in the region having the residual substrate portion 1 formed therein is adjusted larger than the electric resistance in the thickness-wise direction of the device in the region having the cut-off portion 1j formed therein. More specifically, the bond-assisting alloyed layer 21 reducing the contact resistance with the metal reflective component 17 is formed on the bottom surface of the cut-off portion 1j in a distributed manner, whereas the bond-assisting alloyed layer is not formed on the second main surface of the residual substrate portion 1. This configuration successfully suppresses light emission in the region straight under the light-extraction-side electrode 9 where the emission beam is likely to be intercepted. The bond-assisting alloyed layer 21 is formed similarly to the bond-assisting alloyed layer 16 of the light emitting device 1100 shown in FIG. 11, and is formed in this mode on the second main surface of the n-type cladding layer 4, using an AuGeNi alloy (for example, Ge: 15% by mass, Ni: 10% by mass, and the balance of Au). Because the bond-assisting alloyed layer 21 is relatively low in the reflectivity, it is preferable to adjust the ratio of area of forming the bond-assisting alloyed layer 21 to the total area of the region EA to 1% to 25%, both ends inclusive, considering a balance between an effect of increasing the reflected beam in that region and an effect of reducing the contact resistance with respect to the bond-assisting alloyed layer 21.

In FIG. 14, the metal reflective component 17 is the metal paste layer (also referred to as "metal paste layer 17", hereinafter) filled in the cut-off portion 1j. The second main surface of the residual substrate portion 1 is covered with the heat-radiating metal component 19 (for example, Cu plate or Al plate), together with the second main surface of the metal paste layer 17 filling the cut-off portion 1j. The metal paste layer 17 is formed similarly to that in the light emitting device 1100 shown in FIG. 11, and more specifically, using the second main surface of the residual substrate portion 1 and the bottom surface of the cut-off portion 1u are used as an adhesion surface, and the adhesion surface and the first main surface of the heat-radiating metal component 19 are adhered while placing the metal paste layer 17 in between. Although not illustrated in FIG. 14, the heat-radiating metal component 19 is adhered onto the metal-stage similarly to as shown in FIG. 11. Also the light-extraction-side electrode 9 is connected to the conductive metal stem through the bonding wire similarly to as shown in FIG. 11. It is also allowable to omit the heat-radiating metal component 19, and to directly adhere the second main surface side of the residual substrate portion 1 onto the metal stage.

The cut-off portion 1j overlaps the straight-under region of the main light extraction surface EA. In this mode, the cut-off portion 1j is formed so as to approximately coincide with the straight-under region of the main light extraction surface EA, shown in FIG. 15, but the reflected beam RB can more efficiently be extracted by forming the cut-off portion 1j so as to intrude into the straight-under region SA of the light-extraction-side electrode 9, and by forming metal reflective component 17 in the cut-off portion 1j so as to intrude into the straight-under region of the light-extraction-side electrode 9. On the other hand, so far as light absorption does not increase to an excessive degree, the residual substrate portion 1 may be configured also as intruding slightly into the straight-under region of the main light extraction surface EA.

Paragraphs below will explain a method of fabricating the light emitting device 1200 shown FIG. 14.

Figure 16:
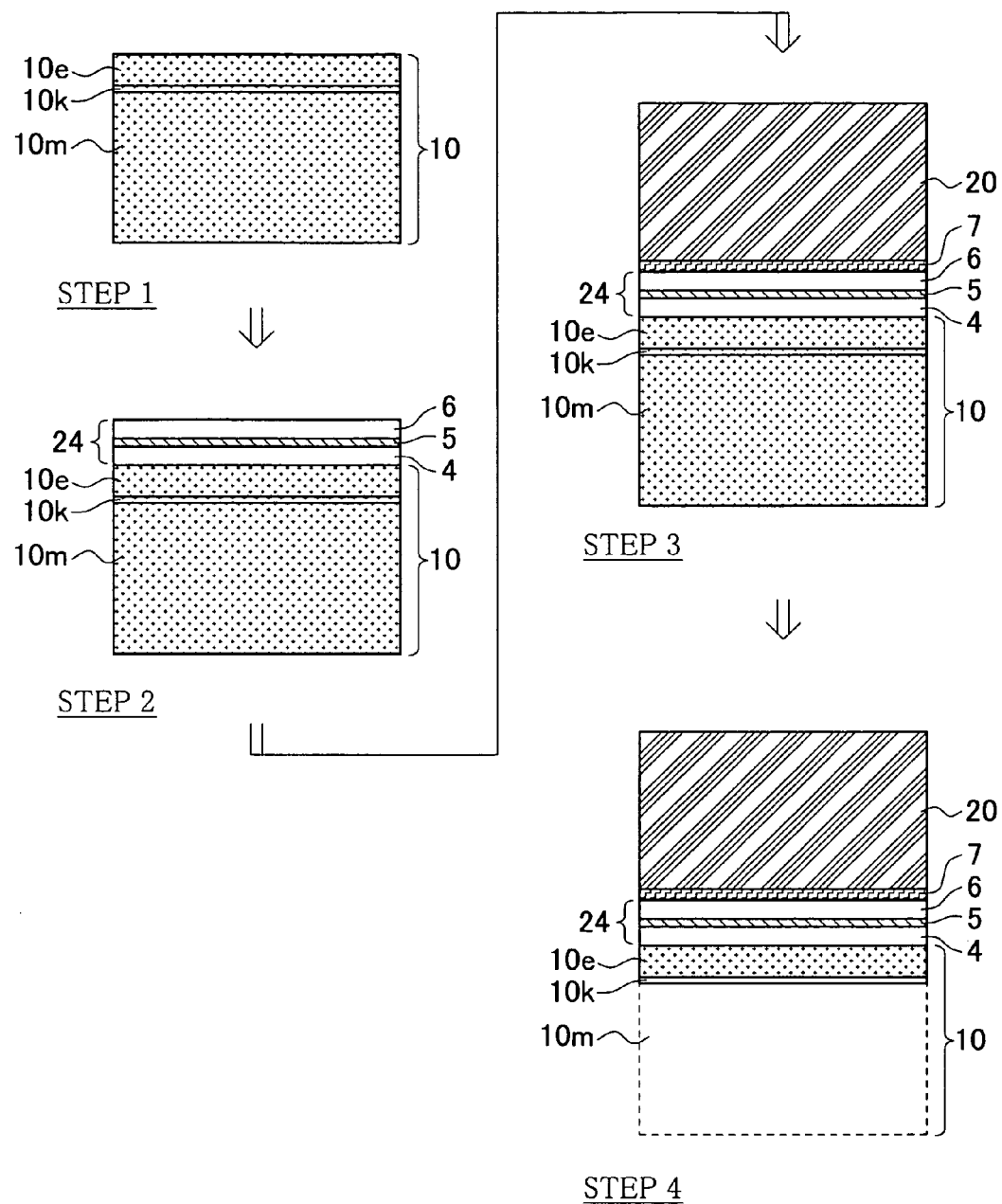
FIG. 16 is an explanatory drawing showing process steps of the method of fabricating the light emitting device shown in FIG. 14.
Figure 17:
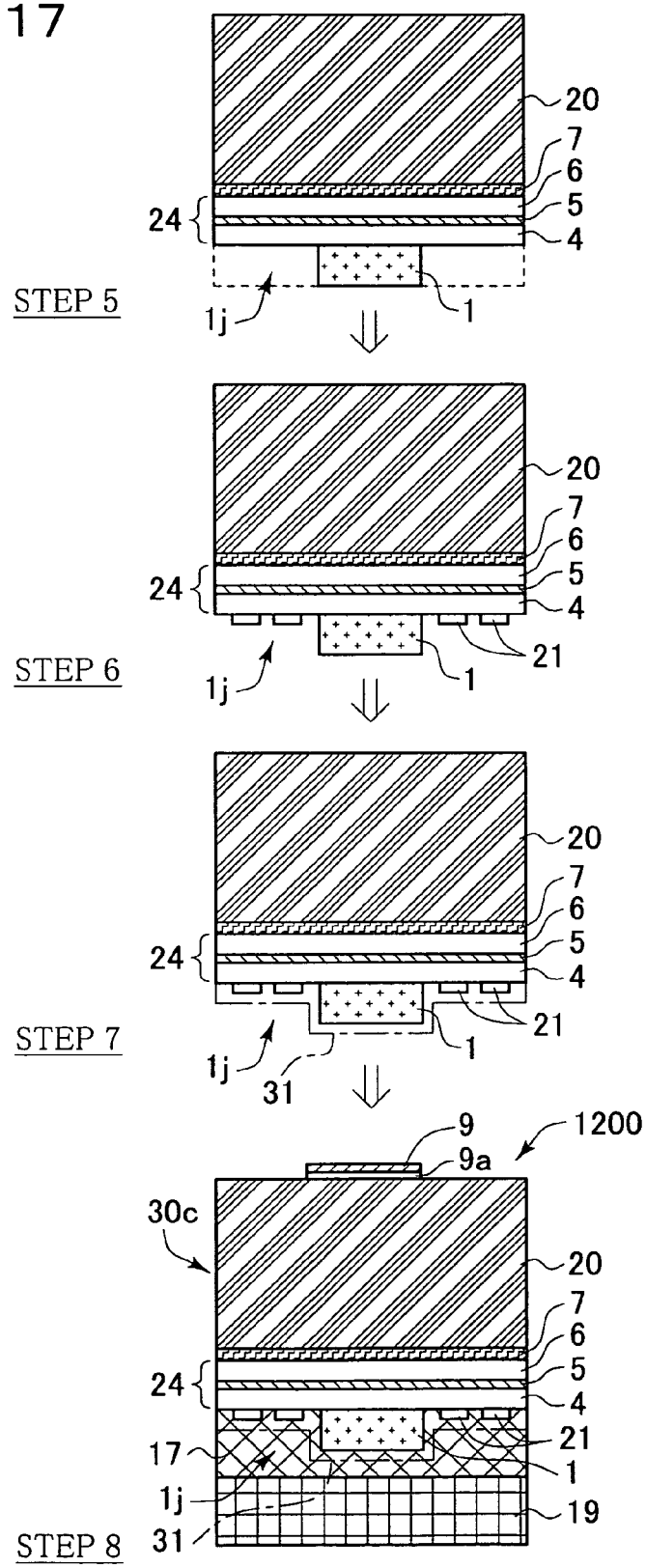
FIG. 17 is an explanatory drawing showing process steps as continued from FIG. 16.

Procedures in step 1 to step 4 in FIG. 16 and step 5 in FIG. 17 are same as those shown in step 1 to step 5 in FIG. 12, except that the light emitting layer portion 24 is directly grown on the sub-substrate 10e, without placing the auxiliary current spreading layer in between. Next the process advances to step 6 in FIG. 17, wherein the metal material layer forming the bond-assisting alloyed layer is formed in a distributed manner on the bottom surface of the cut-off portion 1j typically by vacuum evaporation, annealed for alloying in the temperature range from 350° C. to 500° C., both ends inclusive, to thereby convert the metal material layer to the bond-assisting alloyed layer 21. The bond-assisting alloyed layer 21 is not formed on the second main surface of the residual substrate portion 1. For the case where a metal reflective film 31 is to be formed, the film is formed in succeeding step 7. Thereafter, similarly to as shown FIG. 3, the light emitting device chips are then individualized, and the metal paste layer is formed on the second main surface side of thus-individualized light emitting device chip so as to fill the cut-off portion 1j and so as to cover the second main surface of the residual substrate portion 1. Next, as shown in step 8, the heat-radiating metal component 19 is adhered while placing the metal paste layer 17 in between, to thereby obtain the light emitting device 1200 shown in FIG. 14.

Figure 18:
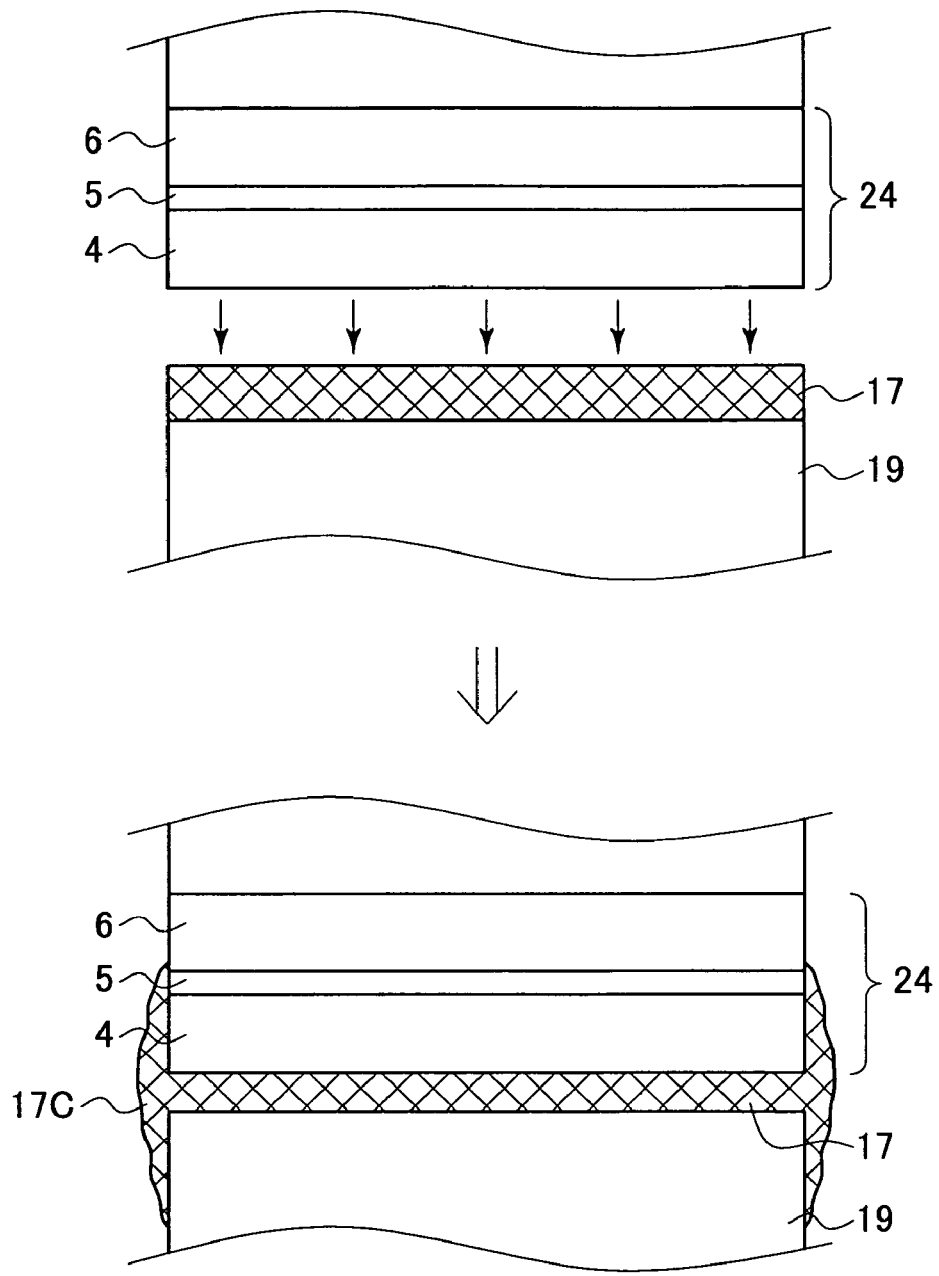
FIG. 18 is a drawing explaining a state of occurrence of a nonconformity caused by creeping-up of the metal paste.
Figure 19:
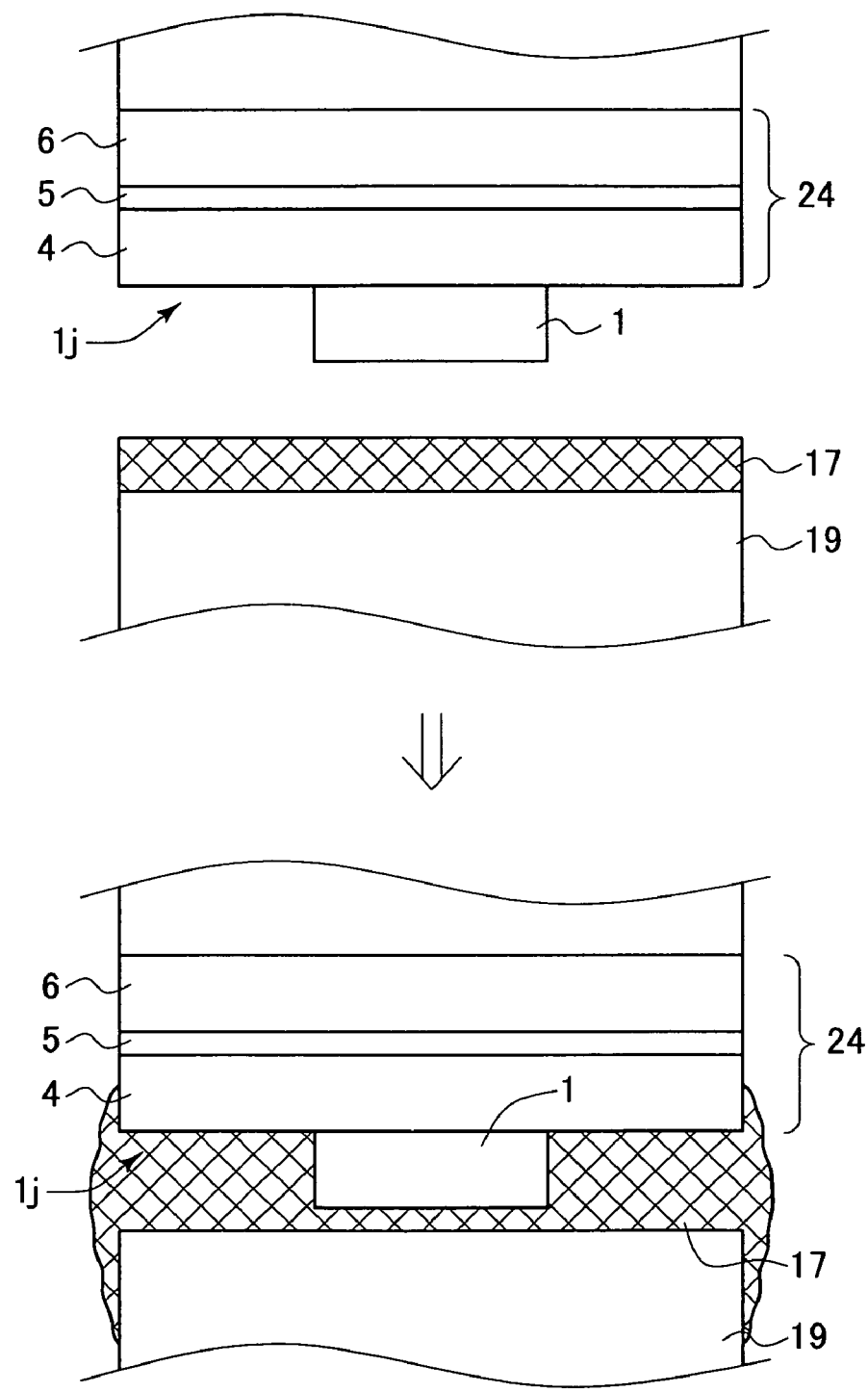
FIG. 19 is a drawing explaining a state of prevention of the nonconformity shown in FIG. 18 using the cut-off portion.

In the conventional light emitting device having no cut-off portion, such adhesion may cause, as shown in FIG. 18, collapse deformation and creep-up of the metal paste layer 17 onto the circumferential side faces of the main compound semiconductor layer, and is therefore likely to cause nonconformities such that the p-n junction portion of the light emitting layer portion 24 (in this mode, the double heterostructure having n-type cladding layer 4 and the p-type cladding layer 6 holding the active layer 5 in between) is short-circuited by thus crept-up metal paste 17c. Whereas, if the cut-off portion 1j is formed as described in the above, the cut-off portion 1j can be used as shown in FIG. 19 as a space for pooling the metal paste 17 having a creeping-up tendency, and can thereby prevent short-circuiting of the p-n junction portion. Again in this case, by allowing the second main surface of the residual substrate portion 1 to closely contact with the surface of the support, and allowing the bonding to proceed using the metal paste layer filled in the cut-off portion 1j, the thickness of the metal paste layer 17 can uniformly be equalized by the thickness control of the residual substrate portion 1. This effect is similarly exhibited also in the first embodiment.

The thickness of the residual substrate portion 1 is illustrated in the drawing as being thinner than that of the current spreading layer 20, merely for the convenience of the explanation, and it does not limit a dimensional relation of the thickness between residual substrate portion 1 and the current spreading layer 20. In particular, for the purpose of dissolving the nonconformity ascribable to the creeping-up of the metal paste 17 described in the above, the it is effective to ensure the thickness of the residual substrate portion 1 to be as thick as 40 µm or more (in this case, the step of reducing the thickness of the substrate shown in step 4 in FIG. 16 may be unnecessary). For the case where the heat-radiating metal component 19 is used, a wafer before being diced may be bonded, using the metal paste 17, to a large metal sheet for composing the heat-radiating metal component, and thereafter the wafer may be individualized together with the metal sheet, wherein the creeping-up of the metal paste 17 onto the individual device chips can be almost negligible. It is therefore possible enough to set the thickness of the residual substrate portion 1 to less than 40 µm.

In the light emitting device 1200, the cut-off portion 1*j* is formed in the residual substrate portion 1, and the cut-off portion 1*j* is filled with the metal paste layer 17 composing the metal reflective component. Because the bond-assisting alloyed layer is not formed on the second main surface of the residual substrate portion 1, this mode can successfully allow the current to concentrate on the main light extraction surface EA surrounding the light-extraction-side electrode 9, and to allow the light emitting layer portion 24 to illuminate predominantly in the region advantageous for the light extraction. This region also has the metal reflective component 17 disposed therein, and can improve the light extraction efficiency by virtue of the reflected beam RB. In addition, the second main surface side of the light emitting layer portion 24 is covered with the heat-radiating metal component 19 while placing the metal paste layer 17 in between, so that the light emission layer portion 24 is prevented from temperature rise induced by current supply.

Figure 20:
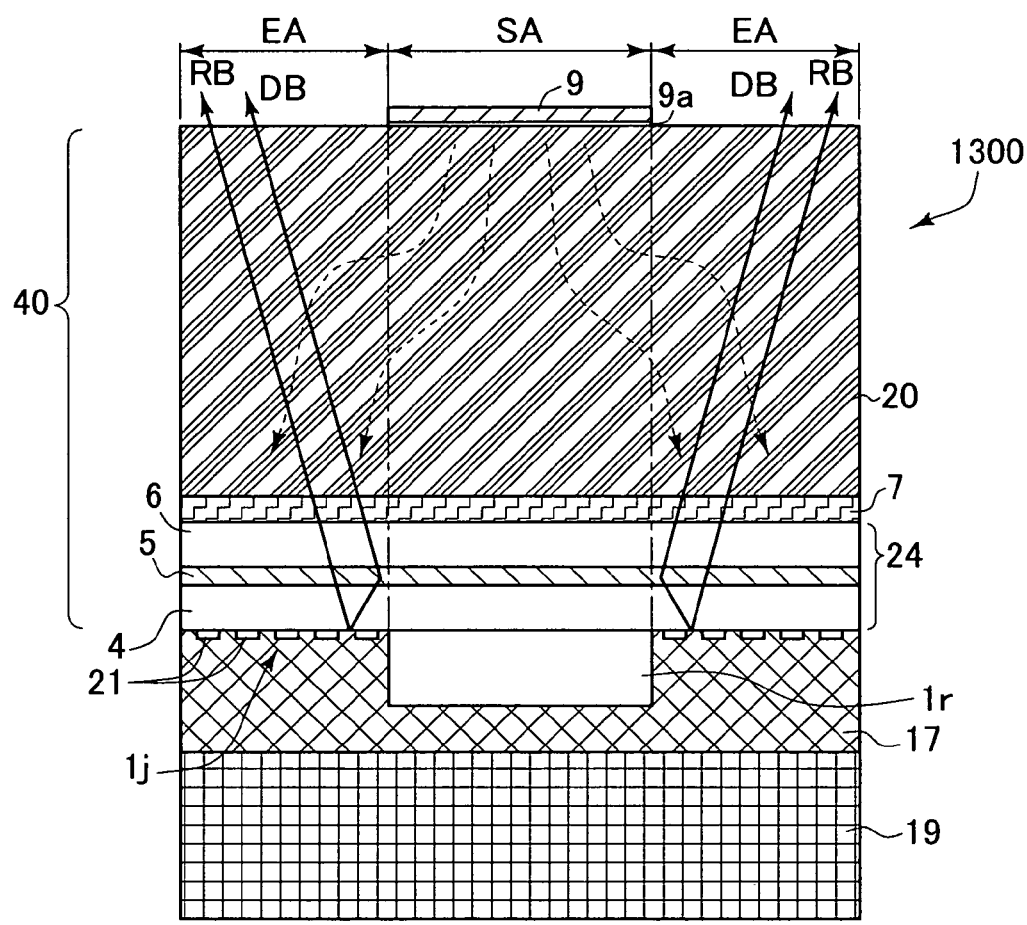
FIG. 20 is a schematic sectional view showing a second modified example of the light emitting device shown in FIG. 14.
Figure 21:
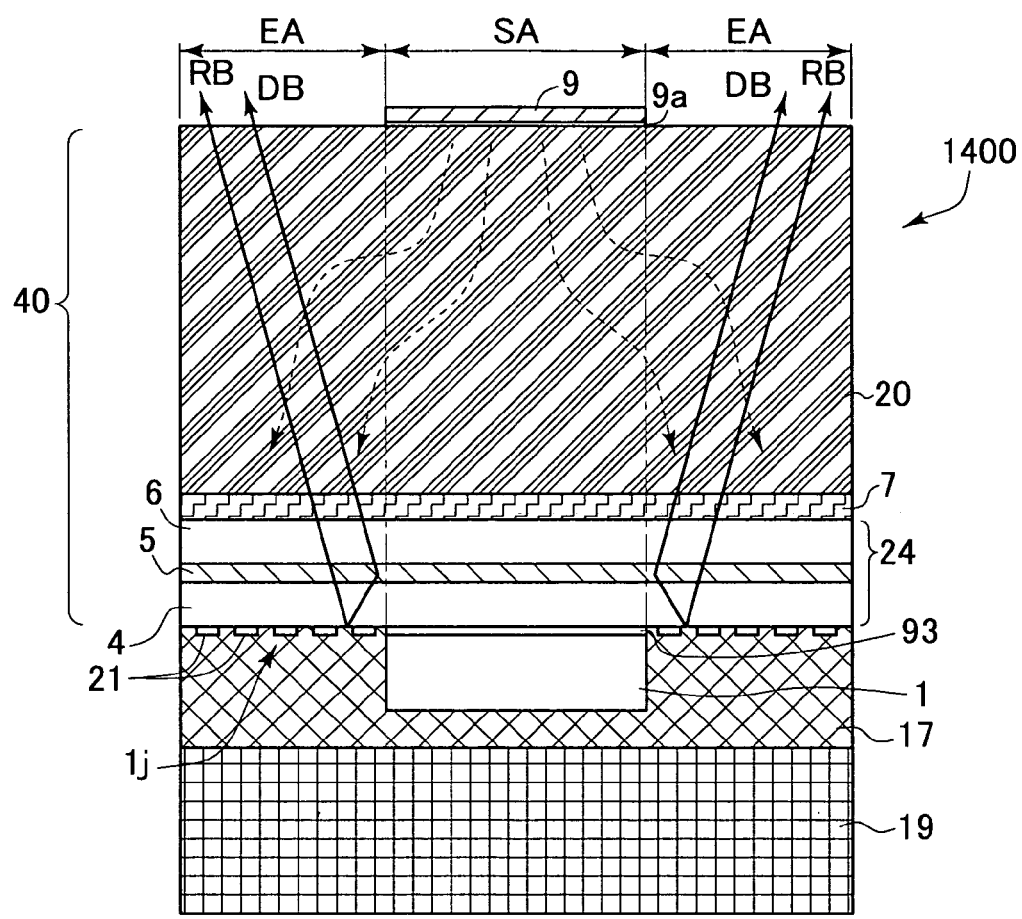
FIG. 21 is a schematic sectional view showing a third modified example of the light emitting device shown in FIG. 14.

Paragraphs below will explain still another mode of the light emitting device 1200 shown in FIG. 14 (any elements commonly used for the light emitting device shown in FIG. 14 will be given with the same reference numerals, for omission of detailed explanation). The configuration of the light emitting device 1200 shown in FIG. 14 was aimed at adjusting the thickness-wise resistance of the device in the region of the residual substrate portion 1 larger than the thickness-wise resistance of the device in the region of the cut-off portion 1*j*, by excluding the bond-assisting alloyed layer from the second main surface of the residual substrate portion 1, so as to allow the current to bypass the region straight above the light-absorbing residual substrate portion 1. A similar effect can, however, be obtained by another configuration as described below. First, in a light emitting device 1300 shown in FIG. 20, the residual substrate portion 1 is configured as an inverted layer portion 1*r* having a conductivity type (that is, p-type) opposite to the portion, placed closer to the residual substrate portion, of the p-type layer portion or the n-type layer portion composing the p-n junction in the light emitting layer portion 24 (that is, the n-type cladding layer 4). In this case a p-type GaAs epitaxial layer may be used as the sub-substrate portion. In a light emitting device 1400 shown in FIG. 21, similarly to as in the light emitting device 1200 shown in FIG. 14, the residual substrate portion 1 is configured as having a conductivity type (that is, n-type) same as the one, placed closer to the residual substrate portion, of the p-type layer portion or the n-type layer portion composing the p-n junction in the light emitting layer portion 24 (that is, the n-type cladding layer 4). Between the light emitting layer portion 24 and the residual substrate portion 1, an inverted layer portion 93 composed of a compound semiconductor having a conductivity-type (that is, p-type) opposite to that of the residual substrate portion 1 is interposed, so as to selectively cover the residual substrate portion 1

Figure 22:
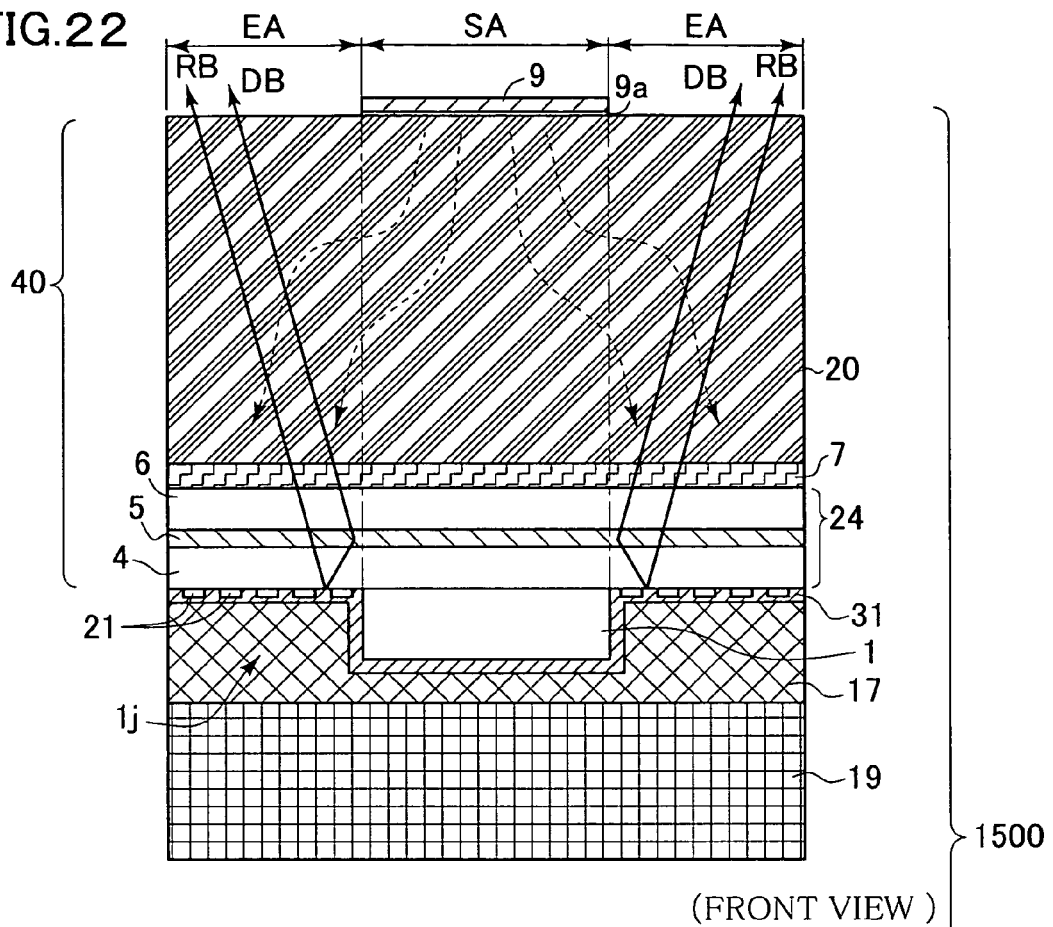
FIG. 22 is a schematic sectional view showing a fourth modified example of the light emitting device shown in FIG. 14.
Figure 22:
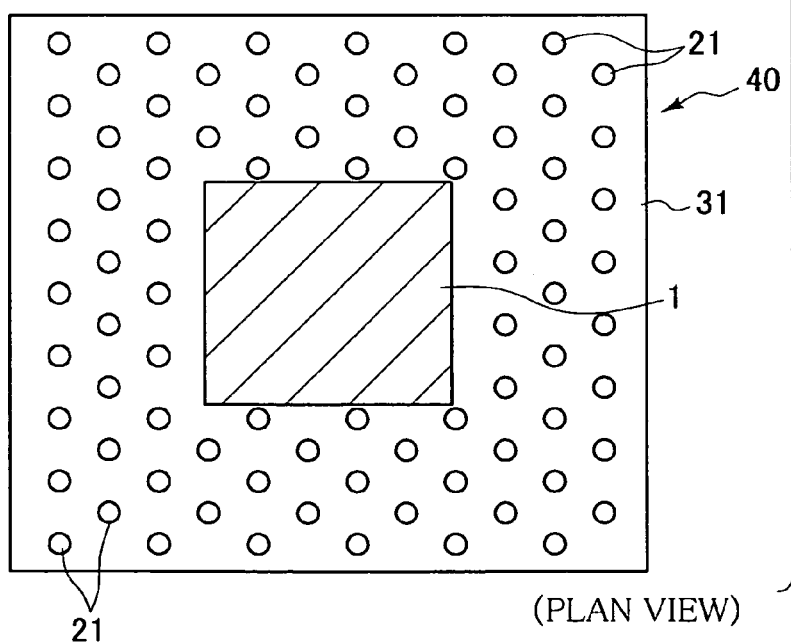

Next, in a light emitting device 1500 shown in FIG. 22, the metal reflective component is configured as the metal film 31 (mainly composed of any one of Au, Ag and Al, for example) formed on a compound semiconductor portion composing the bottom surface of the cut-off portion 1*j*, which is herein the light emitting layer portion 24 (n-type cladding layer 4). The metal film 31 herein is configured as collectively covering also the second surface side of the residual substrate portion. The metal film 31 is bonded to the heat-radiating metal component 19 while placing the metal paste layer 17 in between (in this case, the metal paste layer 17 is no more an element of the metal reflective component). The metal film 31 is formed after annealing for alloying of the bond-assisting alloyed layer 21, as shown in step 7 in FIG. 17.

Figure 23:
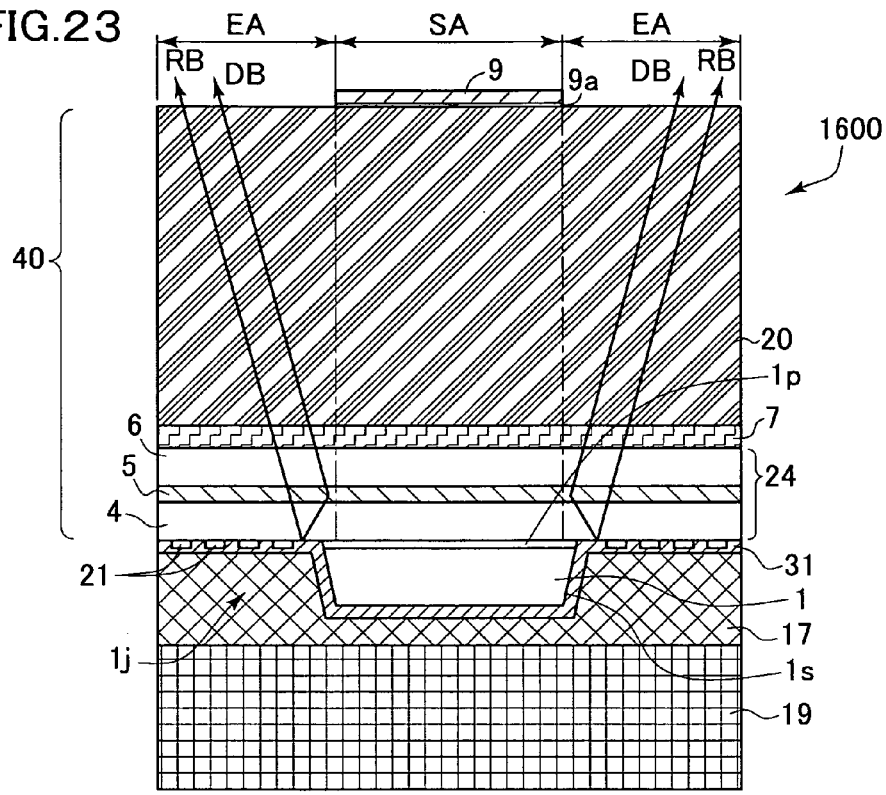
FIG. 23 is a schematic sectional view showing a fifth modified example of the light emitting device shown in FIG. 14.

A light emitting device 1600 shown in FIG. 23 is a further modification of the light emitting device 1500 shown in FIG. 22, wherein circumferential side faces is of the residual substrate portion 1 is configured as inclined surfaces, so as to make the area of the second main surface of the residual substrate portion 1 smaller than the area of the first main surface. The metal film 31 is configured as collectively covering the second main surface and the circumferential side faces of the residual substrate portion 1, and the bottom surface of the cut-off portion. For the case where the metal film 31 is formed by a film forming method characterized by a strong directionality such as vacuum evaporation, sputtering and the like, the circumferential side faces 1*s* of the residual substrate portion 1 configured as the inclined surfaces as described in the above is successful in forming the metal film to have a sufficient thickness also of the circumferential side faces 1*s*.

Figure 24:
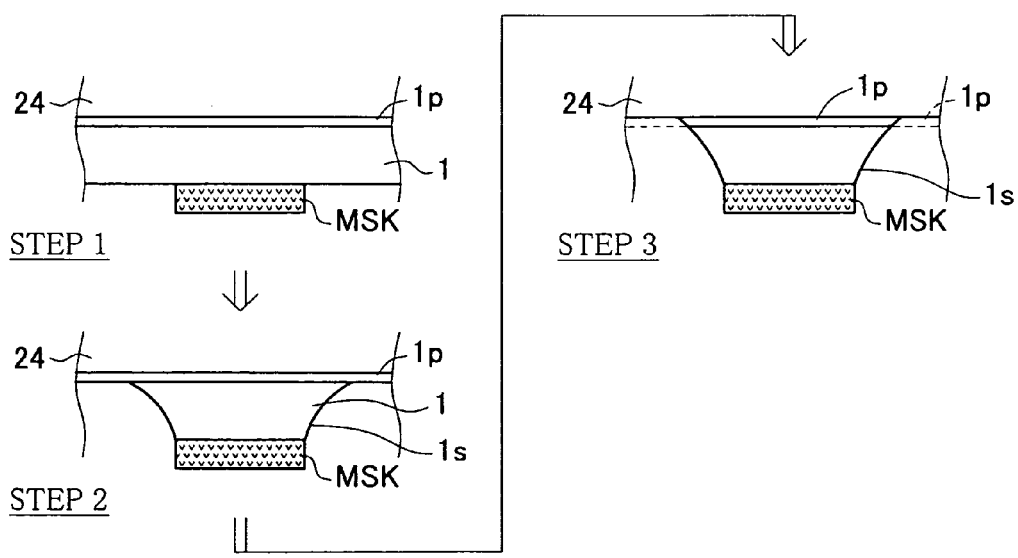
FIG. 24 is an explanatory drawing showing exemplary process steps of forming the residual substrate portion of the light emitting device shown in FIG. 23.

The residual substrate portion 1 having the inclined surfaces on the circumferential side faces is thereof can be obtained by carrying out the etching in step 5 in FIG. 17 as below. First, as shown in step 1 in FIG. 24, an etching stopper layer 1*p* composed of AlInP is formed between the residual substrate portion 1 composed of GaAs and the light emitting layer portion 24. Next, as shown in step 2, a region to be remained out of the second main surface (having a surface orientation of (100)) of the residual substrate portion 1 is covered with an etching resist MSK, and the residual portion is mesa-etched using an aqueous ammonia/hydrogen peroxide solution as an etching solution. The circumferential side faces of the residual substrate portion 1 are given as the inclined surfaces by an anisotropic etching effect of the etching solution. Then as shown in step 3, the etching stopper layer 1*p* is removed using hydrochloric acid as an etching solution, and the etching resist MSK is finally removed.

Figure 15:
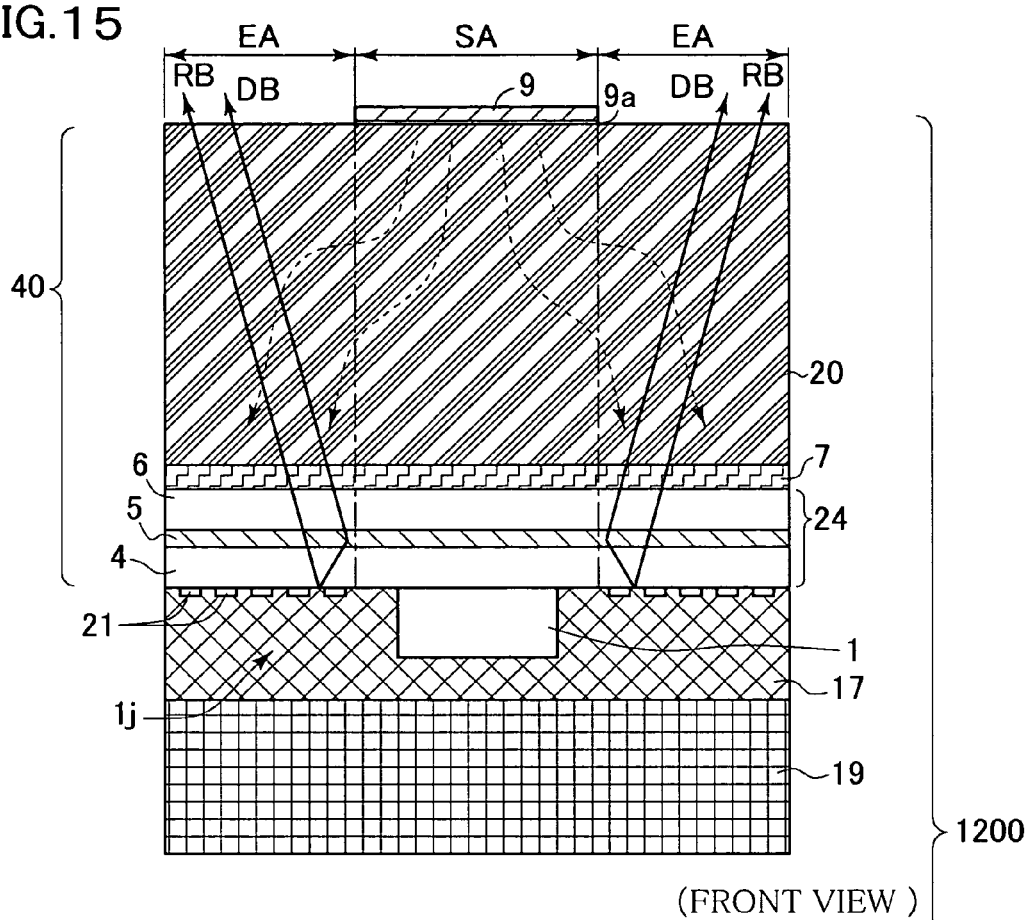
FIG. 15 is a schematic sectional view showing a first modified example of the light emitting device shown in FIG. 14.
Figure 15:
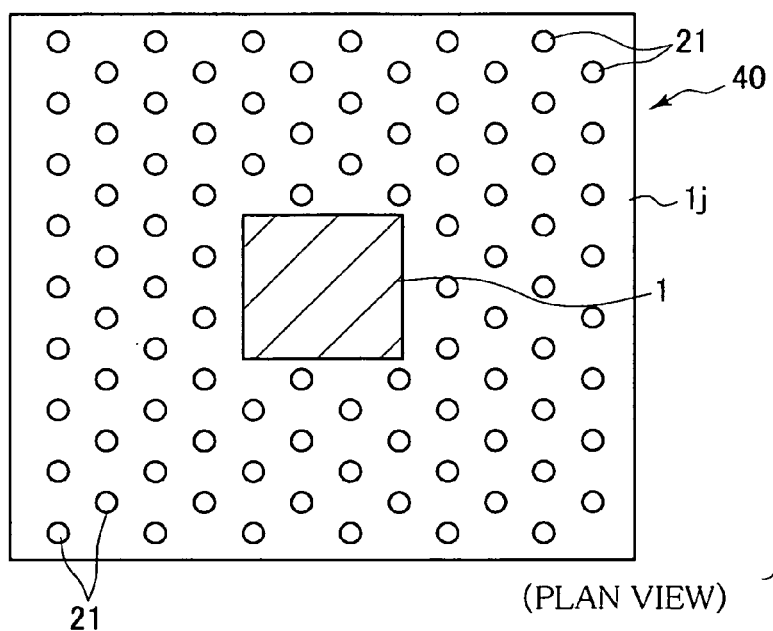
Figure 25:
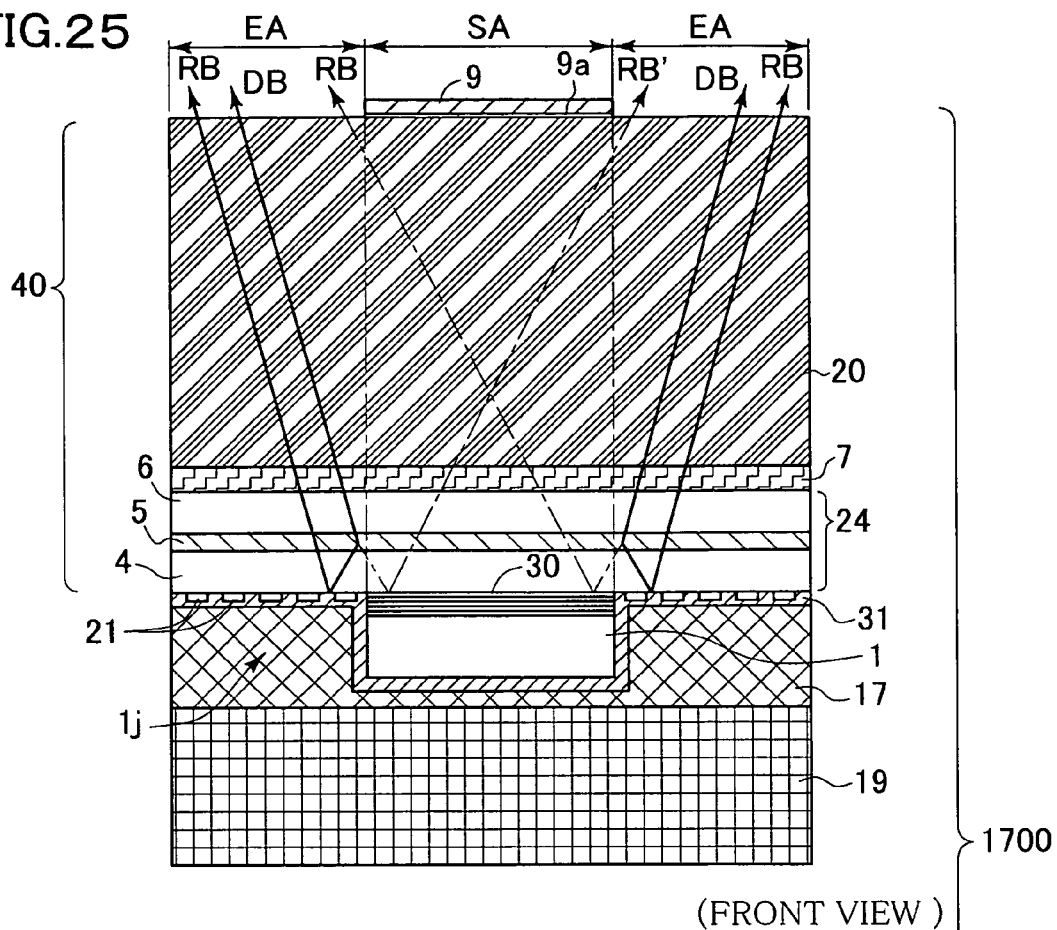
FIG. 25 is a schematic sectional view showing a sixth modified example of the light emitting device shown in FIG. 14.
Figure 25:
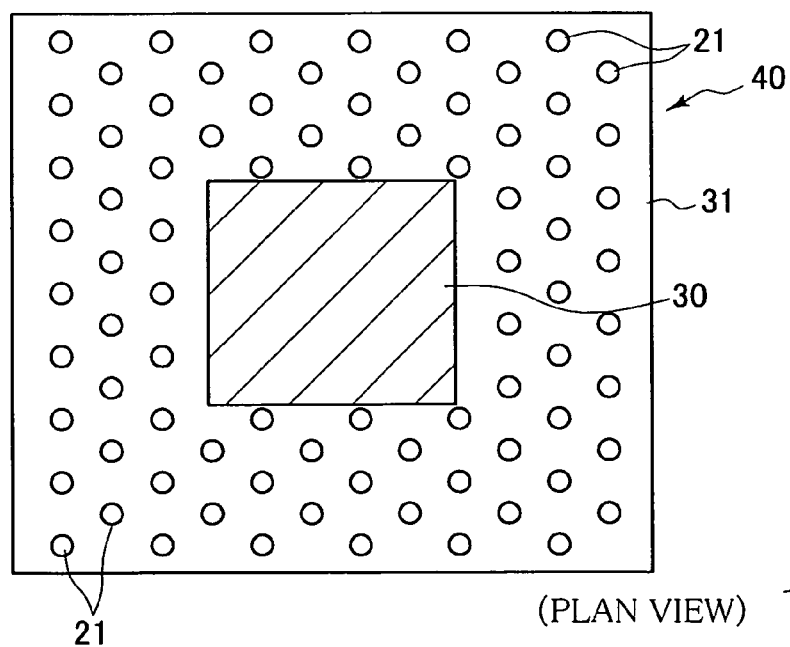

Next, a light emitting device 1700 shown in FIG. 25 has, between the light emitting layer portion 24 and the residual substrate portion 1, a DBR layer 30 reflecting light based on Bragg reflection, formed by stacking a plurality of semiconductor layers differed in the refractive index (the configuration is same as that shown in FIG. 15, except that the DBR layer 30 is provided). By virtue of the DBR layer 30, the reflected beam RB can effectively be produced even in the region located straight above the light-absorbing residual substrate portion 1, out of the light emitting layer portion 24 located straight under the main light extraction surface EA. In this case, even if the residual substrate portion 1 is formed so as to slightly intrude into the region straight under the main light extraction surface EA, loss of emission beam ascribable to light absorption is almost negligible by virtue of formation of the DBR layer 30. The DBR layer may similarly be formed also in the light emitting device 1100 shown in FIG. 11, between the residual substrate portion 1 and the light emitting layer portion 24 (for example, between the auxiliary current spreading layer 91 and the residual substrate portion 1). Whichever of structures shown in FIG. 11 and FIG. 15 should be based on, the above-described DBR layer can be formed so as to extend toward the bottom surface region of the cut-off portion 1j, and thereby the reflective effect of the emission beam in the region of the cut-off portion 1j can be enhanced.

Third Embodiment

Figure 26:
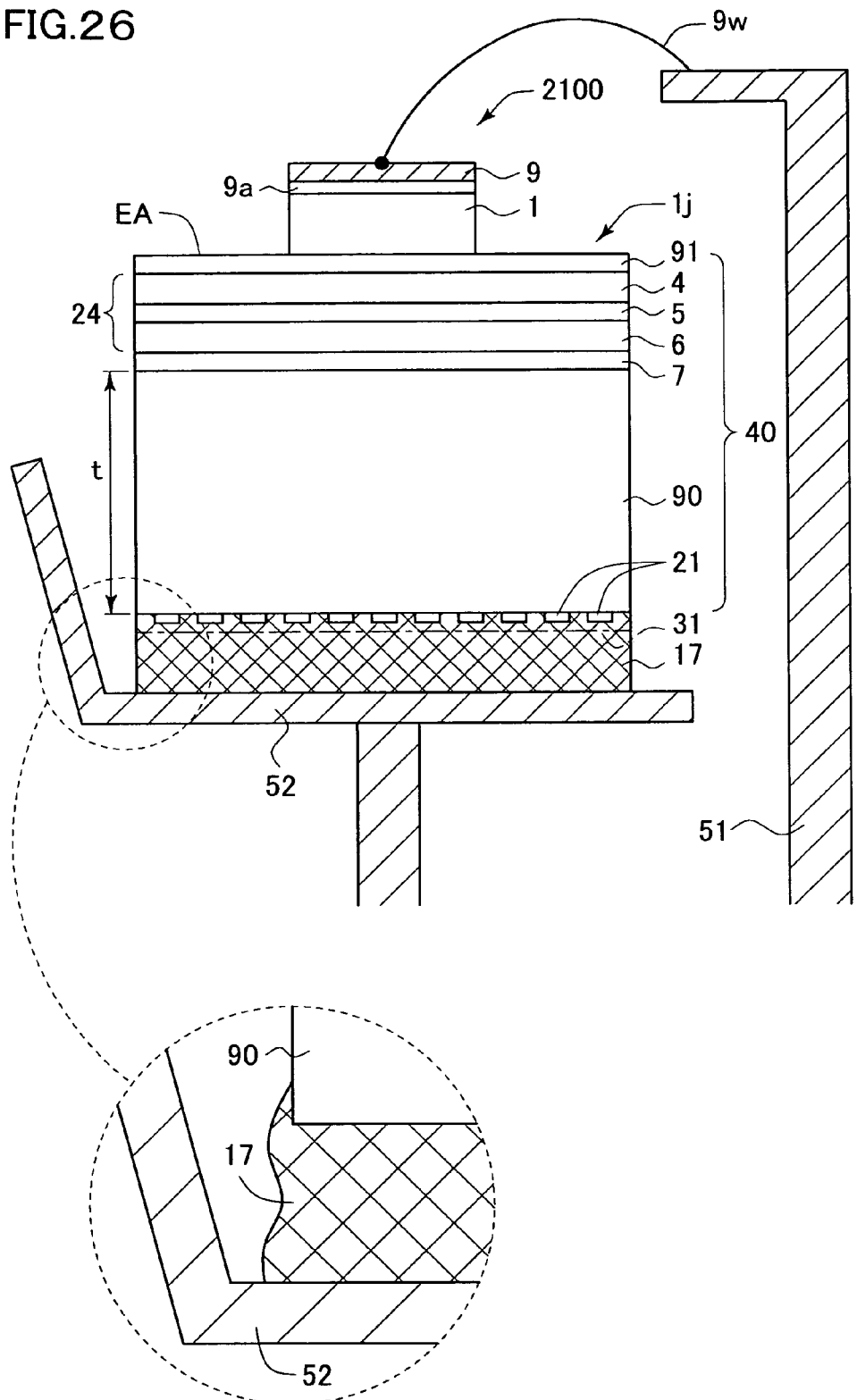
FIG. 26 is a schematic sectional view showing the light emitting device according to a third embodiment of this invention.

Paragraphs below will explain the third embodiment of this invention, referring to the attached drawings. FIG. 26 schematically shows a light emitting device 2100 as an example of the third embodiment of this invention. There are many aspects common to those in the light emitting device 100 shown in FIG. 1, so that paragraphs below will explain only differences reside therein. That is, the aspects other than those described below are configured similarly to as in the light emitting device 100 shown in FIG. 1, so that the explanation of the first embodiment will be applied herein, rather than repeating the detailed explanations. Common elements are given with common reference numerals.

Figure 27:
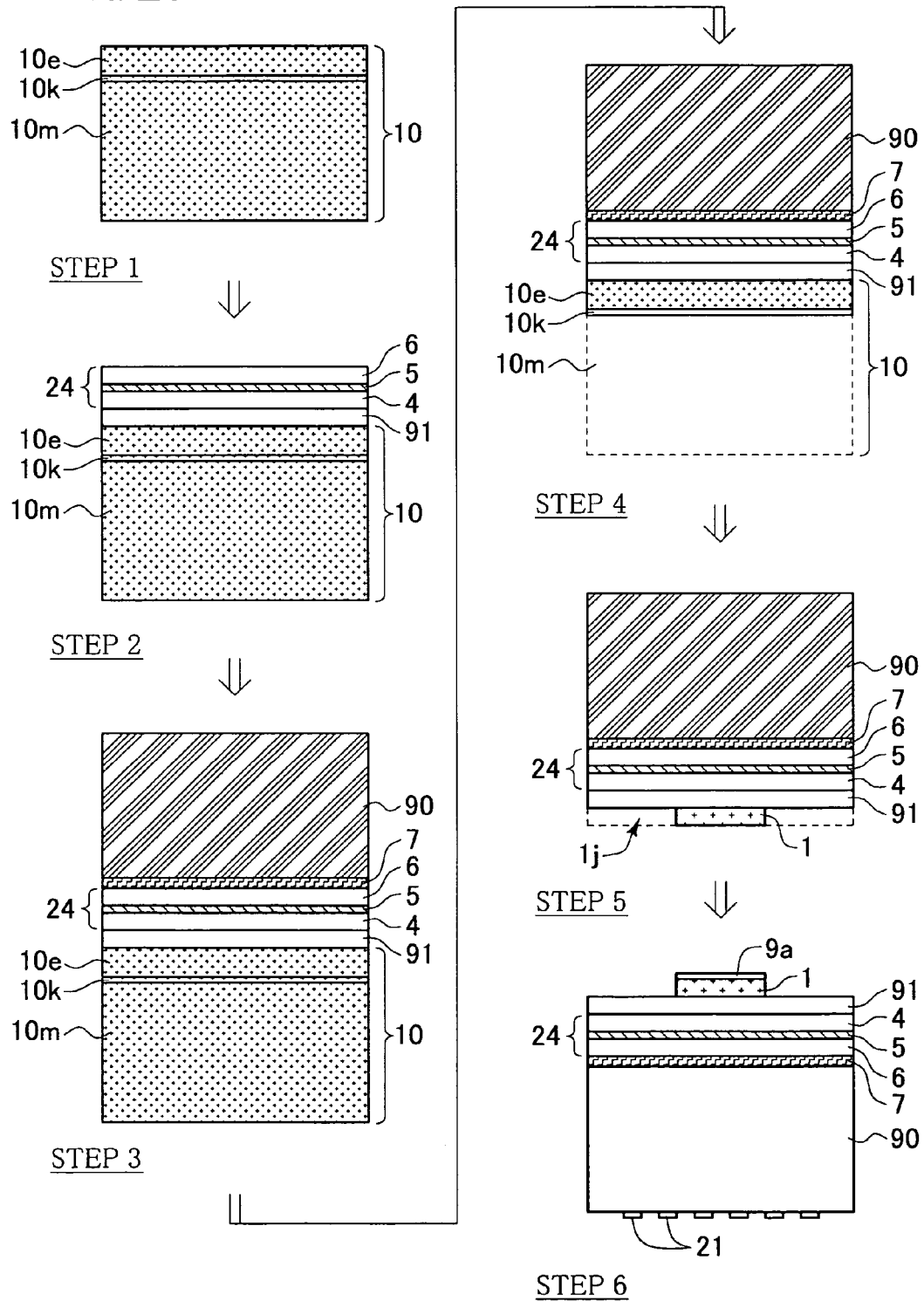
FIG. 27 is an explanatory drawing showing process steps of the method of fabricating the light emitting device shown in FIG. 26.

FIG. 26 schematically shows the light emitting device 2100 as an example of the third embodiment of this invention. In light emitting device 2100, the main compound semiconductor layer 40 having therein the light emitting layer portion 24 is epitaxially grown on the first main surface of the sub-substrate 10e (see step 2 in FIG. 27). The cut-off portion 1j is formed by cutting off the circumferential portion of the residual substrate portion 1 (see step 5 in FIG. 27). Step 2 in FIG. 27 is illustrated based on vertical orientation during the layer growth, and FIG. 26 is turned upside down (therefore, the first main surface appears as the bottom surfaces of any layers and the substrates). The bottom surface of the cut-off portion 1j forms the main light extraction surface EA, and the light-extraction-side electrode 9, through which the emission drive voltage is applied to the light emitting layer portion 24, is formed so as to cover the second main surface of the residual substrate portion 1. In FIG. 26, the transparent semiconductor layer 90, the coupling layer 7, the light emitting layer portion 24 and the auxiliary current spreading layer 91 belong to the main compound semiconductor layer 40, but the residual substrate portion 1 does not belong to the main compound semiconductor layer 40.

In the light emitting device 2100, the p-type AlGaInP cladding layer 6 is disposed on the transparent semiconductor layer 90 side, and the n-type AlGaInP cladding layer 4 is disposed on the residual substrate portion 1 side. Between the residual substrate portion 1 and the light-extraction-side electrode 9, the bond-assisting alloyed layer 9a reducing the contact resistance therebetween is formed. The bond-assisting alloyed layer 9a herein is formed using an AuGeNi alloy (for example, Ge: 15% by mass, Ni: 10% by mass, and the balance of Au).

In the main compound semiconductor layer 40, the transparent semiconductor layer 90 composed of GaP (GaAsP or AlGaAs also allowable: p-type herein) is formed on the first main surface of the light emitting layer portion 24. The transparent semiconductor layer 90 is raised in the effective carrier concentration (consequently p-type dopant concentration) to a degree sufficient for forming ohmic contact with the aid of the bond-assisting alloyed layer 21 (for example, equivalent to that of the p-type cladding layer 6 or more and $2\times10^{18}/cm^3$ or less). The transparent semiconductor layer 90 also plays a role of increasing the beam extractable from the side faces of the layer, and enhancing the luminance of the device as a whole (integrating sphere luminance), if it is formed to as thick as 10 μm to 200 μm, both ends inclusive (preferably 40 μm to 100 μm, both ends inclusive). The transparent semiconductor layer 90 is also suppressed in absorption of emission beam, because it is configured by using a III-V compound semiconductor having a band gap energy larger than a photon energy which corresponds to a peak wavelength of the emission beam from the light emitting layer portion 24.

The transparent semiconductor layer 90 is adhered on the first main surface side thereof to the metal stage 52 while placing a metal paste layer 17 composed of an Ag paste or the like in between, wherein the metal paste layer 17 composes the reflective component. On the first main surface of the transparent semiconductor layer 90, the bond-assisting alloyed layer 21 is formed in a distributed manner similarly to as on the light-extraction-side electrode 9 side, and the bond-assisting alloyed layer 21 is covered by the metal paste layer 17. By this configuration, the light emitting layer portion 24 is electrically connected to the metal stage 52 through the metal paste layer 117. On the other hand, the light-extraction-side electrode 9 is electrically connected to the conductive metal stem 51 through a current supply wire 9w typically composed of an Au wire. The light emitting layer portion 24 is applied with the emission drive voltage through unillustrated drive terminal portions integrated with the metal stage 52 and the conductive metal stem 51.

In this mode, the bond-assisting alloyed layer 21 is formed using an AuBe alloy in order to ensure a contact with the p-type layer. Because the bond-assisting alloyed layer 21 has a relatively low reflectivity, it is preferable to adjust the ratio of area of forming the bond-assisting alloyed layer 21 to the total area of the first main surface of the transparent semiconductor layer 90 to 1% to 25%, both ends inclusive, considering a balance between an effect of increasing the reflected beam in that region and an effect of reducing the contact resistance with respect to the bond-assisting alloyed layer 21. It is also allowable to cover the bond-assisting alloyed layer 21 with the high-reflectivity metal reflective layer 31 such as an Au layer, an Ag layer or an Al layer, and the metal reflective layer 31 may be adhered to the metal stage 52 while placing the metal paste layer 17 in between.

For the case where the light emitting device is bonded on the transparent semiconductor layer 90 side onto the metal stage 52 while placing the metal paste layer 17 in between, the metal paste layer 17 may cause collapse deformation in the process of bonding, as shown in FIG. 26 in a partially enlarged manner, and may creep up onto the circumferential side faces of the main compound semiconductor layer. Whereas in this mode of invention having the thickness of the transparent semiconductor layer 90, provided on the bonding side, adjusted to be as thick as 40 μm or more and 200 μm or less, the metal paste shows only a small probability of reaching the light emitting layer portion (p-n junction portion) 24 even if it should creep up, so that the nonconformities such as short-circuiting of the p-n junction can effectively be avoided.

The auxiliary current spreading layer 91 composed of a compound semiconductor such as AlGaInP, AlGaAs, AlInP, GaInP or the like is formed between the residual substrate portion 1 and the light emitting layer portion 24. The auxiliary current spreading layer 91 has a thickness of typically 0.5 μm to 30 μm (preferably 1 μm to 15 μm), both ends inclusive, and is raised in the effective-carrier concentration (n-type dopant concentration as a consequence) higher than that in either cladding layer of the light emitting layer portion 24 more closer thereto (n-type cladding layer 4, in this mode), so as to be raised in the in-plane current spreading effect. It is to be noted, that the n-type cladding layer 4 (first-conductivity-type cladding layer) can be made thicker than the p-type cladding layer 6 (second-conductivity-type cladding layer), so as to allow the surficial portion of the n-type cladding layer 4 on the second main surface side to function as the auxiliary current spreading layer.

In the configuration described in the above, only a part of the residual substrate portion 1, acting as an light absorber, is cut off. The bottom surface of the resultant cut-off portion 1j can, therefore, be used as the main light extraction surface EA, and the emission beam directed to that portion can directly be extracted to the external, so that the light extraction efficiency can be enhanced to a large degree. On the other hand, the second main surface of the residual substrate portion 1 is effectively used as the region allowing thereon formation of the light-extraction-side electrode 9, and the light absorption action of the residual substrate portion 1 is not actualized as a nonconformity, by virtue of the light interception action of the light-extraction-side electrode 9 (FIG. 26). By forming the bond-assisting alloyed layer 9a for the light-extraction-side electrode 9 on the second main surface of the residual substrate portion 1 composed of GaAs having a small band gap energy and an excellent anti-oxidative property, more desirable ohmic contact is realized, contributing to reduction in the forward voltage of the device.

Paragraphs below will describe a method of fabricating the light emitting device 2100 shown in FIG. 26.

Step 1 to step 5 in FIG. 27 are same as step 1 to step 5 in FIG. 12, if the current spreading layer 20 is replaced to the transparent semiconductor layer 90. In step 6 (illustrated by turning the state upside down, compared to step 1-5), a metal material layer forming the bond-assisting alloyed layer is formed on the second main surface of the residual substrate portion 1 typically by vacuum evaporation, and is then annealed for alloying in the temperature range from 350° C. to 500° C., both ends inclusive, to thereby form the bond-assisting alloyed layer 9a. The bond-assisting alloyed layer 21 is similarly formed in a distributed manner on the first main surface of the transparent semiconductor layer 90 (annealing for alloying may be shared with that for the bond-assisting alloyed layer 9a). The bond-assisting alloyed layer 9a is covered with the light-extraction-side electrode 9 by vacuum evaporation of Au, for example, as shown in FIG. 26. The light emitting device chips are then individualized, and as shown in FIG. 26, the second main surface (having the bond-assisting alloyed layer 21 formed thereon) of the transparent semiconductor layer 90 of thus-individualized light emitting device chip is adhered onto the metal stage 52 using the metal paste layer 17, and the light-extraction-side electrode 9 is connected to the conductive metal stem 51 through a bonding wire 9w, to thereby complete the light emitting device 2100.

The light emitting device 2100 has the cut-off portion 1j which functions as the main light extraction surface EA, in a form such that the residual substrate portion 1 is partially cut off. The portion not participating the formation of the cut-off portion 1j can take part in enhancing rigidity of the wafer.

Paragraphs below will describe various modified examples of the light emitting device according to the third embodiment of this invention. There are many aspects common to those in the light emitting device 2100 shown in FIG. 26, so that paragraphs below will explain only differences reside therein. That is, the aspects other than those described below are configured similarly to as in the light emitting device 2100 shown in FIG. 26, so that the explanation of the first embodiment will be applied herein, rather than repeating the detailed explanations. Common elements are given with common reference numerals.

Figure 28:
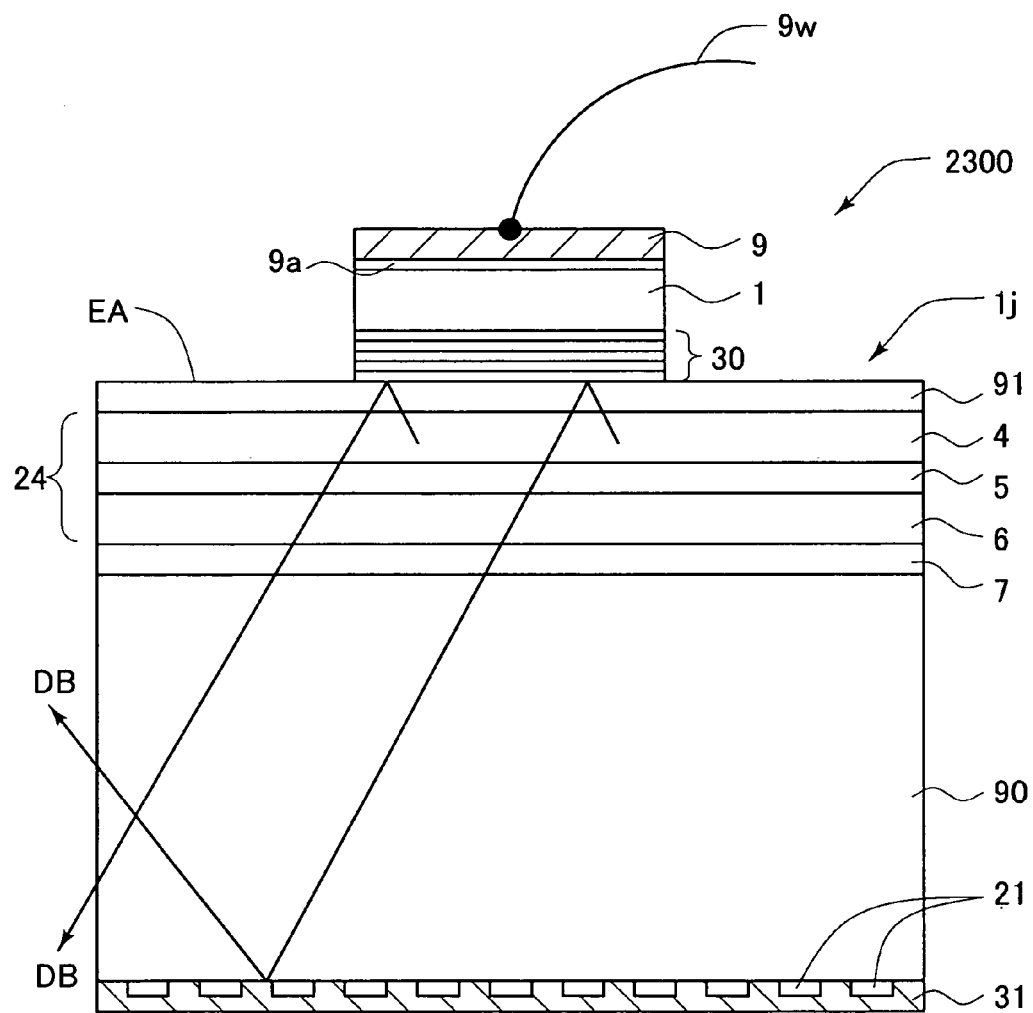
FIG. 28 is a schematic sectional view showing a first modified example of the light emitting device shown in FIG. 26.

A light emitting device 2300 shown in FIG. 28 has, between the light emitting layer portion 24 and the residual substrate portion 1, the DBR layer 30 reflecting light by Bragg reflection, formed by stacking a plurality of semiconductor layers differed in the refractive index. The DBR layer 30 can reflect the emission beam DB downwardly, even in the region located straight under the light-absorbing residual substrate portion 1, so that nonconformity of loss of the emission beam DB due to absorption by the residual substrate portion 1 can be resolved. The reflected emission beam DB can be extracted to the external making use of reflection on other portions (the metal paste layer 17 or the reflective metal layer 31, for example), so far as it is not absorbed by the residual substrate portion or the like.

Figure 29:
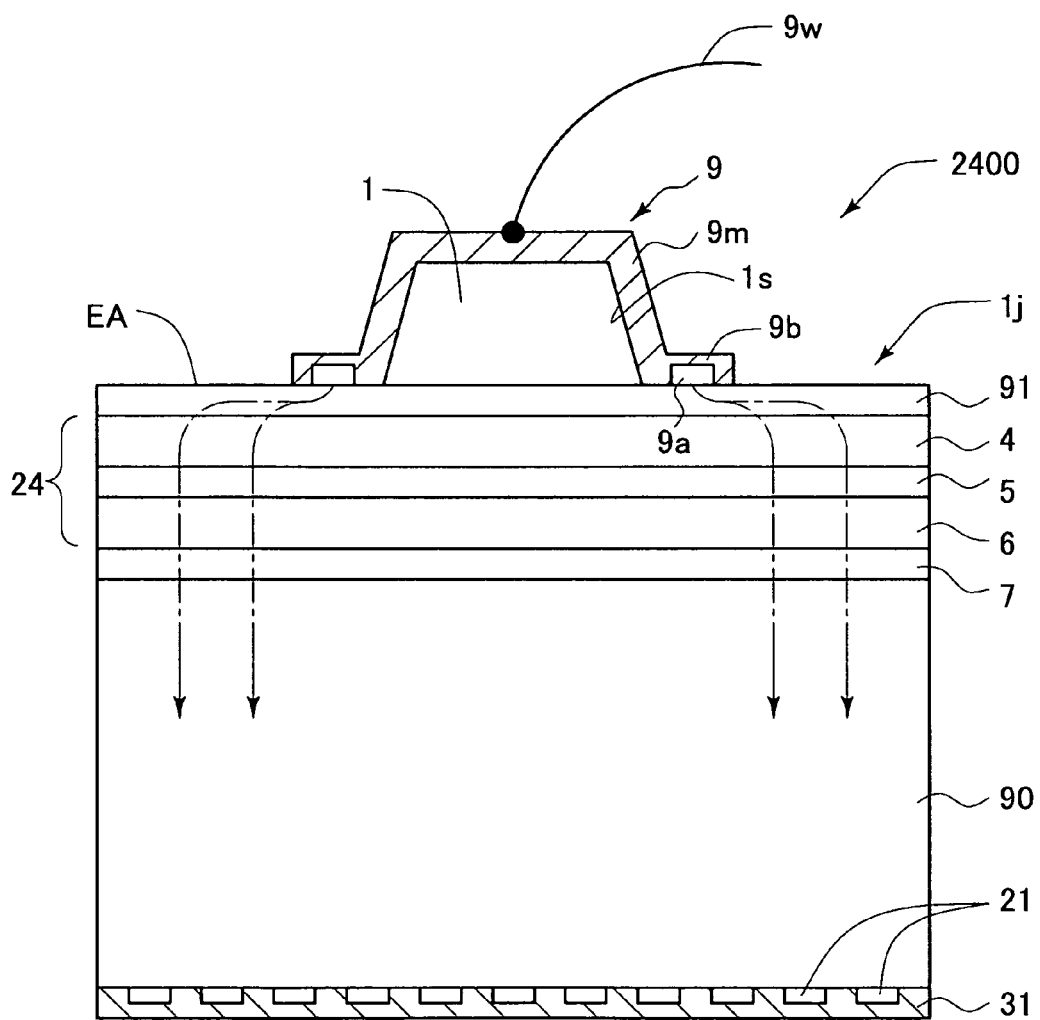
FIG. 29 is a schematic sectional view showing a second modified example of the light emitting device shown in FIG. 26.

A light emitting device 2400 shown in FIG. 29 can be configured as forming the bond-assisting alloyed layer 9a around the residual substrate portion 1, on the second main surface of the auxiliary current spreading layer 91 (that is, the bottom surface of the cut-off portion 1j), and collectively covering it together with the residual substrate portion 1 by the light-extraction-side electrode 9. In this case, the light-extraction-side electrode 9 is formed as having a main electrode 9m covering the second main surface and the circumferential side faces of the residual substrate portion 1, and a sub-electrode 9b covering a partial region extended from the circumferential side faces of the residual substrate portion 1, out of the bottom surface of the cut-off portion 1j. The bond-assisting alloyed layer 9a reducing the contact resistance is not formed on the residual substrate portion 1 in contact with the main electrode 9m, but formed on the bottom surface region of the cut-off portion 1j in contact with the sub-electrode 9b. The emission drive current, therefore, can flow predominantly towards the main light extraction surface side while bypassing the residual substrate portion 1, and thereby the light extraction efficiency is improved.

The auxiliary current spreading layer 91 is omissible for the case where a sufficient level of current spreading effect can be obtained by the transparent semiconductor layer 90 or the sub-electrode 9b. In this case, the second main surface of the light emitting layer portion 24 composes the bottom surface of the cut-off portion 1j. For the case where the sub-electrode 9b is provided, it is formed on the light emitting layer portion 24 together with the bond-assisting alloyed layer 9a.

The circumferential side faces 1s of the residual substrate portion 1 are formed as the inclined surfaces, so as to make the area of the second main surface of the residual substrate portion 1 smaller than the area of the first main surface. The main electrode 9m (that is, the portion covering the second main surface and the circumferential side faces 1s of the residual substrate portion 1) and the sub-electrode 9b (the portion covering the bottom surface of the cut-off portion 1j), composing the light-extraction-side electrode 9, are formed as an integrated metal film. The residual substrate portion 1 having such geometry can be fabricated by the process steps similar to those shown in FIG. 24.

Figure 30:
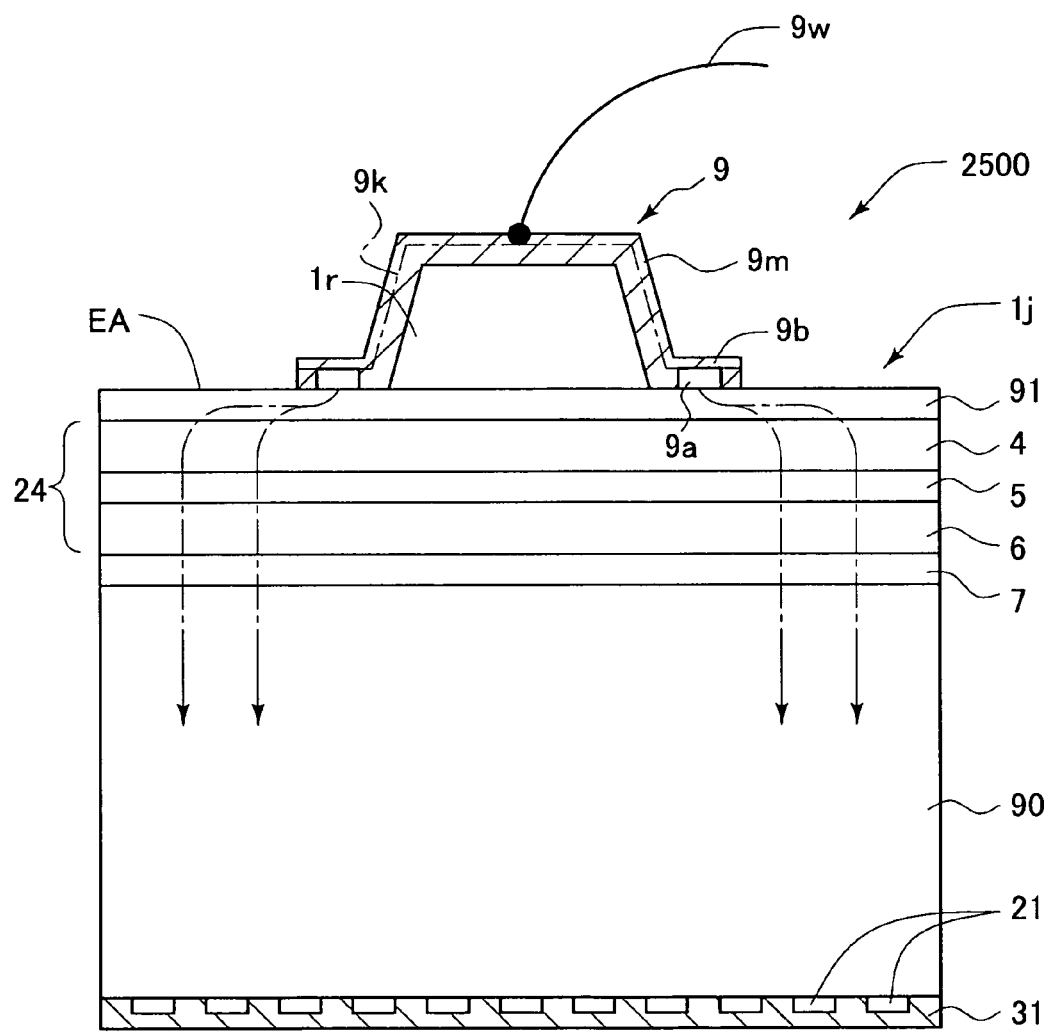
FIG. 30 is a schematic sectional view showing a third modified example of the light emitting device shown in FIG. 26.

In a light emitting device 2500 shown in FIG. 30, the residual substrate portion 1 of the light emitting device 2400 shown in FIG. 29 is configured as an inverted layer portion 1r having a conductivity type (that is, p-type) opposite to the one, placed closer to the residual substrate portion of the p-type layer portion or the n-type layer portion composing the p-n junction in the light emitting layer portion 24 (that is, the n-type cladding layer 4). In this case, a p-type sub-substrate may be used as the light-absorbing compound semiconductor substrate. In a light emitting device 2600 shown in FIG. 31, similarly to the light emitting device 2400 shown in FIG. 29, the residual substrate portion 1 is configured as having a conductivity type (that is, n-type) same as the one, placed closer to the residual substrate portion, of the p-type layer portion or the n-type layer portion composing the p-n junction in the light emitting layer portion 24 (that is, the n-type cladding layer 4). Between the light emitting layer portion 24 and the residual substrate portion 1, the inverted layer portion 93 composed of a compound semiconductor having a conductivity-type (that is, p-type) opposite to that of the residual substrate portion 1 is interposed, so as to selectively cover the residual substrate portion 1. This configuration is successful in further enhancing the function of the residual substrate portion 1 as the current blocking layer.

Figure 31:
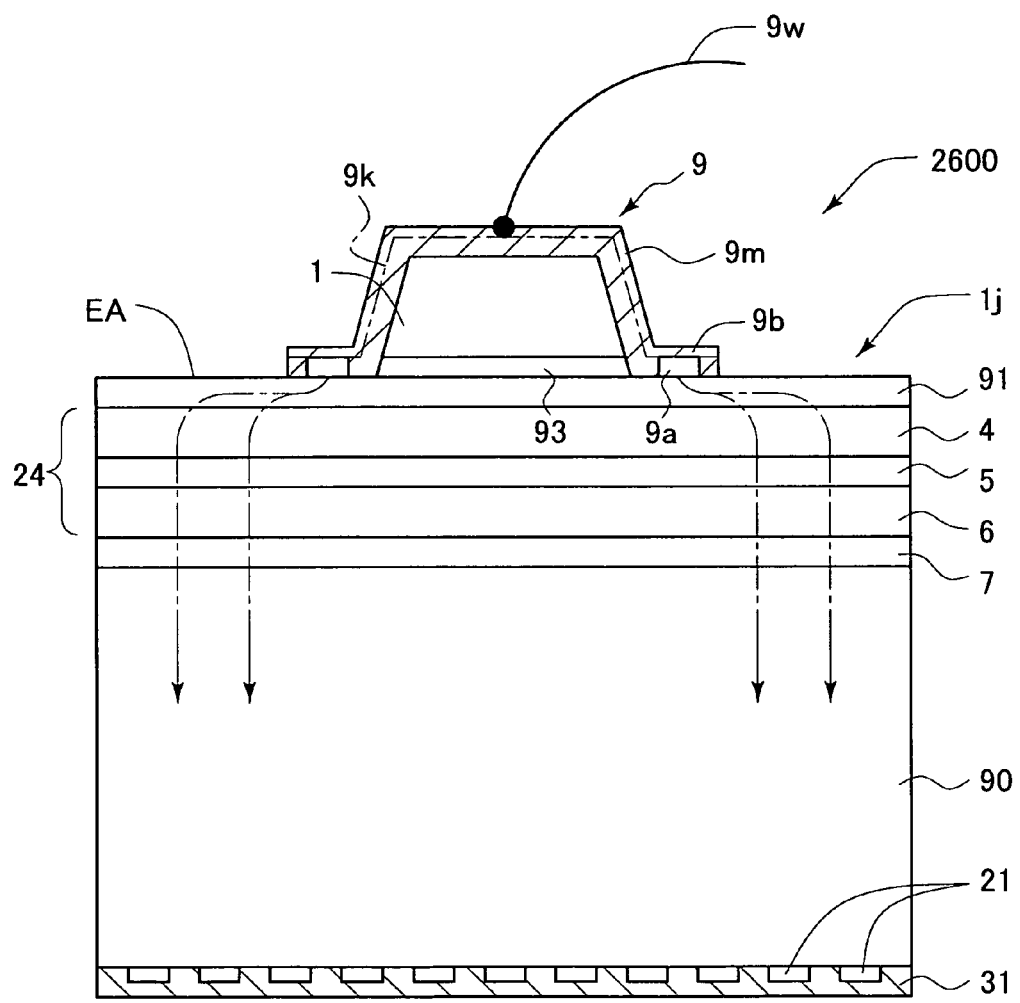
FIG. 31 is a schematic sectional view showing a fourth modified example of the light emitting device shown in FIG. 26.

In the configurations shown in FIG. 30 and FIG. 31, the bond-assisting alloyed layer 9a may be formed only in the bottom surface region of the cut-off portion 1j in contact with the sub-electrode 9b, similarly to as in FIG. 29, but the current blocking effect can be achieved without problem, even if the bond-assisting alloyed layer 9a is configured so as to cover also the residual substrate portion 1, by virtue of interposition of the inverted p-n junction portion. By making use of this configuration, the bond-assisting alloyed layer 9a can be formed so as to collectively cover the bottom surface region of the cut-off portion 1j in contact with the sub-electrode 9b together with the residual substrate portion 1, while making geometrical agreement with the light-extraction-side electrode 9 composed of the sub-electrode 9b and the main electrode 9m (in the drawing, portion covering the residual substrate portion 1 is expressed by reference numeral 9k). The bond-assisting alloyed layer 9a (9k) and the light-extraction-side electrode 9 thus overlapped with the same geometry contribute to simplification of the fabrication processes, because the patterning can be completed by only a single run of photolithography.

Figure 32:
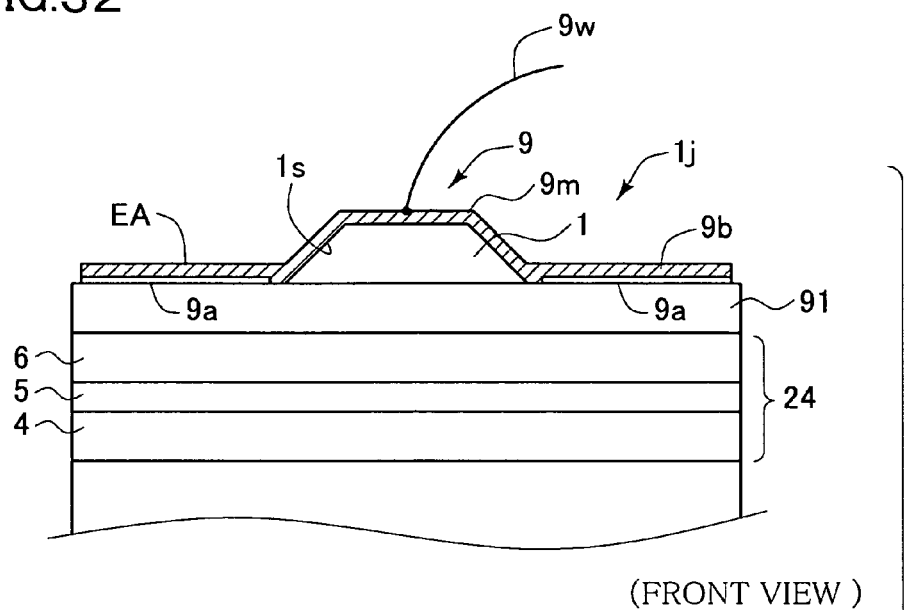
FIG. 32 shows a schematic sectional view and a plan view showing an essential portion of a fifth modified example of the light emitting device shown in FIG. 26.
Figure 32:
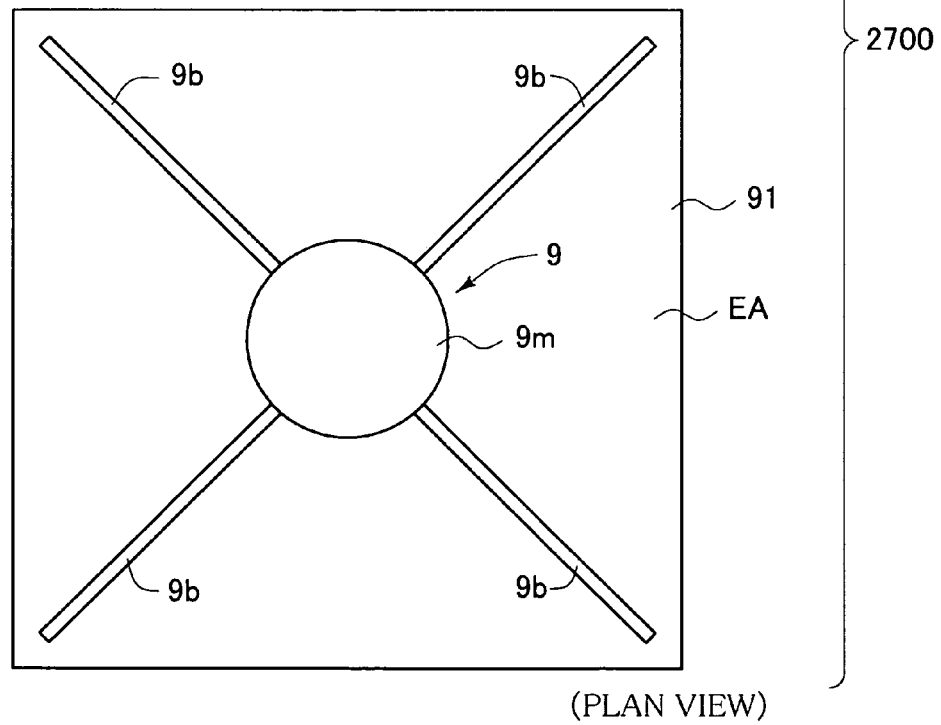

In a light emitting device 2700 shown in FIG. 32, the light-extraction-side electrode 9 is configured as having the main electrode 9m covering the second main surface and the circumferential side faces of the residual substrate portion 1, and the linear sub-electrode 9b covering a partial region of the second main surface of the auxiliary current spreading layer 91 composing the bottom surface of the cut-off portion 1j, and extending out from the outer circumference of the main electrode 9m. The linear sub-electrode 9b herein is formed on the main light extraction surface EA in a radial manner centered round the main electrode 9m. By forming the sub-electrode 9b as described in the above, biasing in the current distribution in the main light extraction surface under application of the drive voltage can be moderated, and the voltage can be applied more uniformly over the entire range of the main light extraction surface EA, and consequently the current spreading effect can be enhanced.

In this embodiment, also the bond-assisting alloyed layer 9a is formed with the linear pattern overlapping the sub-electrode 9b, but the bond-assisting alloyed layer is not formed on the residual substrate portion 1 located straight under the main electrode 9m. Accordingly, the residual substrate portion 1 herein can function again as the current blocking layer, and can intercept the current directed to the region straight under the main electrode 9m. As a consequence, the amount of distribution of current directed towards the background region of the main electrode 9m (that is, the cut-off portion 1j) composing the main light extraction surface EA can be increased, so that the light extraction efficiency can be enhanced. The circumferential side faces of the residual substrate portion 1 are formed as the include surfaces is, so as to make the area of the second main surface of the residual substrate portion 1 smaller than the area of the first main surface, and the main electrode 9m and the sub-electrode 9b composing the light-extraction-side electrode 9 are formed as an integrated metal film.

In the embodiment described in the above, the electrode portion on the different-polarity side of the light-extraction-side electrode 9 (bond-assisting alloyed layer 21 or metal reflective film) was formed on the first main surface side of the transparent semiconductor layer 90 in all cases, whereas it is also allowable to adopt the above-described one-side electrode draw-out structure, in which the electrode-forming cut-off portion is formed by cutting off the main compound semiconductor layer 40 in a partial region of the second main surface thereof, over a range from the second main surface side to at least a first main surface of the active layer 5, disposing an electrode, having a different polarity from the above, on the bottom of the electrode-forming cut-off portion. Paragraphs below will explain the specific examples.

Figure 33:
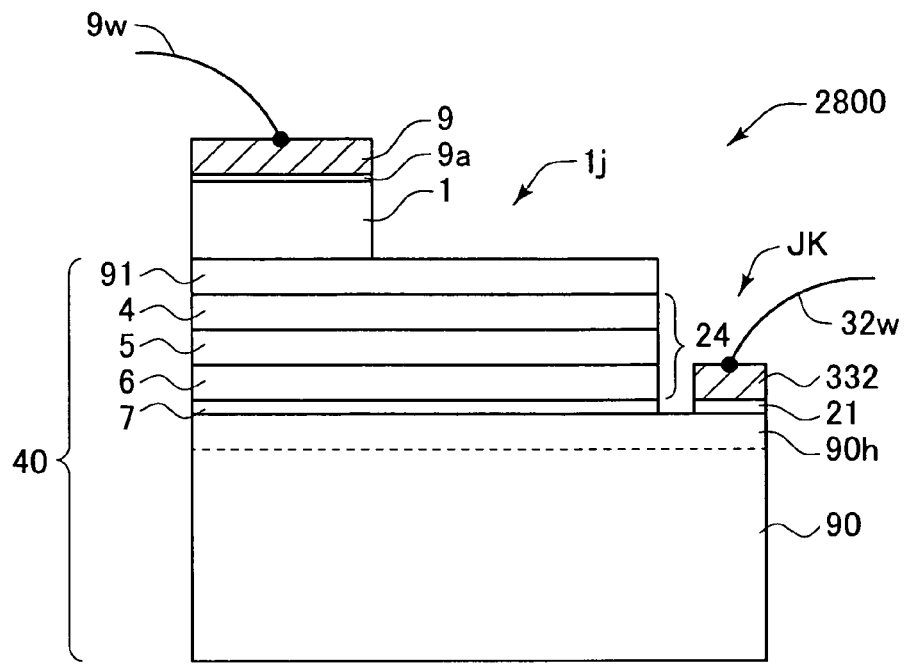
FIG. 33 is a schematic sectional view showing a sixth modified example of the light emitting device shown in FIG. 26.

A light emitting device 2800 shown in FIG. 33 is an modified example of the light emitting device 2100 shown in FIG. 26 adopting the one-side electrode draw-out structure (any elements given with the same reference numerals as those in the light emitting device 2100, and not specially explained, have the same configurations with those in the light emitting device 2100, so that the detailed explanations of the light emitting device 2100 will apply). Of the main compound semiconductor layer, a portion ranging from the auxiliary current spreading layer 91 to the light emitting layer portion 24 (and the coupling layer 7) is cut off in a partial region on the second main surface side, by a publicly-known photolithographic process, to thereby form an electrode-forming cut-off portion JK. On the second main surface region of the transparent semiconductor layer 90 composing the bottom surface of the electrode-forming cut-off portion JK, the bond-assisting alloyed layer 21 and a different-polarity electrode 332 are formed. The surficial region, containing the second main surface, of the transparent semiconductor layer 90 is composed of a high-concentration doped layer 90h having the effective carrier concentration raised higher than in the residual region, for the purpose of enhancing the current spreading effect. To the light-extraction-side 9 and the different-polarity electrode 332, the current supply wires 9w and 32w are respectively connected. The bottom surface of the cut-off portion JK may be composed of the cladding layer 6.

Figure 34:
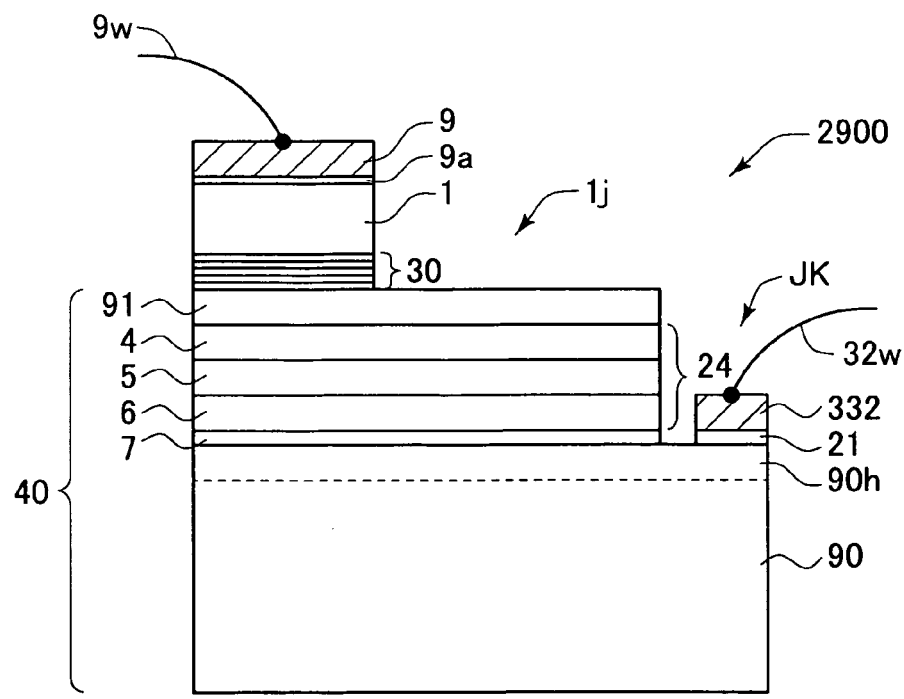
FIG. 34 is a schematic sectional view showing a seventh modified example of the light emitting device shown in FIG. 26.

A light emitting device 2900 shown in FIG. 34 is an modified example of the light emitting device 2300 shown in FIG. 28 adopting again the one-side electrode draw-out structure. A light emitting device 3000 shown in FIG. 35 corresponds to a configuration resulted obtained by omitting the auxiliary current spreading layer 91 from the light emitting device 2900 shown in FIG. 34.

Figure 36:
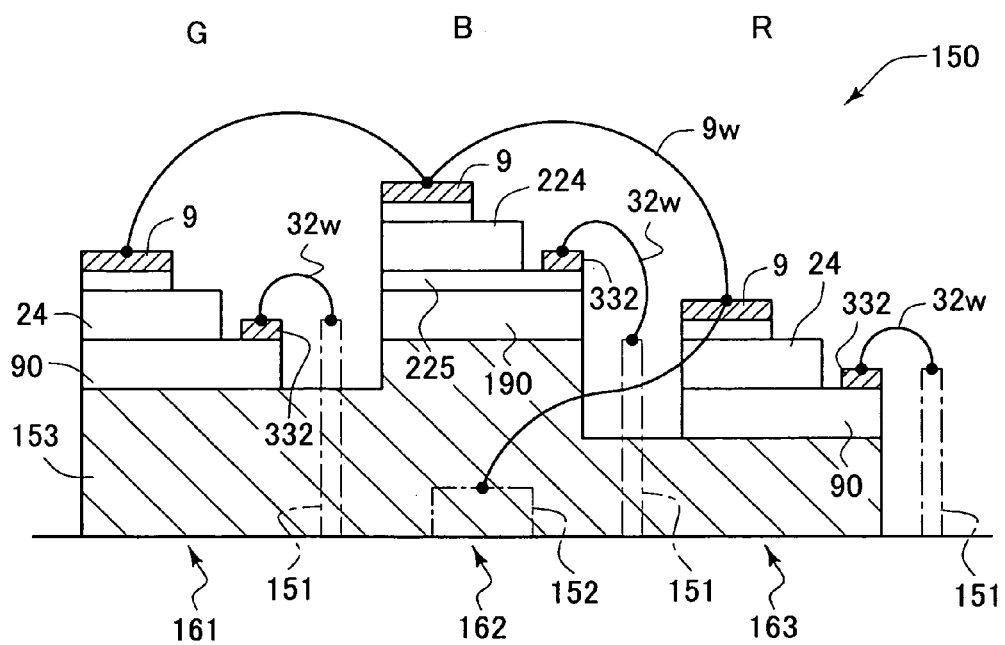
FIG. 36 is a schematic sectional view showing an applied example of the light emitting devices shown in FIGS. 33 to 35.

FIG. 36 shows an example of an RGB full-color light emitting device module 150 based on a combination of a red (R) light emitting device chip 163, a green (G) light emitting device chip 161, and a blue (B) light emitting device chip 162, all of which being configured as having the one-side electrode draw-out structure. The light-extraction-side electrodes 9 of the individual light emitting device chips 161 to 163 are located on the cathode side (grounding side: wherein the anode side may be set to the grounding side when a negative-polarity power source is available), and all of them have the same electrode potential, so that these electrodes 9 are sequentially connected through the wire 9w, and only the electrode located at the end is connected to a cathode terminal 152 (or an anode terminal, for the case where the light-extraction-side electrode 9 is the anode) on the stage 153 side allowing thereon bonding of the device chips. The terminal 152 is connected with only a single wire, so that a relatively small area thereof will suffice (without excluding the mode where the individual light-extraction-side electrodes 9 are independently connected to the terminal 152 through the wires 9w). On the other hand, the different-polarity electrode 332 functions as an anode (or cathode for the case where the light-extraction-side electrode 9 is an anode), the voltage to be applied (or duty ratio) is respectively adjusted for the purpose of adjusting the ratio of mixing of the emission beams. Therefore, the connection is made through the wire 32w to the individual anode terminals (or cathode terminals for the case where the light-extraction-side electrode 9 is an anode).

Figure 35:
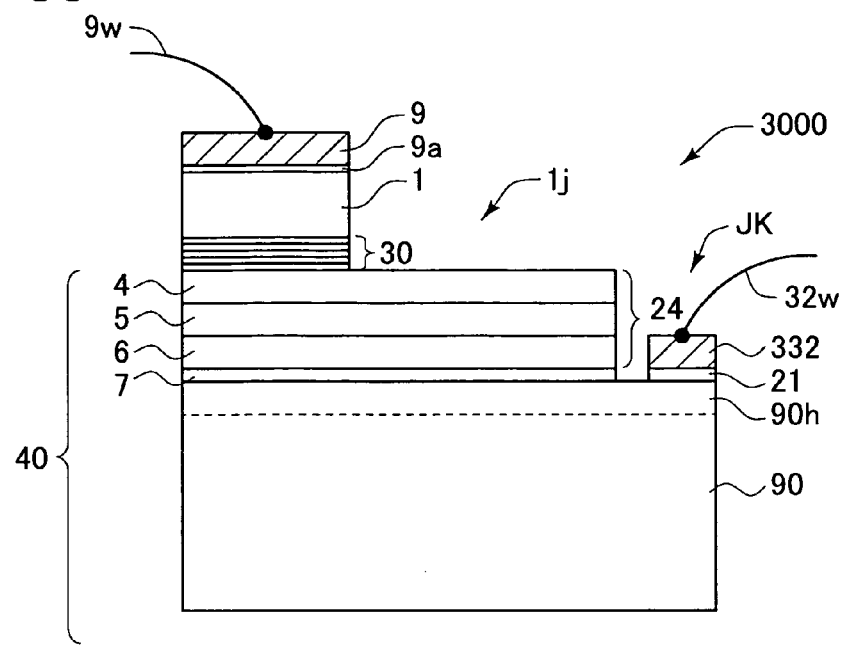
FIG. 35 is a schematic sectional view showing a eighth modified example of the light emitting device shown in FIG. 26.

Of the light emitting device chips 161 to 163, the red (R) light emitting device chip 163 and the green (G) light emitting device chip 161 adopt the configuration of the third embodiment using AlGaInP (for example, any of the light emitting device 2800 shown in FIG. 33, the light emitting device 2900 shown in FIG. 34, and the light emitting device 3000 shown in FIG. 35). The active layer 5 of the both device chips have different AlGaInP compositions corresponding to the emission wavelength. On the other hand, the blue (B) light emitting device chip 162 is configured as a blue light emission device based on a Group III nitride such as InAlGaN. The device chip 162 has an insulating sapphire substrate 190, as being left unremoved, allowing thereon epitaxial growth of a light emitting layer portion 244 (and an electrode draw-out layer 225) having a double heterostructure based on a Group III nitride, and the device chip 162 is bonded to the stage 153 through this sapphire substrate 190 using a metal paste or the like. The different-polarity electrode 332 is formed on the surface of the electrode draw-out layer 225. On the other hand, the light emitting device chips 161 and 163 of the third embodiment are bonded to the stage 153 using a metal paste or the like, through the electro-conductive transparent semiconductor layer 90. In this configuration, the transparent semiconductor layer 90 functions as a discharge path of static electricity, and thereby charge accumulation in the light emitting layer portion 24 can be moderated to a large degree.

Fourth Embodiment

Figure 37:
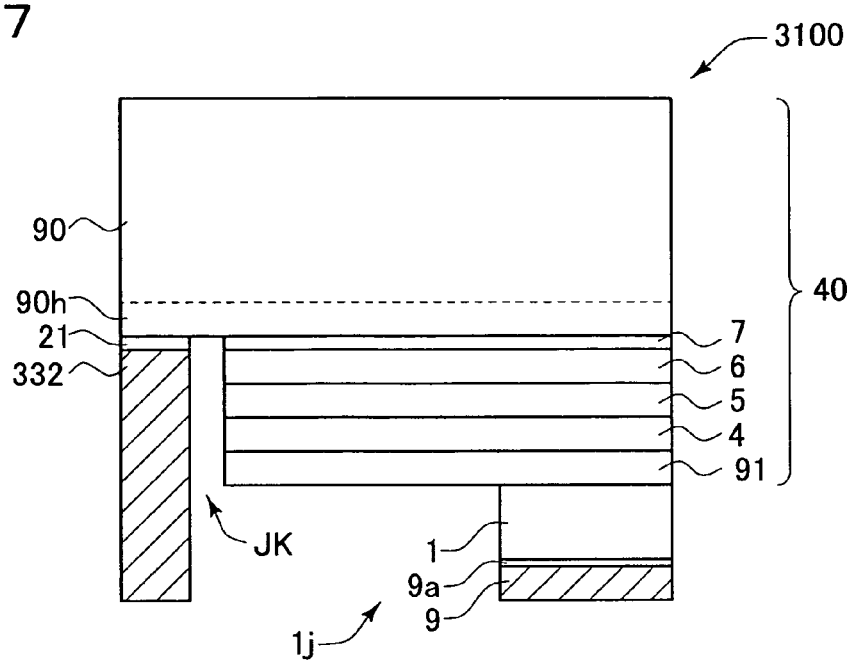
FIG. 37 is a schematic sectional view showing a first example of the light emitting device according to a fourth embodiment.
Figure 38:
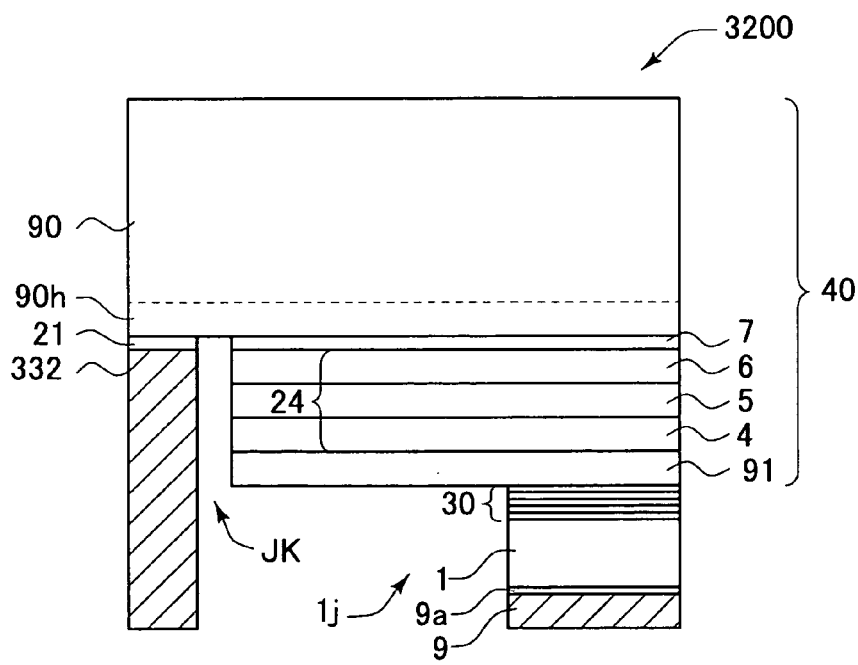
FIG. 38 is a schematic sectional view showing a second example of the light emitting device according to a fourth embodiment.
Figure 39:
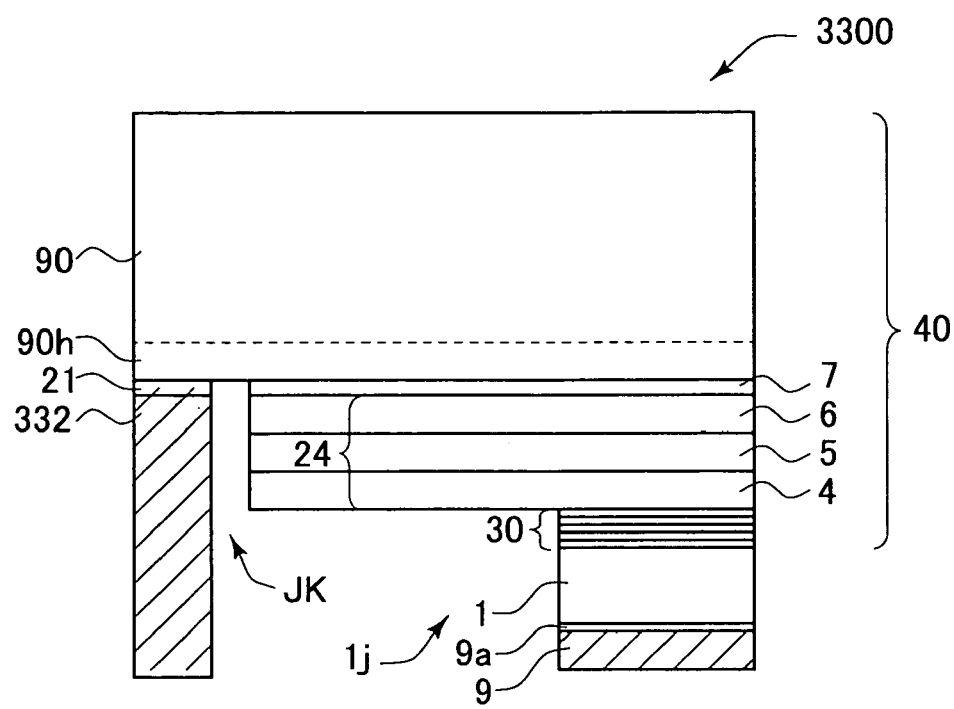
FIG. 39 is a schematic sectional view showing a third example of the light emitting device according to a fourth embodiment.

The light emitting device 2800 shown in FIG. 33, the light emitting device 2900 shown in FIG. 34, and the light emitting device 3000 shown in FIG. 35 can be configured as a light emitting device 3100 shown in FIG. 37, a light emitting device 3200 shown in FIG. 38, and a light emitting device 3300 shown in FIG. 39, respectively, by turning each device upside down, without forming the electrode on the first main surface side of the transparent semiconductor layer 90, to thereby allow extraction of the emission beam mainly from the first main surface side. All of these light emitting devices 3100 to 3300 compose the mode of the light emitting device according to the third embodiment. In the individual light emitting devices 3100 to 3300, any elements given with the same reference numerals as those in the light emitting devices 2800 to 3000 shown in FIG. 33 to FIG. 35, and not specially explained, are the same elements, so that detailed explanation therefor will be omitted. It is to be noted that, in all drawings, the light-extraction-side electrode is now replaced to a first electrode (first electrode portion) 9, and the different-polarity electrode to a second electrode (second electrode portion) 332. The first electrode 9 and the second electrode 332 typically composed of an Au electrode may be omissible, wherein in this case, the bond-assisting alloyed layers 9a and 21 respectively configure the first electrode portion and the second electrode portion.

In the individual configuration, adoption of the residual substrate portion 1 composed of GaAs can further reduce the contact resistance with the bond-assisting alloyed layer 9a. Because all electrodes 9, 332 are formed on the second main surface side of the main compound semiconductor layer 40, a configuration having, for example, a device chip mounted on the substrate can be facilitated, and this also contributes to simplification of the assembly process of the device chip.

What is claimed is:

1. A method of forming a light emitting device comprising:
   epitaxially growing on a first main surface of a substrate bulk composed of a GaAs single crystal, a separation-assisting compound semiconductor layer composed of a III-V compound semiconductor single crystal having a composition different from GaAs;
   epitaxially growing a sub-substrate portion composed of the GaAs single crystal on the separation-assisting compound semiconductor layer;
   epitaxially growing, on a first main surface of the sub-substrate portion, a main compound semiconductor layer having therein a light emitting layer, the main compound semiconductor layer and the light emitting layer each having a first main surface and a second main surface;
   removing the separation-assisting compound semiconductor layer by chemical etching, to separate the substrate bulk from the sub-substrate, the sub-substrate separated from the substrate bulk being a residual substrate portion on the second main surface of the main compound semiconductor layer, the residual substrate portion having a first main surface and a second main surface; and
   cutting off a portion of the residual substrate portion to form a cut-off portion that exposes a portion of the second main surface of the compound semiconductor layer that serves as a light extraction surface with respect to an emission beam from the light emitting layer.

2. The method according to claim 1, wherein epitaxially growing the main compound semiconductor layer includes epitaxially growing the main compound semiconductor layer in contact with a first main surface of the sub-substrate.

3. The method according to claim 1, further comprising:
   forming on a portion of the first main surface of the main compound semiconductor layer a light-extraction-side electrode through which emission drive voltage is applied to the light emitting layer, wherein
   portions of the first main surface of the main compound semiconductor layer that the light-extraction-side electrode is not formed on form a main light extraction surface, and
   cutting off a portion of the residual substrate portion to form a cut-off portion includes forming the cut-off portion at least in a region straight under the light-extraction surface, and at least a portion of the region straight under the light-extraction side electrode is contained in the residual substrate portion.

4. The method according to claim 2, further comprising:
   forming on a portion of the first main surface of the main compound semiconductor layer a light-extraction-side electrode through which emission drive voltage is applied to the light emitting layer, wherein
   portions of the first main surface of the main compound semiconductor layer that the light-extraction-side electrode is not formed on form a main light extraction surface, and
   cutting off a portion of the residual substrate portion to form a cut-off portion includes forming the cut-off portion at least in a region straight under the light-extraction-side electrode, and at least a portion of the region straight under the light-extraction-side electrode is contained in the residual substrate portion.

5. A method of forming a light emitting device comprising:
epitaxially growing on a first main surface of a substrate bulk composed of a GaAs single crystal, a separation-assisting compound semiconductor layer composed of a III-V compound semiconductor single crystal having a composition different from GaAs;
epitaxially growing a sub-substrate portion composed of the GaAs single crystal on the separation-assisting compound semiconductor layer;
epitaxially growing, on a first main surface of the sub-substrate portion, a main compound semiconductor layer having therein a light emitting layer, the main compound semiconductor layer and the light emitting layer each having a first main surface and a second main surface;
removing the separation-assisting compound semiconductor layer by chemical etching, to separate the substrate bulk from the sub-substrate, the sub-substrate separated from the substrate bulk being a residual substrate portion on the second main surface of the main compound semiconductor layer, the residual substrate portion having a first main surface and a second main surface;
cutting off a portion of the residual substrate portion to form a cut-off portion that exposes a portion of the second main surface of the compound semiconductor layer; and
forming a metal reflective component on the exposed portion of the second main surface of the compound semiconductor layer so that the portion of the second main surface of the compound semiconductor layer exposed by the cut-off portion serves as a reflective surface with respect to an emission beam from the light emitting layer.

6. The method according to claim 5, further comprising:
forming on a portion of the first main surface of the main compound semiconductor layer a light-extraction-side electrode through which emission drive voltage is applied to the light emitting layer, wherein
portions of the first main surface of the main compound semiconductor layer that the light-extraction-side electrode is not formed on form a main light extraction surface, and
cutting off a portion of the residual substrate portion to form a cut-off portion includes forming the cut-off portion at least in a region straight under the light-extraction surface, and at least a portion of the region straight under the light-extraction side electrode is contained in the residual substrate portion.

7. The method according to claim 5, wherein epitaxially growing the main compound semiconductor layer includes epitaxially growing the main compound semiconductor layer in contact with a first main surface of the sub-substrate.

8. The method according to claim 7, further comprising:
forming on a portion of the first main surface of the main compound semiconductor layer a light-extraction-side electrode through which emission drive voltage is applied to the light emitting layer, wherein
portions of the first main surface of the main compound semiconductor layer that the light-extraction-side electrode is not formed on form a main light extraction surface, and
cutting off a portion of the residual substrate portion to form a cut-off portion includes forming the cut-off portion at least in a region straight under the light-extraction-side electrode, and at least a portion of the region straight under the light-extraction-side electrode is contained in the residual substrate portion.

* * * * *